(12) United States Patent
Sung et al.

(10) Patent No.: US 11,373,983 B1
(45) Date of Patent: Jun. 28, 2022

(54) 3D PACKAGE CONFIGURATION

(71) Applicant: CCS Technology Corporation, Taoyuan (TW)

(72) Inventors: Tung-Po Sung, Taoyuan (TW); Chang-Cheng Lo, Taoyuan (TW)

(73) Assignee: CCS Technology Corporation, Taoyuan (TW)

( * ) Notice: Subject to any disclaimer, the term of this patent is extended or adjusted under 35 U.S.C. 154(b) by 0 days.

(21) Appl. No.: 17/158,080

(22) Filed: Jan. 26, 2021

(30) Foreign Application Priority Data

Dec. 23, 2020 (TW) .................................. 109145694

(51) Int. Cl.
*H01L 23/34* (2006.01)
*H01L 25/065* (2006.01)
*H01L 23/498* (2006.01)
*H01L 23/367* (2006.01)
*H01L 23/00* (2006.01)

(52) U.S. Cl.
CPC ........ *H01L 25/0657* (2013.01); *H01L 23/367* (2013.01); *H01L 23/4985* (2013.01); *H01L 23/49833* (2013.01); *H01L 23/49838* (2013.01); *H01L 24/06* (2013.01); *H01L 24/08* (2013.01); *H01L 2224/06102* (2013.01); *H01L 2224/08146* (2013.01); *H01L 2225/06513* (2013.01); *H01L 2225/06517* (2013.01); *H01L 2225/06541* (2013.01); *H01L 2225/06589* (2013.01)

(58) Field of Classification Search
None
See application file for complete search history.

(56) References Cited

U.S. PATENT DOCUMENTS

| | | | |
|---|---|---|---|
| 7,875,974 B2 * | 1/2011 | Gokan | H01L 25/0657 257/730 |
| 11,218,583 B2 * | 1/2022 | Lee | H01Q 1/38 |

* cited by examiner

*Primary Examiner* — Long Pham

(57) ABSTRACT

A novel 3D package configuration is provided by stacking a plurality of semiconductor package units or a folded flexible circuit board structure on a lead frame and electrically connected therewith based on the foldable characteristics of the flexible circuit board, and the high temperature resistance of the flexible circuit board which is suitable for insulating layer process, metal layer process, photolithography process, etching and development process, to make conventional semiconductor dies of various functions be bonded on one die and/or two side of a flexible circuit board and electrically connected therewith in advance.

5 Claims, 69 Drawing Sheets

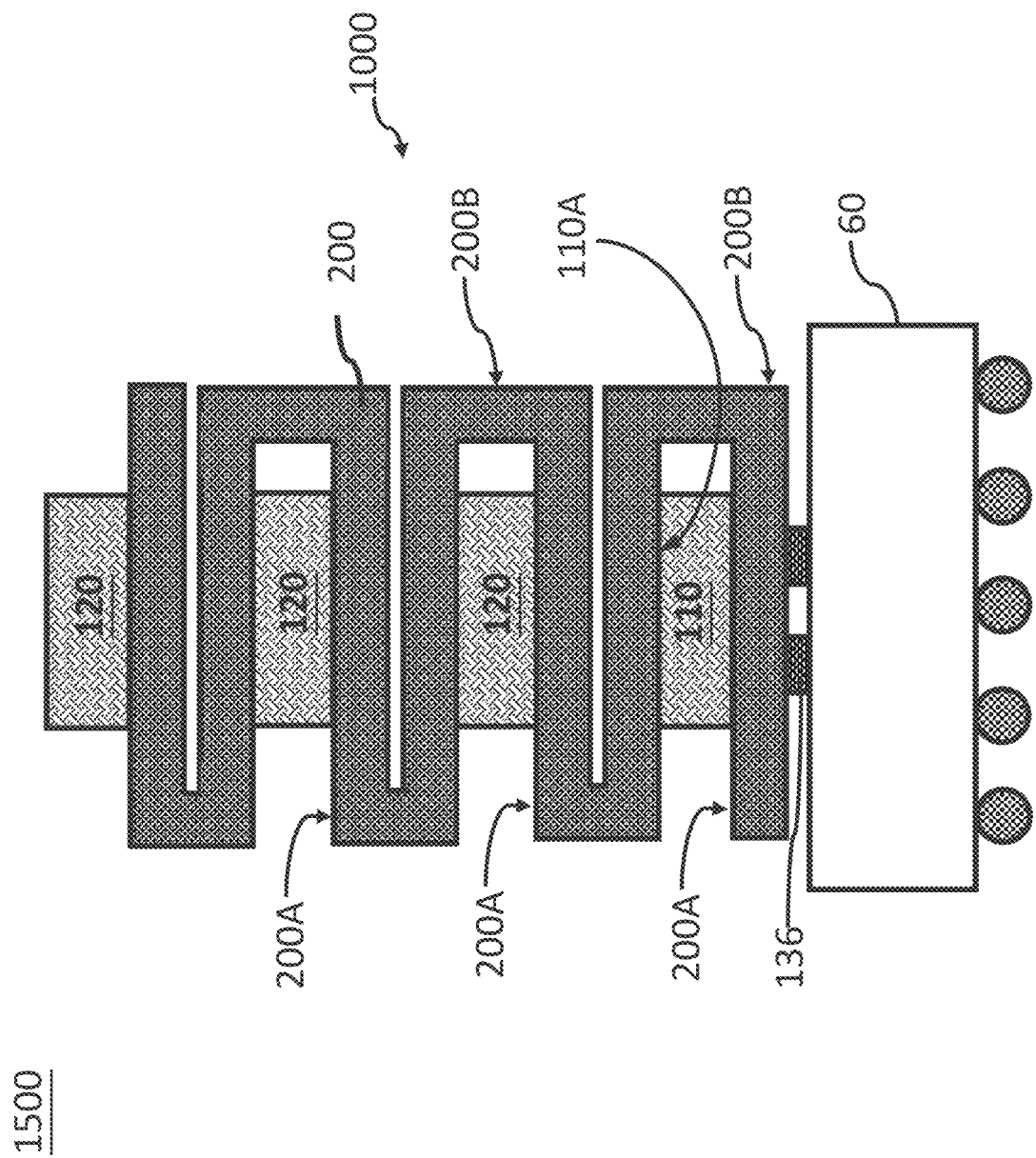

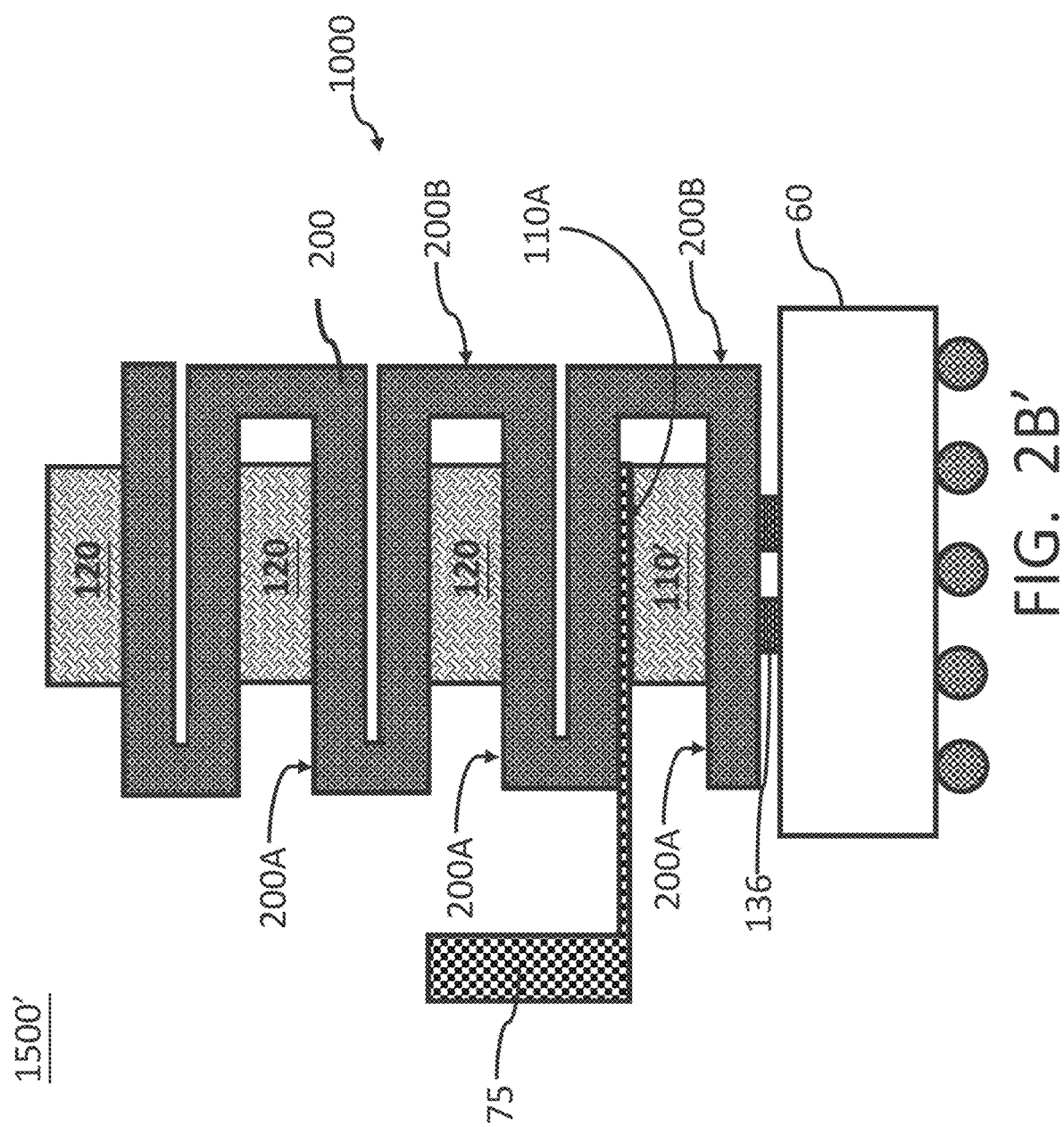

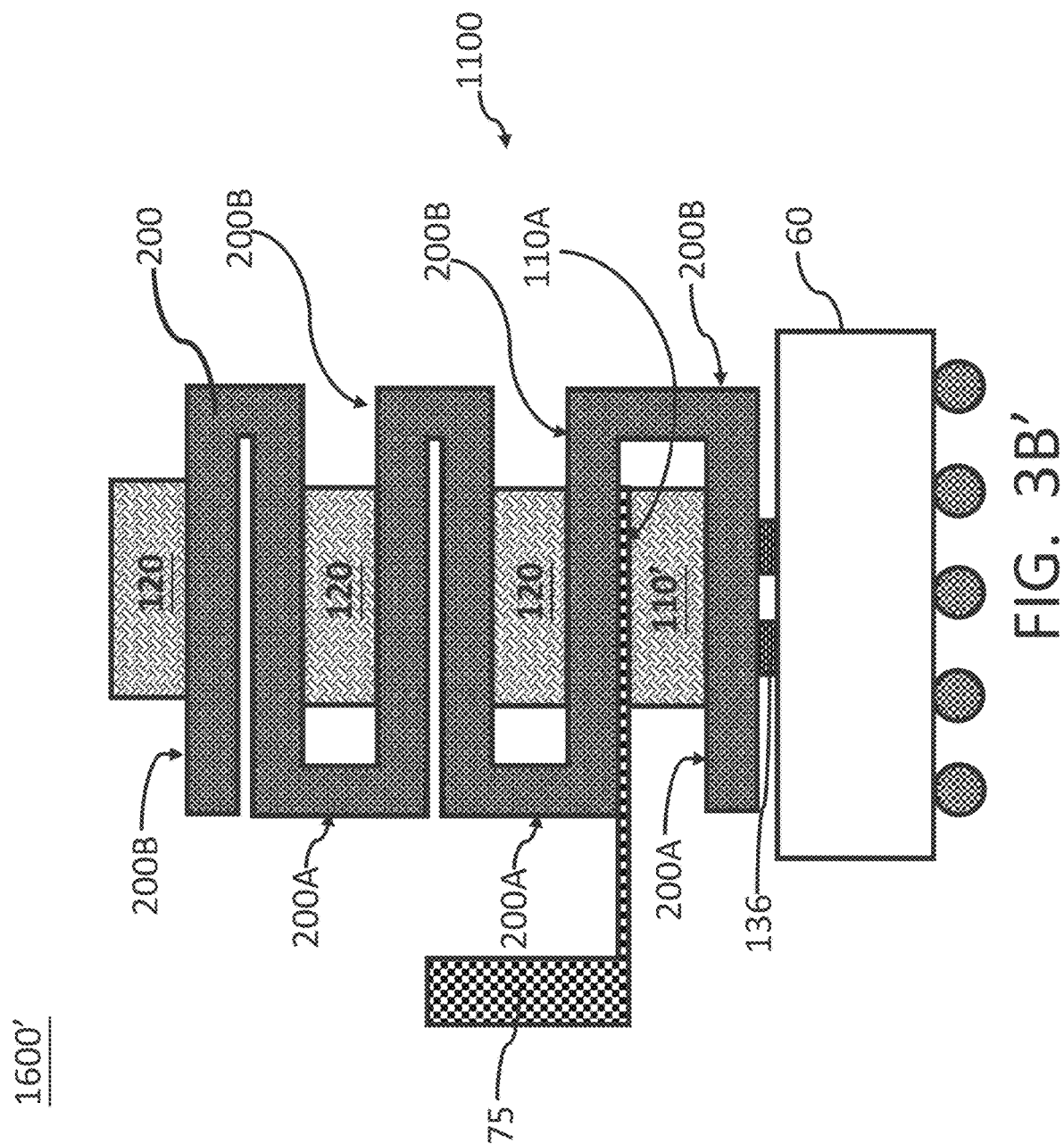

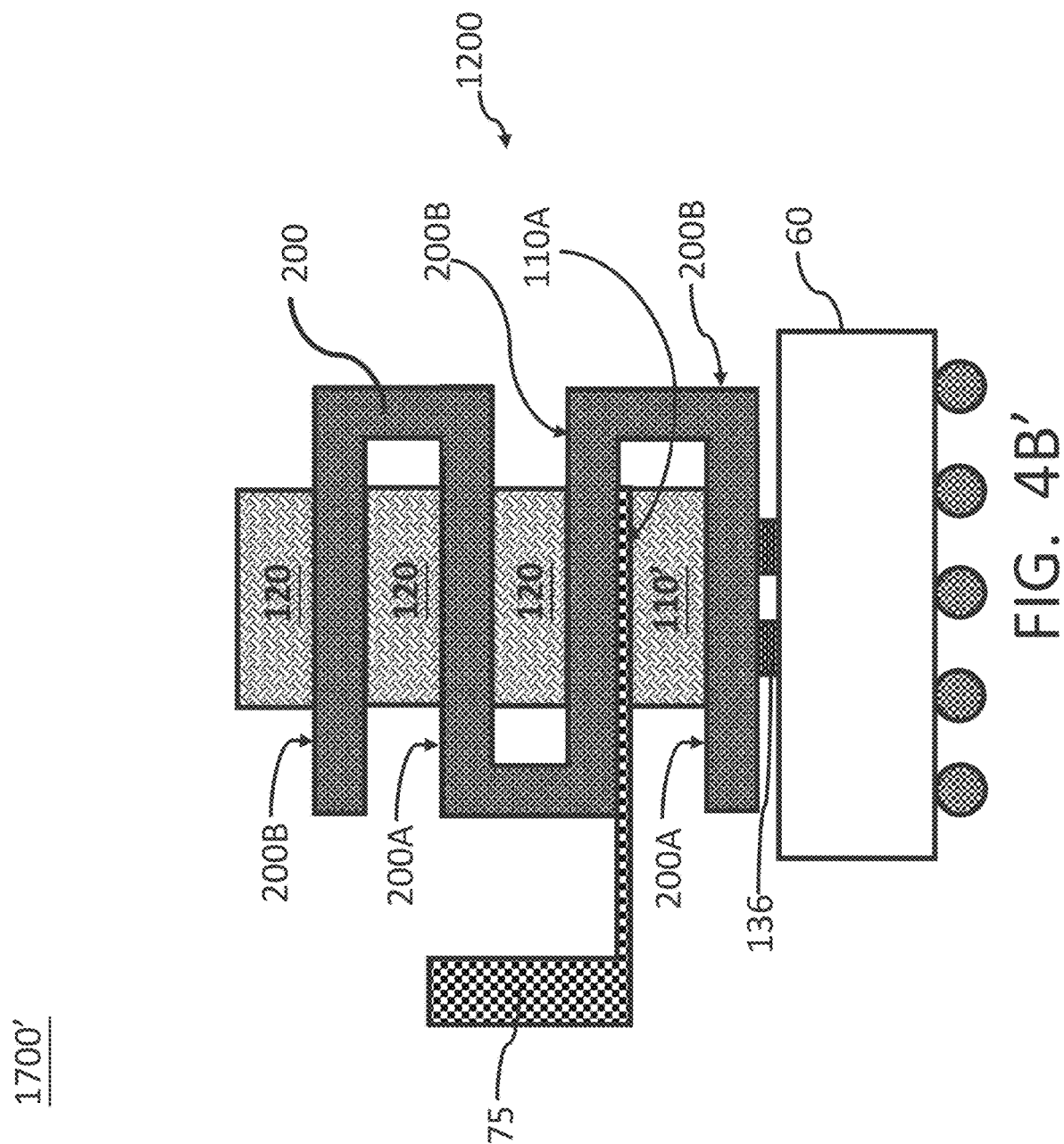

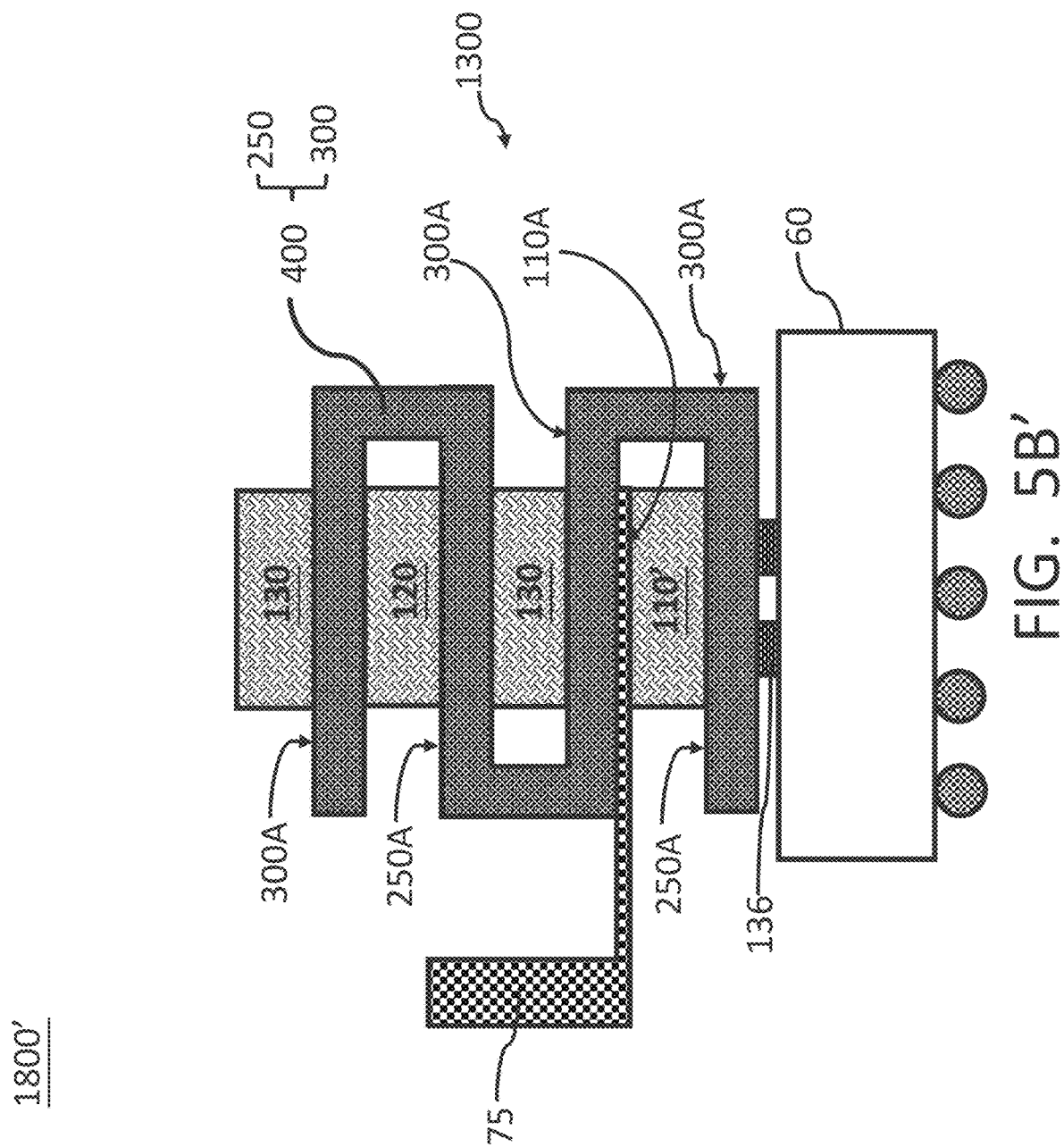

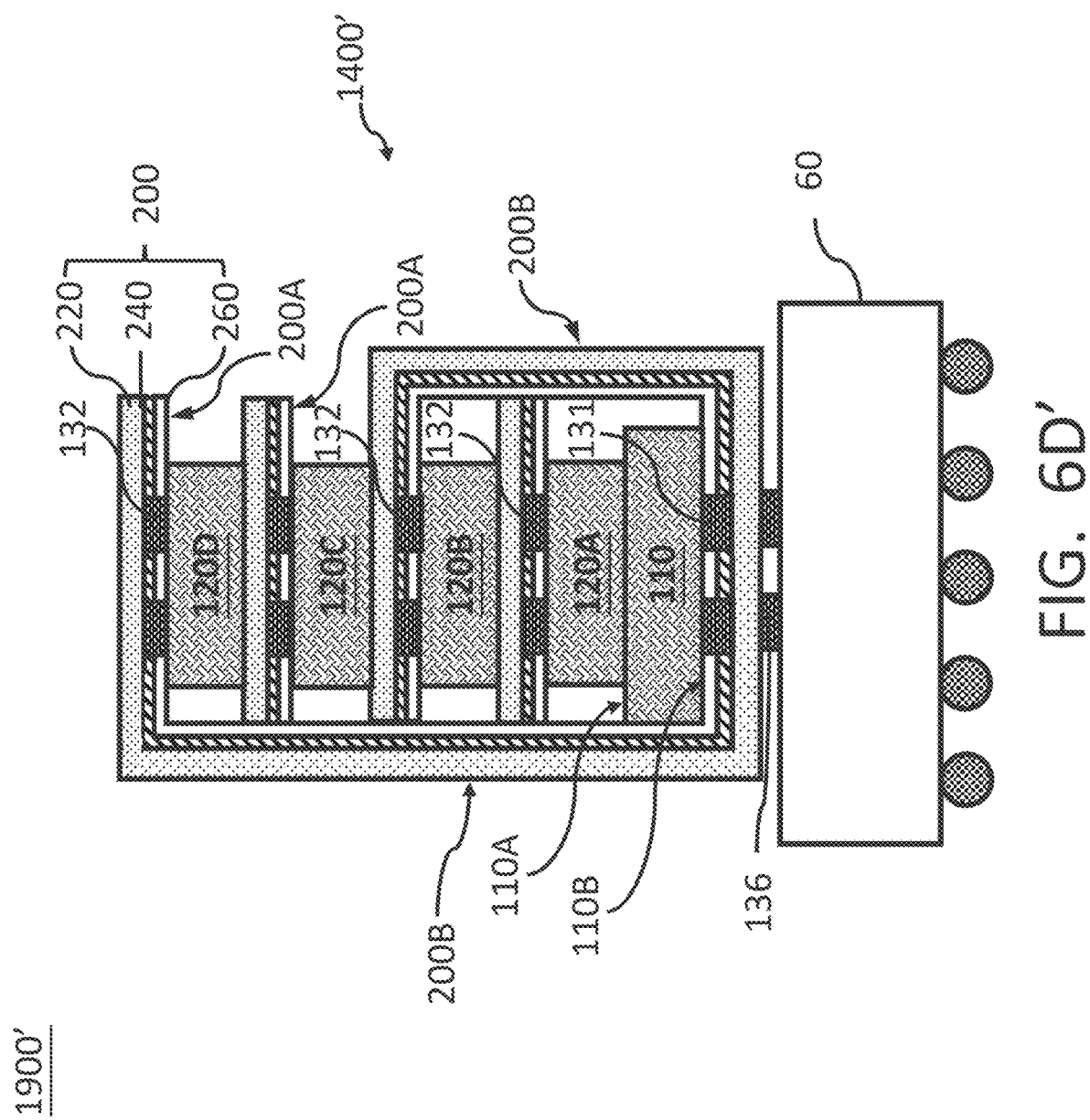

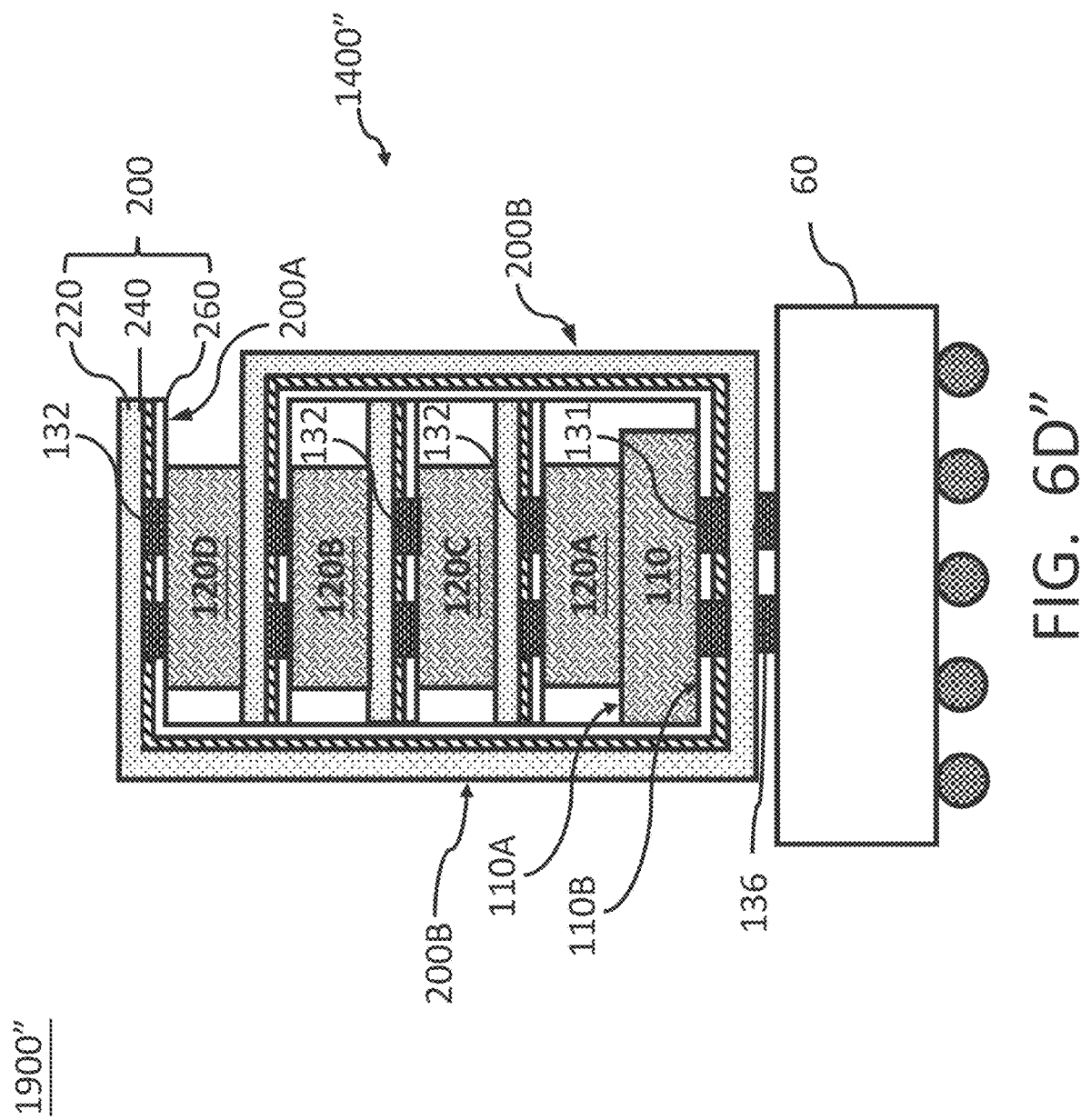

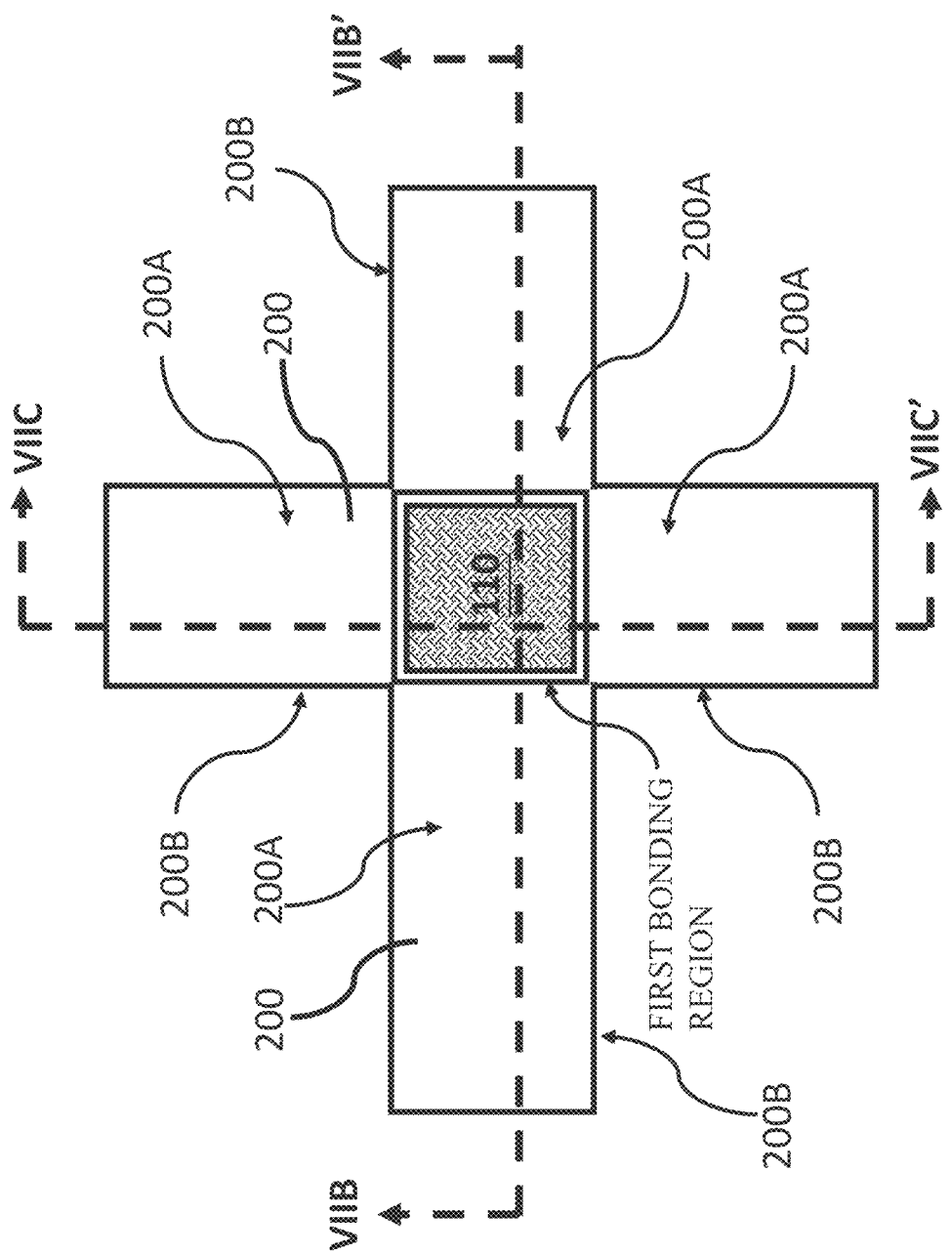

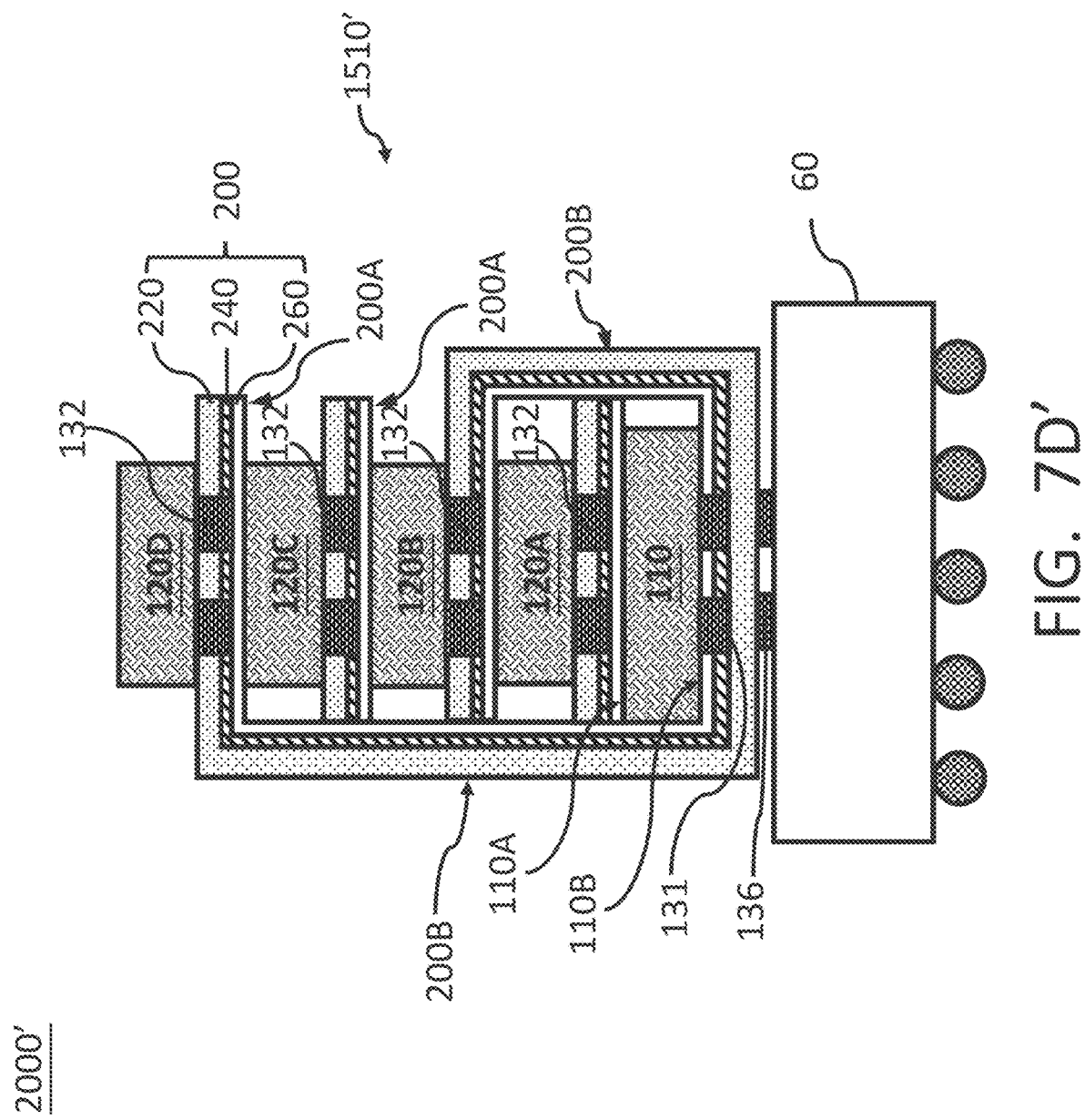

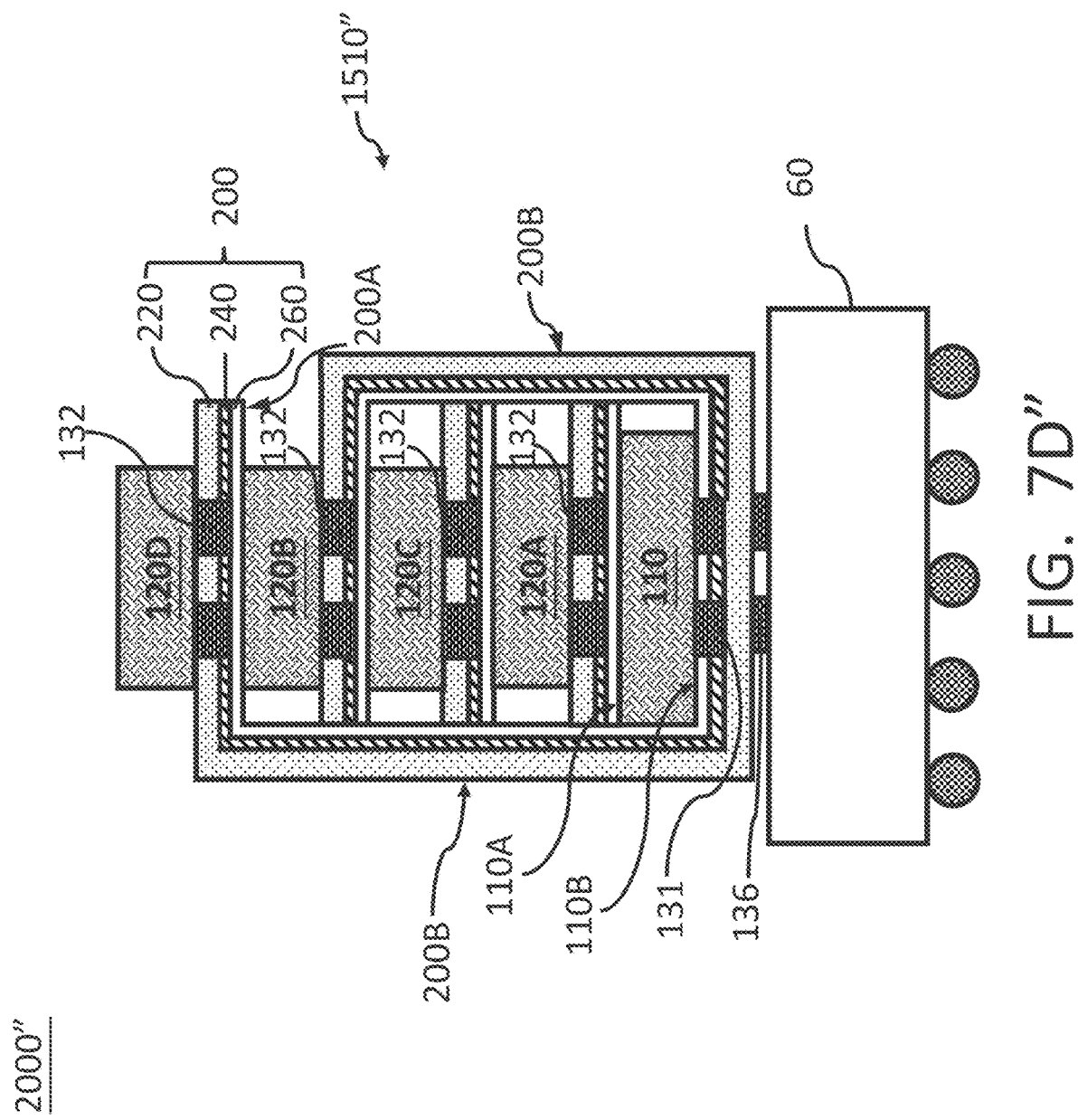
FIG. 7D"

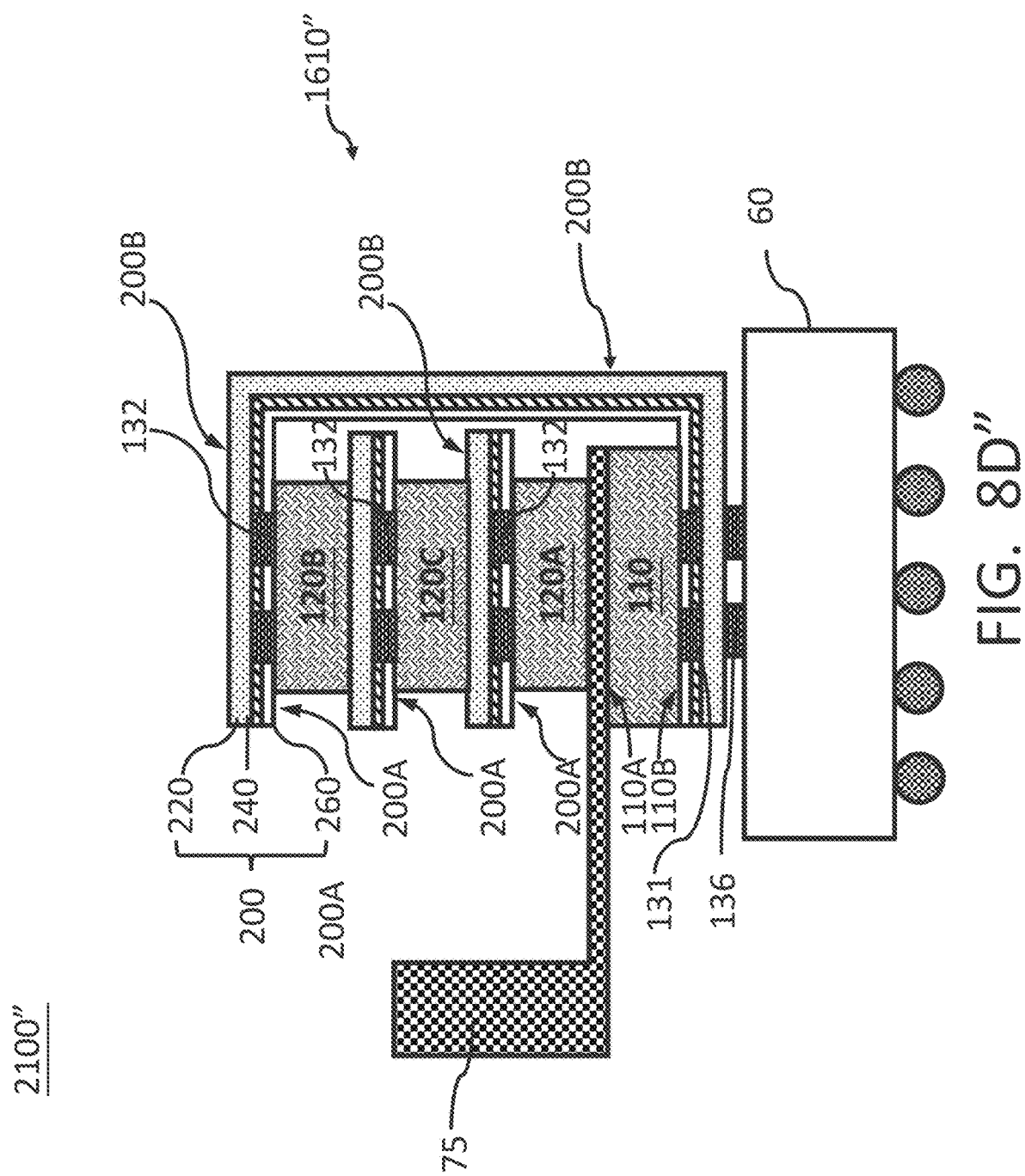

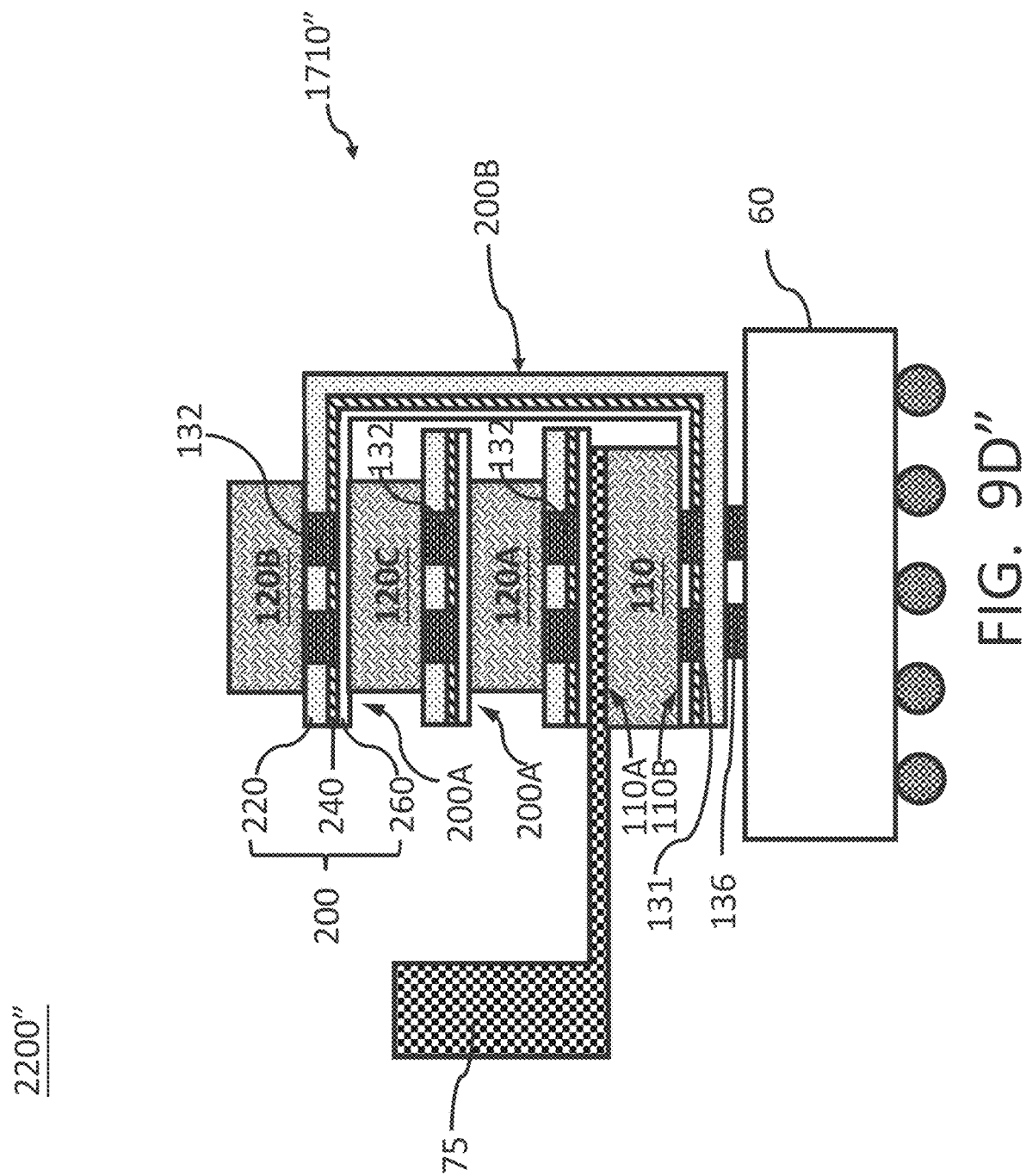

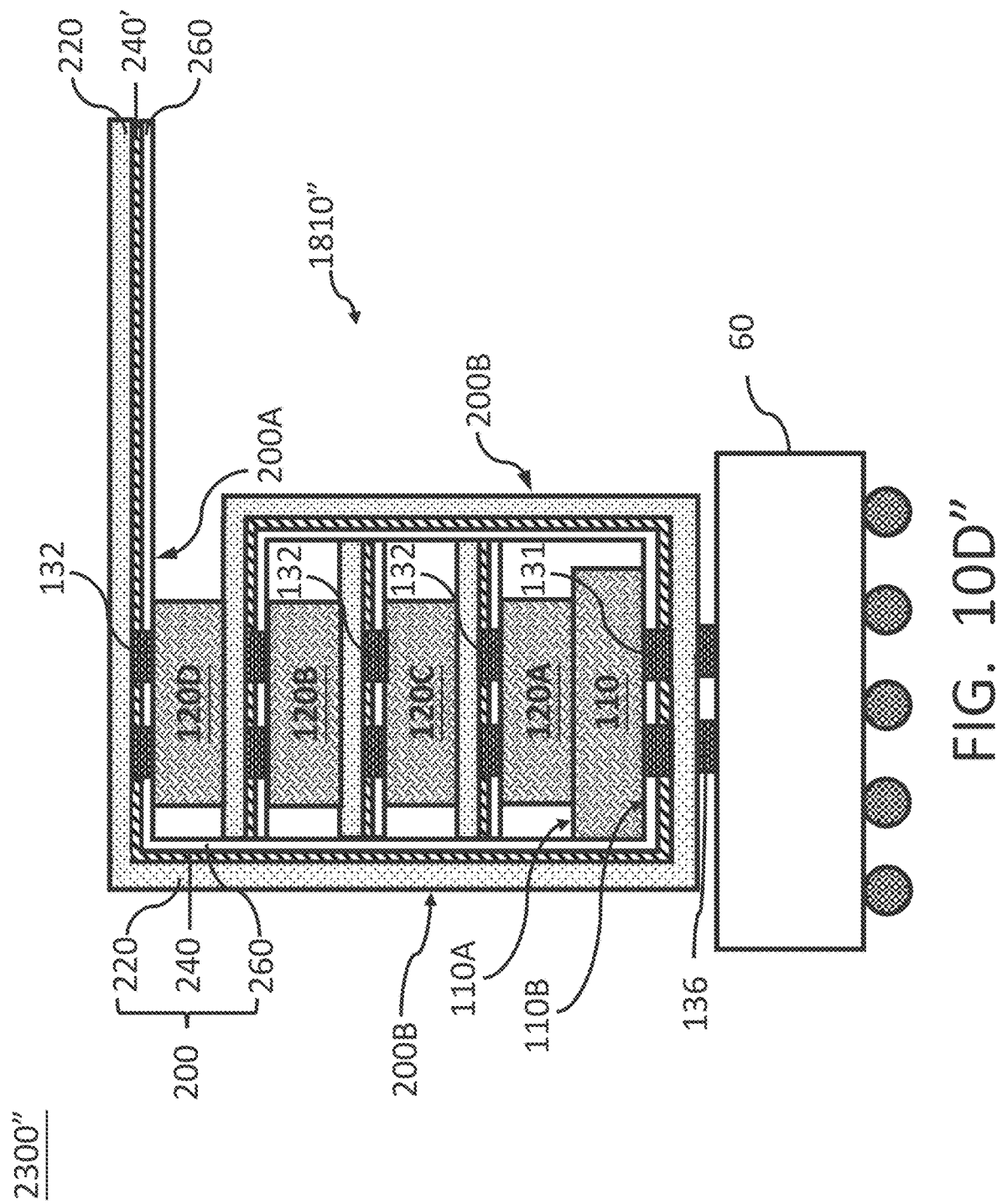
FIG. 10D"

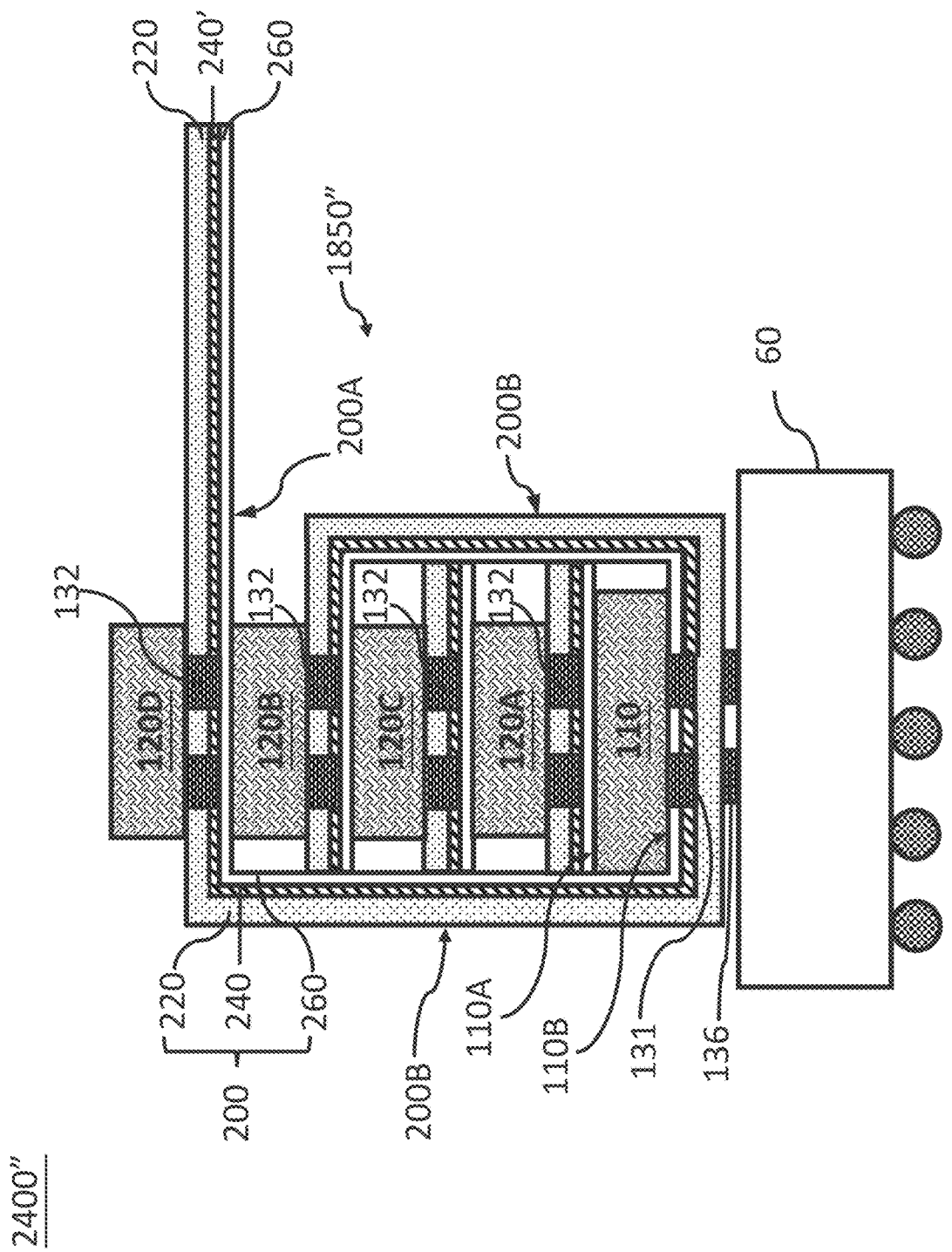
FIG. 11D"

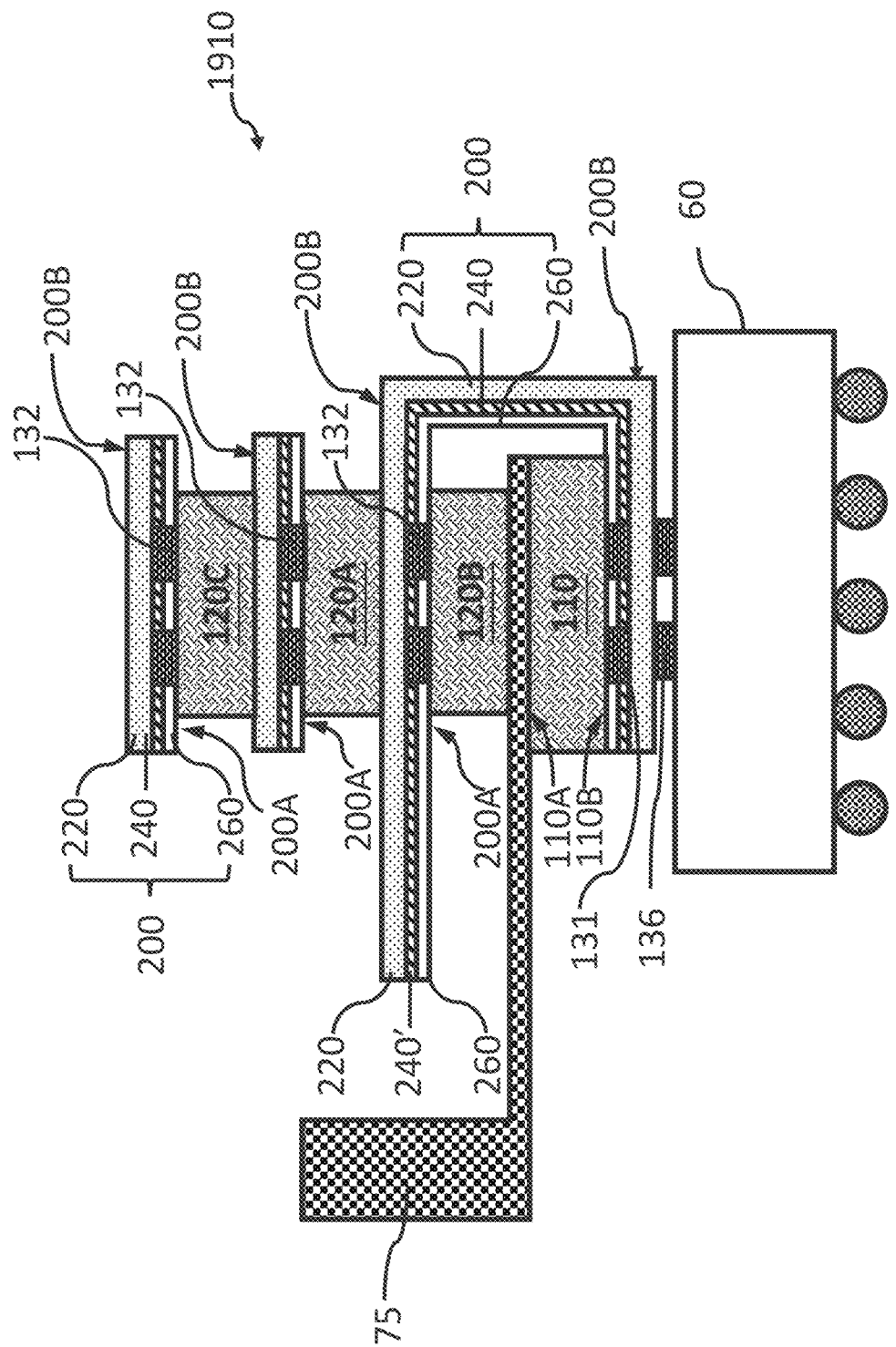

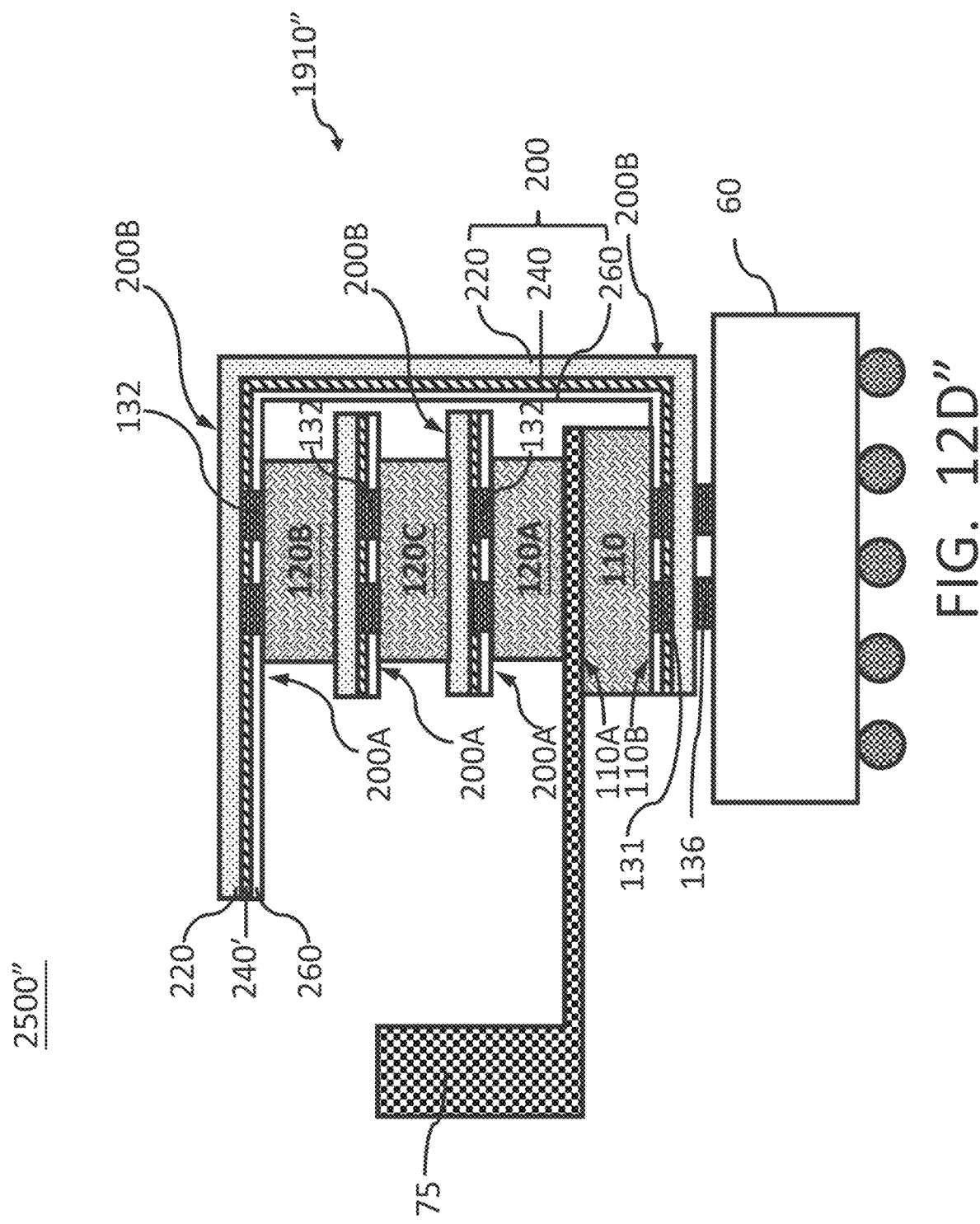
FIG. 12D"

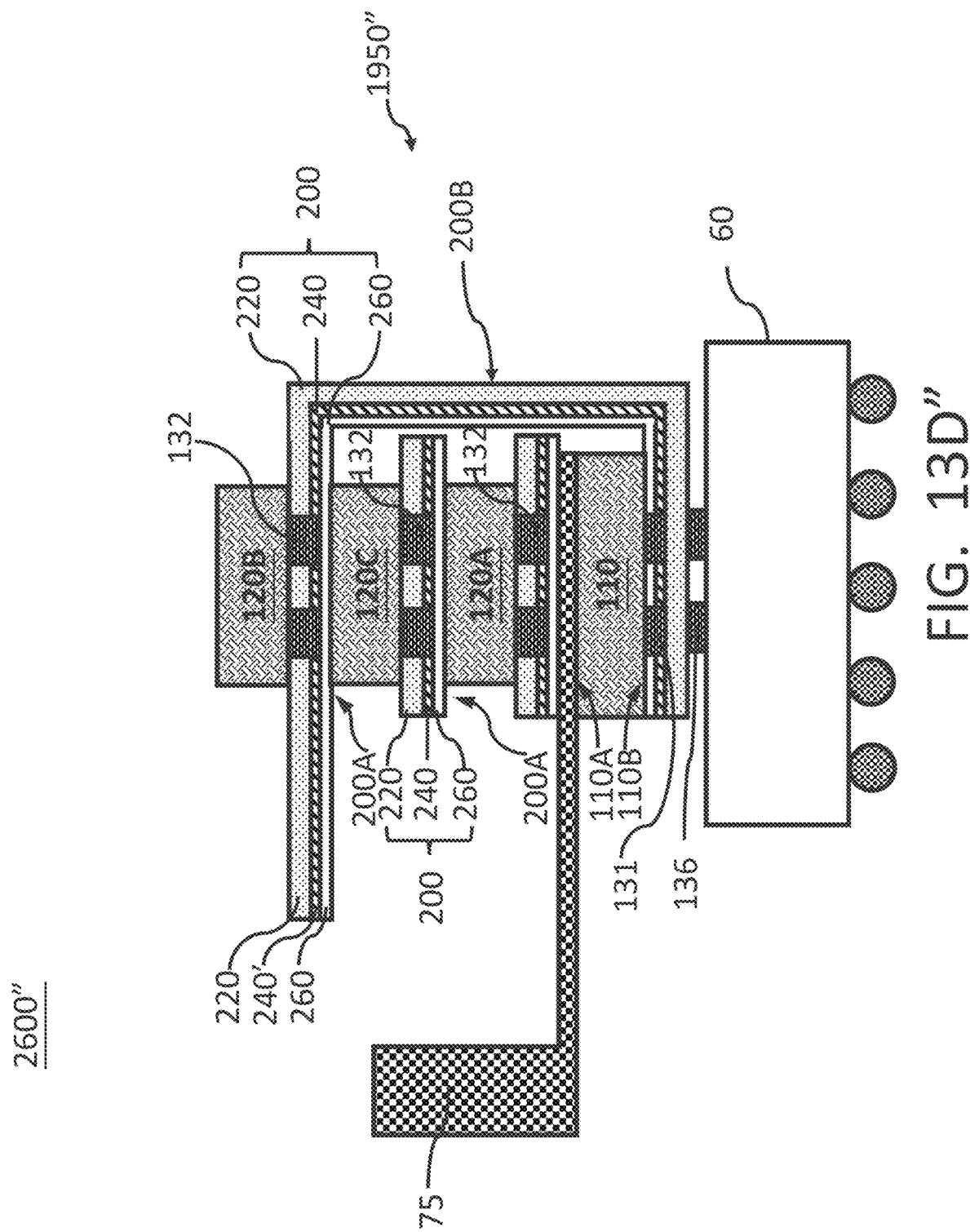
FIG. 13D"

3D PACKAGE CONFIGURATION

CROSS-REFERENCE TO RELATED APPLICATION

This application claims the priority benefit of Taiwanese Application Serial Number 109145694, filed on Dec. 23, 2020, which is incorporated herein by reference.

TECHNICAL FILED

This invention relates to a package configuration, and particularly relates to a 3D package configuration.

BACKGROUND OF THE INVENTION

The application of 3D package configurations is rapidly developing to solve important technical issues such as miniaturization, multi-function integration, faster interconnection, and energy saving. A typical 3D package configuration usually obtained by stacking dies with through-silicon vias (TSV) or dies interconnected by micro-bumps and electrically connected to each other by micro-bumps.

However, the above-mentioned 3D package configurations usually involve thin film deposition, photolithography, development, etching, metallization and other semiconductor manufacturing processes, which are not only complicated in process and time-wasting in packaging, but also low yield rate and high cost. In view of these disadvantages, a novel 3D package configuration that can be manufactured by conventional techniques is highly expected by the industry.

SUMMARY OF THE INVENTION

This invention discloses a 3D package configuration, comprising a lead frame and a plurality of semiconductor package units vertically stacked on the lead frame in sequence, wherein the semiconductor package units are electrically connected to each other and electrically connected to the lead frame, and each of the semiconductor package units comprises: a semiconductor die with a top surface and a bottom surface opposite to each other, and a plurality of side surfaces adjacent to the top surface and the bottom surface; and a folded flexible circuit board with a first surface and a second surface opposite to each other, wherein the bottom surface of the semiconductor die is bonded to the first surface and electrically connected to the folded flexible circuit board, and the first surface of the folded flexible circuit board is attached onto the top surface, the bottom surface and one of the side surfaces of the semiconductor die.

The above-mentioned 3D package configuration, wherein the folded flexible circuit board comprises: a flexible insulating substrate; a circuit formed on a surface of the flexible insulating substrate; and an insulating layer overlaying the circuit; wherein, the first surface of the folded flexible circuit board comprises a plurality of first bonding pads electrically connected to the circuit, and the bottom surface of the semiconductor die is bonded to the first surface and electrically connected to the folded flexible circuit board through the first bonding pads; wherein, the second surface of the folded flexible circuit board and the flexible insulating substrate corresponding to the top surface of the semiconductor die respectively comprise a plurality of second bonding pads and a plurality of first conductive holes electrically connected to the circuit, and the second surface of the folded flexible circuit board and the flexible insulating substrate corresponding to the bottom surface of the semiconductor die respectively comprise a plurality of third bonding pads and a plurality of second conductive holes electrically connected to the circuit, and each of the third bonding pads is electrically connected to the circuit through one of the second conductive holes; wherein, the semiconductor package units are vertically and sequentially stacked to interconnect with each other by bonding the third bonding pads of one of the semiconductor package unit to the second bonding pads of another adjacent one of the semiconductor package units, and the bottommost one of the semiconductor package units is directly bonded to the lead frame and electrically connected therewith through the third bonding pads.

The above-mentioned 3D package configuration, wherein the material of the flexible insulating substrate is selected from one of the group consisting of Polyester resin, Polyimide (PI), Modified Polyimide (MPI), Covalent Organic Framework (COF), Liquid Photo-Imageable (LPI), Liquid Crystal Polymer (LCP), Polytetrafluoroethylene (PTFE) and flexible epoxy bonded fiber-glass board, or combinations thereof.

The above-mentioned 3D package configuration, wherein the material of the circuit is selected from one of the group consisting of copper, copper alloy, tinned copper, tin alloy, aluminum, aluminum alloys, gold and silver, or combinations thereof.

The above-mentioned 3D package configuration, wherein one of the semiconductor package units comprises a high power consuming semiconductor die.

The above-mentioned 3D package configuration, further comprising a heat dissipating mechanism, wherein the heat dissipating mechanism is sandwiched between the top surface of the high power consuming semiconductor die and first surface of the folded flexible circuit board attached on the top surface of the high power consuming semiconductor die.

This invention discloses another 3D package configuration, comprising a lead frame; and a folded flexible circuit board structure vertically stacked on the lead frame and electrically connected therewith, comprising: a flexible circuit board with a first surface and a second surface opposite to each other, wherein the flexible circuit board having a first die bonding zone formed on the first surface and at least one second die bonding zone formed on the first surface and/or the second surface; at least one first semiconductor die bonded to the first die bonding zone and electrically connected to the flexible circuit board; and at least one second semiconductor die bonded to the second die bonding zone and electrically connected to the flexible circuit board; wherein, the at least one second semiconductor die is vertically stacked above the at least one first semiconductor die by folding the flexible circuit board to form the folded flexible circuit board structure, and the folded flexible circuit board structure is vertically stacked on the lead frame and electrically connected therewith through lead frame bonding pads.

The above-mentioned another 3D package configuration, comprising a plurality of second semiconductor dies spaced with each other, and a plurality of second die bonding zones formed on the first surface and/or the second surface of the flexible circuit board, wherein each of the second semiconductor dies bonded on each of the second semiconductor die bonding zones and electrically connected to the flexible circuit board through each of the second die bonding pads in each of the second die bonding zones, and the second semiconductor die are vertically and sequentially stacked above the at least one first semiconductor die by folding the flexible circuit board, wherein the first die bonding zone overlaps with the second die bonding zones.

The above-mentioned another 3D package configuration, wherein the second die bonding zones are concurrently formed on the first surface of the flexible circuit board or concurrently formed on the second surface of the flexible circuit board.

The above-mentioned another 3D package configuration, wherein the second die bonding zones are alternatively formed on the first surface and the second surface of the flexible circuit board.

The above-mentioned another 3D package configuration, wherein the flexible circuit board comprises: a flexible insulating substrate; a circuit formed on a surface of the flexible insulating substrate; and an insulating layer overlaying the circuit; wherein, the first die bonding zone comprises a plurality of first die bonding pads electrically connected to the circuit to make the first semiconductor die electrically connected to the circuit through the first die bonding pads, and the at least one second die bonding zone comprises a plurality of second die bonding pads electrically connected to the circuit to make the at least one second semiconductor die electrically connected to the circuit through the second die bonding pads, and a plurality of lead frame bonding pads under the first die bonding zone are formed on the second surface of the flexible circuit board, and each of the lead frame bonding pads is electrically connected to each of the first die bonding pads corresponding thereof through a conductive hole.

The above-mentioned another 3D package configuration, wherein the material of the flexible insulating substrate is selected from one of the group consisting of Polyester resin, Polyimide (PI), Modified Polyimide (MPI), Covalent Organic Framework (COF), Liquid Photo-Imageable (LPI), Liquid Crystal Polymer (LCP), Polytetrafluoroethylene (PTFE) and flexible epoxy bonded fiber-glass board, or combinations thereof.

The above-mentioned another 3D package configuration, wherein the material of the circuit is selected from one of the group consisting of copper, copper alloy, tinned copper, tin alloy, aluminum, aluminum alloys, gold and silver, or combinations thereof.

The above-mentioned another 3D package configuration, wherein one of the second semiconductor dies bonded to one of the second chip bonding regions adjacent to a terminal of the flexible circuit board is a tel-communication chip, and an antenna region is formed between the terminal of the flexible circuit board and the tel-communication chip, wherein the antenna region comprises an integrated antenna circuit formed on the insulating substrate of the flexible circuit board and overlaid by the insulating layer of the flexible circuit board, and the tel-communication chip is electrically connected to the integrated antenna circuit through the second chip bonding pads.

The above-mentioned another 3D package configuration, wherein the material of the integrated antenna circuit is selected from one of the group consisting of copper, copper alloy, tinned copper, tin alloy, aluminum, aluminum alloys, gold and silver, or combinations thereof.

The above-mentioned another 3D package configuration, wherein one of the at least one first semiconductor die is a high power consuming semiconductor die.

The above-mentioned another 3D package configuration, further comprising a heat dissipating mechanism, wherein the heat dissipating mechanism is sandwiched between the top surface of the first semiconductor die and the folded flexible circuit board of the folded flexible circuit board structure.

This invention discloses further another 3D package configuration, comprising: a lead frame; and a folded flexible circuit board structure vertically stacked on the lead frame and electrically connected therewith, comprising: a first flexible circuit board with a first surface and a second surface opposite to each other, wherein the first flexible circuit board includes a first die bonding zone and at least one second die bonding zone formed on the first surface; at least one first semiconductor die bonded to the first die bonding zone and electrically connected to the first flexible circuit board; and at least one second semiconductor die bonded to the at least one second die bonding zone and electrically connected to the first flexible circuit board; a second flexible circuit board with a third surface and a fourth surface opposite to each other, wherein the second flexible circuit board includes at least one third die bonding zone formed on the third surface; and at least one third semiconductor die bonded to the at least one third die bonding zone and electrically connected to the second flexible circuit board; wherein, the at least one third semiconductor die and the at least one second semiconductor die are alternatively vertically stacked above the at least one first semiconductor die by folding the first flexible circuit board and the second flexible circuit board to make the first die bonding zone, the at least one second die bonding zone and the at least one third die bonding zone overlap with each other to form the folded flexible circuit board structure, and a plurality of lead frame bonding pads under the first die bonding zone are formed on the third surface of the second flexible circuit board, and each of the lead frame bonding pads is electrically connected to each of the first die bonding pads corresponding thereof through a conductive hole; wherein, the folded flexible circuit board structure is vertically stacked on the lead frame and electrically connected therewith through the lead frame bonding pads.

The above-mentioned further another 3D package configuration, comprising a plurality of second semiconductor dies spaced with each other, and a plurality of second chip bonding regions formed on the first surface of the first flexible circuit board, wherein each of the second semiconductor dies is bonded to each of the second chip bonding region and electrically connected to the first flexible circuit board through a second bonding pad in each of the second chip bonding region.

The above-mentioned further another 3D package configuration, comprising a plurality of third semiconductor dies spaced with each other, and a plurality of third chip bonding regions formed on the third surface of the second flexible circuit board, wherein each of the third semiconductor dies is bonded to one of the third chip bonding regions and electrically connected to the second flexible circuit board through a third bonding pad in each of the third bonding regions.

The above-mentioned further another 3D package configuration, wherein the first flexible circuit board comprises a plurality of first bonding pads and a plurality of second bonding pads respectively formed on the second surface corresponding to the first die bonding zone and the at least one second die bonding zone, and the second flexible circuit board comprises a plurality of third bonding pads formed on the fourth surface corresponding to the at least one third die bonding zone, and the first flexible circuit is joined with the second flexible circuit board to generate a foldable flexible circuit board by bonding the first bonding pads and the second pads formed on the second surface of the first flexible circuit board to the third bonding pads formed on the fourth surface of the second flexible circuit board.

The above-mentioned further another 3D package configuration, wherein the first flexible circuit board comprises: a first flexible insulating substrate; a first circuit formed on a surface of the first flexible insulating substrate; and a first insulating layer overlaying the first circuit; wherein, the first die bonding zone comprises a plurality of first bonding pads electrically connected to the first circuit to make the at least one first semiconductor die electrically connected to the first circuit through the first bonding pads, and the at least one second die bonding zone comprises a plurality of second die bonding pads electrically connected to the first circuit to make the at least one second semiconductor die electrically connected to the first circuit through the second die bonding pads.

The above-mentioned further another 3D package configuration, wherein the material of the first flexible insulating substrate is selected from one of the group consisting of Polyester resin, Polyimide (PI), Modified Polyimide (MPI), Covalent Organic Framework (COF), Liquid Photo-Imageable (LPI), Liquid Crystal Polymer (LCP), Polytetrafluoroethylene (PTFE) and flexible epoxy bonded fiber-glass board, or combinations thereof.

The above-mentioned further another 3D package configuration, wherein the material of the first circuit is selected from one of the group consisting of copper, copper alloy, tinned copper, tin alloy, aluminum, aluminum alloys, gold and silver, or combinations thereof.

The above-mentioned further another 3D package configuration, wherein the second flexible circuit board comprises: a second flexible insulating substrate; a second circuit formed on a surface of the second flexible insulating substrate; and a second insulating layer overlaying the second circuit; wherein, the at least one third die bonding zone is arranged to interlace with the first die bonding zone and the least one second die bonding zone, and the at least one third die bonding zone comprises a plurality of third bonding pads electrically connected to the second circuit to make the at least one third semiconductor die electrically connected to the second circuit through the third bonding pads.

The above-mentioned further another 3D package configuration, wherein the material of the second flexible insulating substrate is selected from one of the group consisting of Polyester resin, Polyimide (PI), Modified Polyimide (MPI), Covalent Organic Framework (COF), Liquid Photo-Imageable (LPI), Liquid Crystal Polymer (LCP), Polytetrafluoroethylene (PTFE) and flexible epoxy bonded fiber-glass board, or combinations thereof.

The above-mentioned further another 3D package configuration, wherein the material of the second circuit is selected from one of the group consisting of copper, copper alloy, tinned copper, tin alloy, aluminum, aluminum alloys, gold and silver, or combinations thereof.

The above-mentioned further another 3D package configuration, wherein the at least one first semiconductor die is a high power consuming semiconductor die.

The above-mentioned further another 3D package configuration, further comprising a heat dissipating mechanism, wherein the heat dissipating mechanism is sandwiched between the top surface of the at least one first semiconductor die and the folded first flexible circuit board of the folded flexible circuit board structure.

BRIEF DESCRIPTION OF THE DRAWINGS

FIG. 1D' is a cross-sectional view of another 3D package configuration 80' according to Embodiment 1 of this invention.

FIGS. 2A~2B are cross-sectional views showing processes for manufacturing a 3D package configuration 1500 according to Embodiment 2 of this present invention.

FIG. 2B' is a cross-sectional view of another 3D package configuration 1500' according to Embodiment 2 of this invention.

FIG. 3B' is a cross-sectional view of another 3D package configuration 1600' according to Embodiment 3 of this invention.

FIG. 4B' is a cross-sectional view of another 3D package configuration 1700' according to Embodiment 4 of this invention.

FIG. 5B' is a cross-sectional view of another 3D package configuration 1800' according to Embodiment 5 of this invention.

FIG. 6D' is a cross-sectional view of another 3D package configuration 1900' according to Embodiment 6 of this invention.

FIG. 6D" is a cross-sectional view of another 3D package configuration 1900" according to Embodiment 6 of this invention.

FIG. 7A-1 is a top view of a flexible circuit board according to Embodiment 7 of this invention.

FIG. 7A-2 is a bottom view of a flexible circuit board according to Embodiment 7 of this invention.

FIG. 7D' is a cross-sectional view of another 3D package configuration 2000' according to Embodiment 7 of this invention.

FIG. 7D" is a cross-sectional view of another 3D package configuration 2000" according to Embodiment 7 of this invention.

FIG. 8D' is a cross-sectional view of another 3D package configuration 2100' according to Embodiment 8 of this invention.

FIG. 8D" is a cross-sectional view of another 3D package configuration 2100" according to Embodiment 8 of this invention.

FIG. 9A-1 is a top view of a flexible circuit board according to Embodiment 9 of this invention.

FIG. 9A-2 is a bottom view of a flexible circuit board according to Embodiment 9 of this invention.

FIG. 9D' is a cross-sectional view of another 3D package configuration 2200' according to Embodiment 9 of this invention.

FIG. 9D" is a cross-sectional view of another 3D package configuration 2200" according to Embodiment 9 of this invention.

FIG. 10D' is a cross-sectional view of another 3D package configuration 2300' according to Embodiment 10 of this invention.

FIG. 10D" is a cross-sectional view of another 3D package configuration 2300" according to Embodiment 10 of this invention.

FIG. 11A-1 is a top view of a flexible circuit board according to Embodiment 11 of this invention.

FIG. 11A-2 is a bottom view of a flexible circuit board according to Embodiment 11 of this invention.

FIG. 11D' is a cross-sectional view of another 3D package configuration 2400' according to Embodiment 11 of this invention.

FIG. 11D" is a cross-sectional view of another 3D package configuration 2400" according to Embodiment 11 of this invention.

FIG. 12D' is a cross-sectional view of another 3D package configuration 2500' according to Embodiment 12 of this invention.

FIG. 12D" is a cross-sectional view of another 3D package configuration 2500' according to Embodiment 12 of this invention.

FIG. 13A-1 is a top view of a flexible circuit board according to Embodiment 13 of this invention.

FIG. 13A-2 is a bottom view of a flexible circuit board according to Embodiment 13 of this invention.

FIG. 13D' is a cross-sectional view of another 3D package configuration 2600' according to Embodiment 13 of this invention.

FIG. 13D" is a cross-sectional view of another 3D package configuration 2600" according to Embodiment 13 of this invention.

DETAILED DESCRIPTION OF THE INVENTION

In the following detailed description, for purposes of explanation, numerous specific details are set forth in order to provide a thorough understanding of the disclosed embodiments. It will be apparent, however, that one or more embodiments may be practiced without these specific details.

It is apparent that departures from specific designs and methods described and shown will suggest themselves to those skilled in the art and may be used without departing from the spirit and scope of the invention. The present invention is not restricted to the particular constructions described and illustrated, but should be construed to cohere with all modifications that may fall within the scope of the appended claims.

EMBODIMENTS

Embodiment 1

Figure 1A:
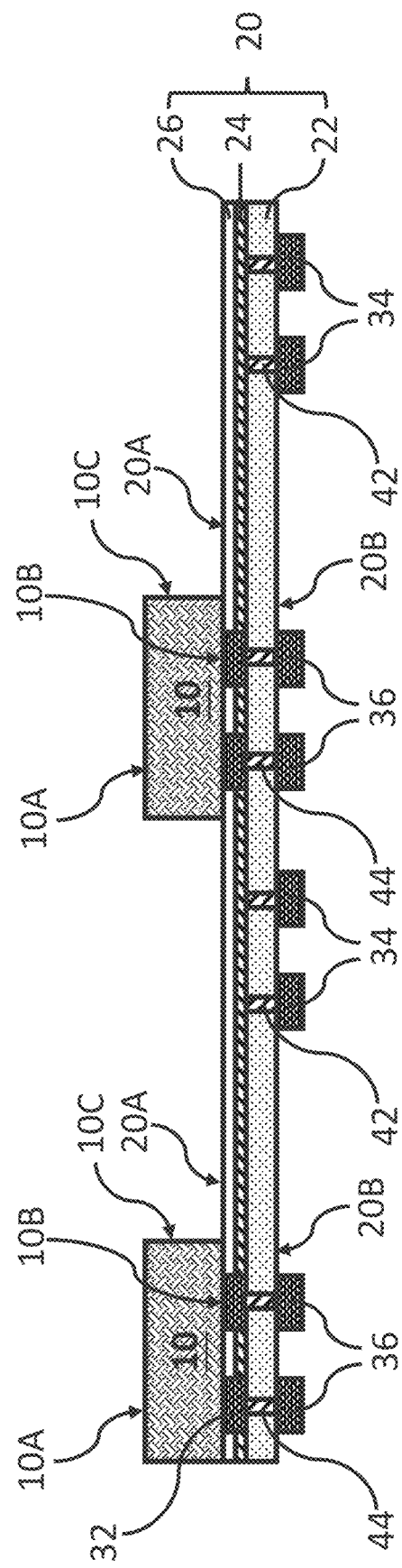
FIGS. 1A~1D are cross-sectional views showing processes for manufacturing a 3D package configuration 80 according to Embodiment 1 of this present invention.
Figure 1B:
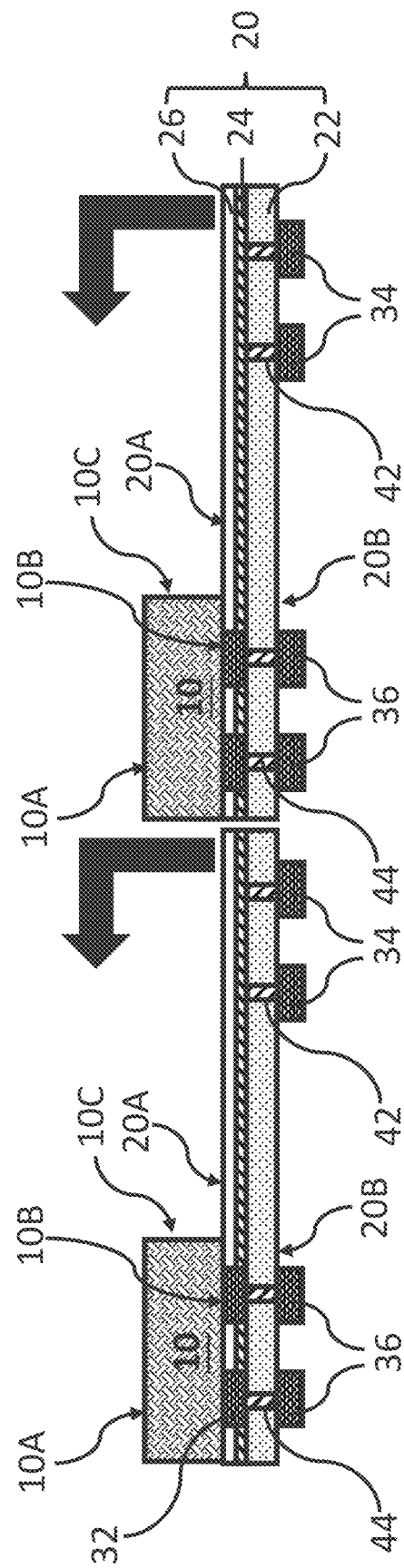
Figure 1C:
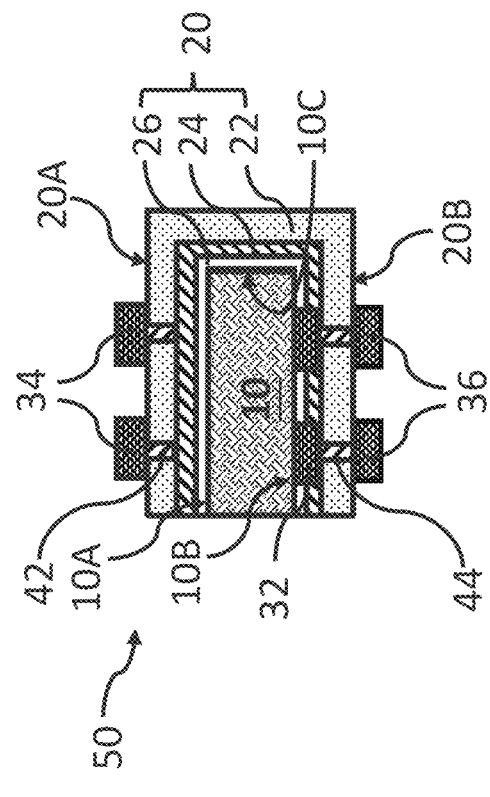
Figure 1C:
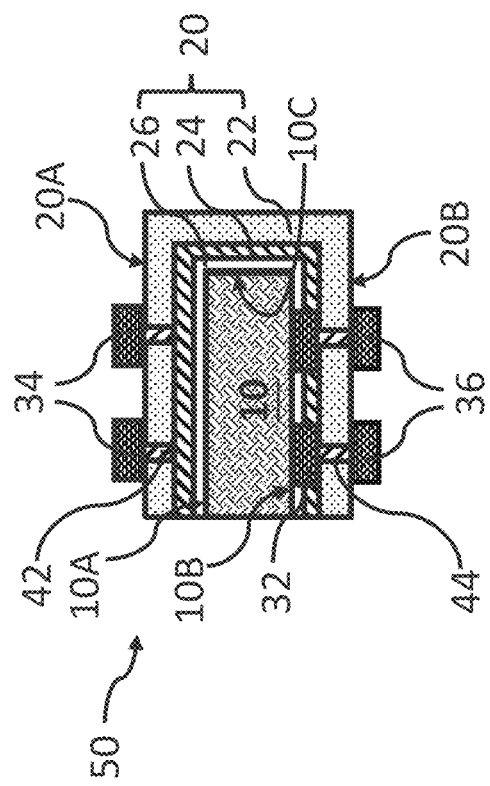
Figure 1D:
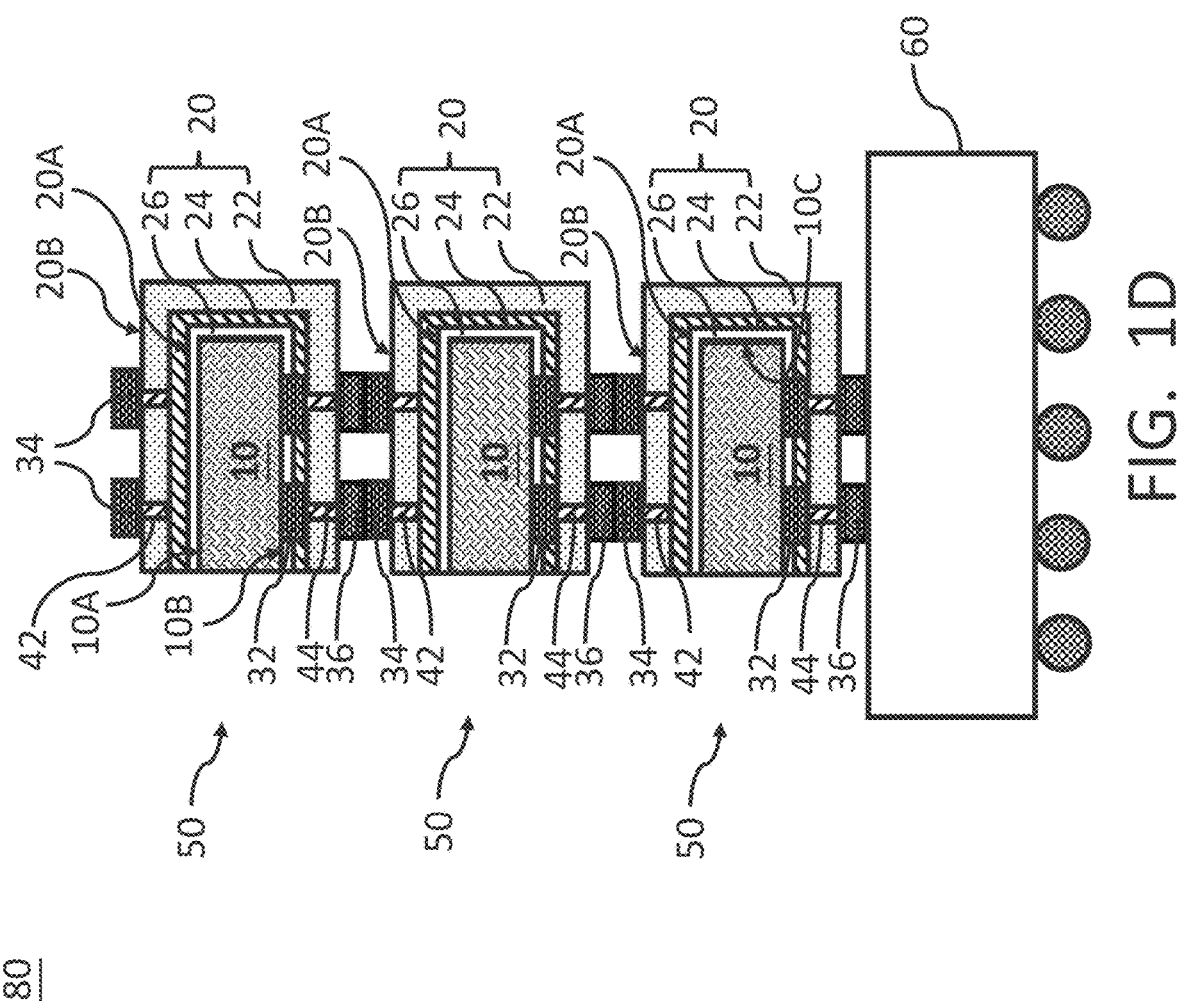
Figure 1D:
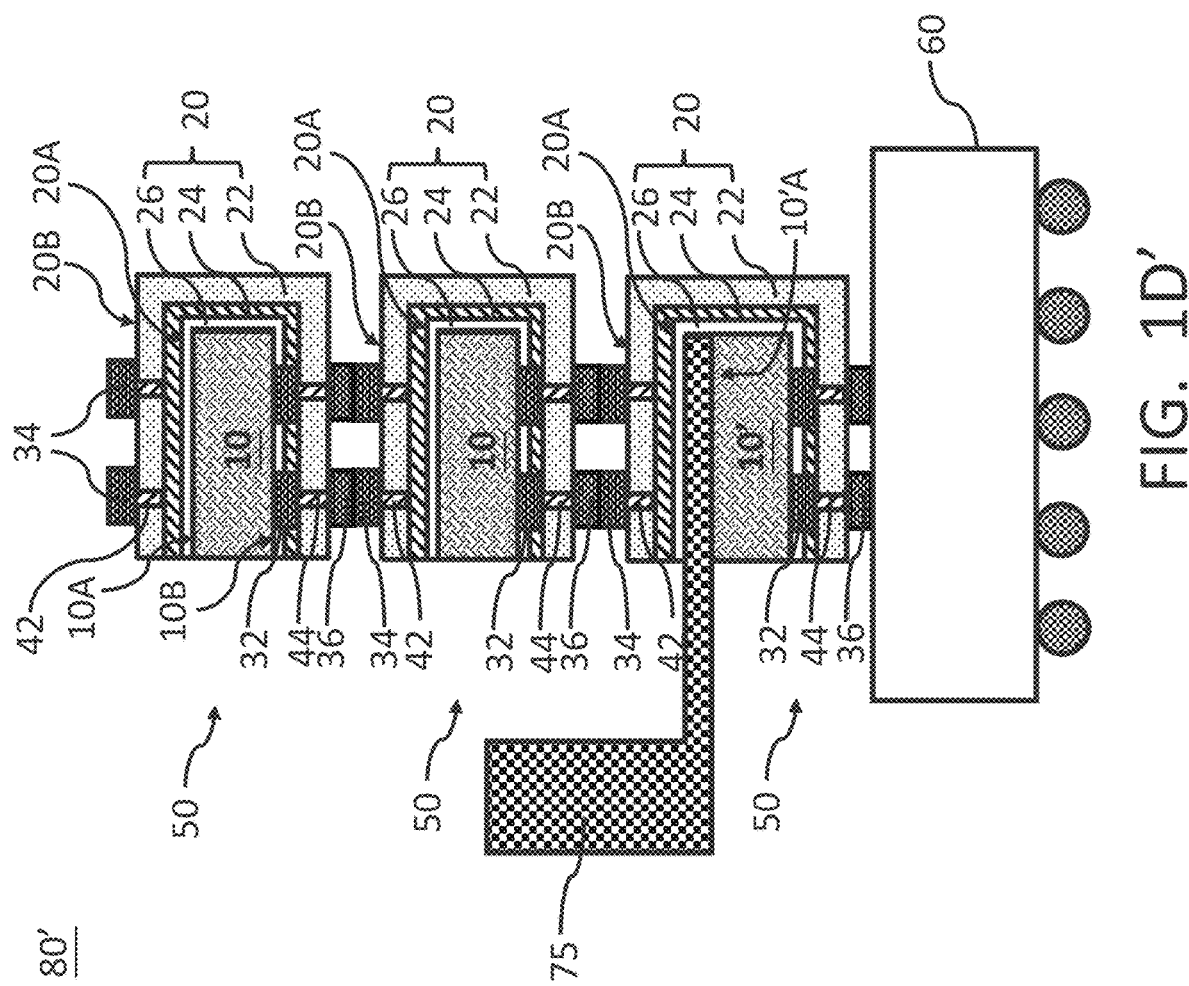

Please refer to FIGS. 1A~1D and 1D'. FIGS. 1A~1D are cross-sectional views showing processes for manufacturing a 3D package configuration 80 according to Embodiment 1 of this present invention. FIG. 1D' is a cross-sectional view of another 3D package configuration 80' according to Embodiment 1 of this invention.

This present Embodiment 1 discloses a 3D package configuration 80 as shown in FIG. 1D, comprising a lead frame 60 and a plurality of semiconductor package units 50 vertically stacked on the lead frame 60 in sequence, wherein the semiconductor package units 50 are electrically connected to each other and electrically connected to the lead frame 60. Each of the semiconductor package units 50 comprises: a semiconductor die 10 with a top surface 10A and a bottom surface 10B opposite to each other, and a plurality of side surfaces 10C adjacent to the top surface 10A and the bottom surface 10B; and a folded flexible circuit board 20 comprising a flexible insulating substrate 22, a circuit 24 formed on a surface of the insulating substrate 22 and an insulating layer 26 overlaying the circuit 24, wherein the folded flexible circuit board 20 has a first surface 20A with a plurality of first bonding pads 32 electrically connected to the circuit 24 and a second surface 20B opposite to each other and the bottom surface 10B of the semiconductor die 10 is bonded to the first surface 20A and electrically connected to the folded flexible circuit board 20 through the first bonding pads 32, and the first surface 20A of the folded flexible circuit board 20 is attached onto the top surface 10A, the bottom surface 10B and one of the side surfaces 10C of the semiconductor die 10. The second surface 20B of the folded flexible circuit board 20 where corresponds to the top surface 10A of the semiconductor die 10 further comprises a plurality of second bonding pads 34 and a plurality of conductive holes 42 electrically connected to the circuit 24, and the second surface 20B of the folded flexible circuit board 20 where corresponds to the bottom surface 10B of the semiconductor die 10 further comprises a plurality of third bonding pads 36 and a plurality of second conductive holes 44 electrically connected to the circuit 24, and each of the second bonding pads 34 is electrically connected to the circuit 24 through one of the first conductive holes 42, and each of the third bonding pads 36 is electrically connected to the circuit 24 through one of the second conductive holes 44. The semiconductor package units 50 were vertically and sequentially stacked to interconnect with each other by bonding the third bonding pads 36 of one of the semiconductor package unit 50 to the second bonding pads 34 of another adjacent one of the semiconductor package units 50, and the bottommost one of the semiconductor package units 50 was directly bonded onto and electrically connected therewith through the third bonding pads 36 thereof, and then placed into a jig for subsequent package treatment to generate a 3D package configuration 80 as shown in FIG. 1D.

The above-mentioned semiconductor package unit 50, wherein the semiconductor die 10 can be for example but not limited to a Central Processing Unit (CPU) die, a Graphics Processing Unit (GPU) die, a Digital Signal Processor (DSP) die, a Micro-Processing Unit (MPU) die, a Micro-Controlling Unit (MCU) die, a Dynamic Random Access Memory (DRAM) die, a Static Random Access Memory (SRAM) die, a Standard Logic IC die, an Application-Specific Integrated Circuit (ASIC) die, a sensing die with a specific sensing function, or a driving IC die.

The above-mentioned semiconductor package unit 50, wherein the first bonding pads 32 and the second bonding pads 34 are for example but not limited to solder balls or metallic bumps formed by a material selected from one of the group consisting of tin, tin alloys including tin/copper alloy, tin/ITO alloy, tin/silver alloy, tin/bismuth alloy and tin/lead alloy, and conductive polymers.

The above-mentioned semiconductor package unit 50, wherein the material of the flexible insulating substrate 22 is selected from for example but not limited to one of the group consisting of Polyester resin, Polyimide (PI), Modified Polyimide (MPI), Covalent Organic Framework (COF), Liquid Photo-Imageable (LPI), Liquid Crystal Polymer (LCP), Polytetrafluoroethylene (PTFE) and flexible epoxy bonded fiber-glass board, or combinations thereof.

The above-mentioned semiconductor package unit 50, wherein the circuit 24 of the flexible circuit board 20 can be a single-layered circuit or a multiple-layered circuit, and the insulating layer 26 overlaying the circuit 24 can also be a single-layered insulating layer or a multiple-layered insulating layer.

The above-mentioned semiconductor package unit 50, wherein the material of the circuit is selected from for example but not limited to one of the group consisting of copper, copper alloy, tinned copper, tin alloy, aluminum, aluminum alloys, gold and silver, or combinations thereof.

The above-mentioned semiconductor package unit 50 can be manufactured by for example but not limited to the processes as shown in FIGS. 1A~1C.

First, a flexible circuit board 20 as shown in FIG. 1A was provided. The flexible circuit board 20 comprises a flexible insulating substrate 22, a circuit 24 formed on a surface of the insulating substrate 22 and an insulating layer 26 overlaying the circuit 24, wherein the flexible circuit board 20 has a first surface 20A with a plurality of first bonding pads 32 electrically connected to the circuit 24 and a second surface 20B opposite to the first surface 20A. Then, a plurality of semiconductor dies 10 were provided. Each of the semiconductor dies 10 includes a top surface 10A, a bottom surface 10B opposite to the top surface 10A, and a plurality of side surface 10C adjacent to the top surface 10A and the bottom surface 10B. Each of the semiconductor dies 10 is bonded to the first surface 20A of the folded flexible circuit board 20 by the bottom surface 10B thereof through the first bonding pads 32 and the bottom surface 10B of the semiconductor die 10 is bonded to the first surface 20A and electrically connected to the folded flexible circuit board 20 through the first bonding pads 32 and electrically connected to the circuit 24. Moreover, the second surface 20B of the folded flexible circuit board 20 comprises a plurality of second bonding pads 34 and a plurality of first conductive holes 42 electrically connected to the circuit 24, and a plurality of third bonding pads 36 and a plurality of second conductive holes 44 electrically connected to the circuit 24.

Figures 1, 9A:
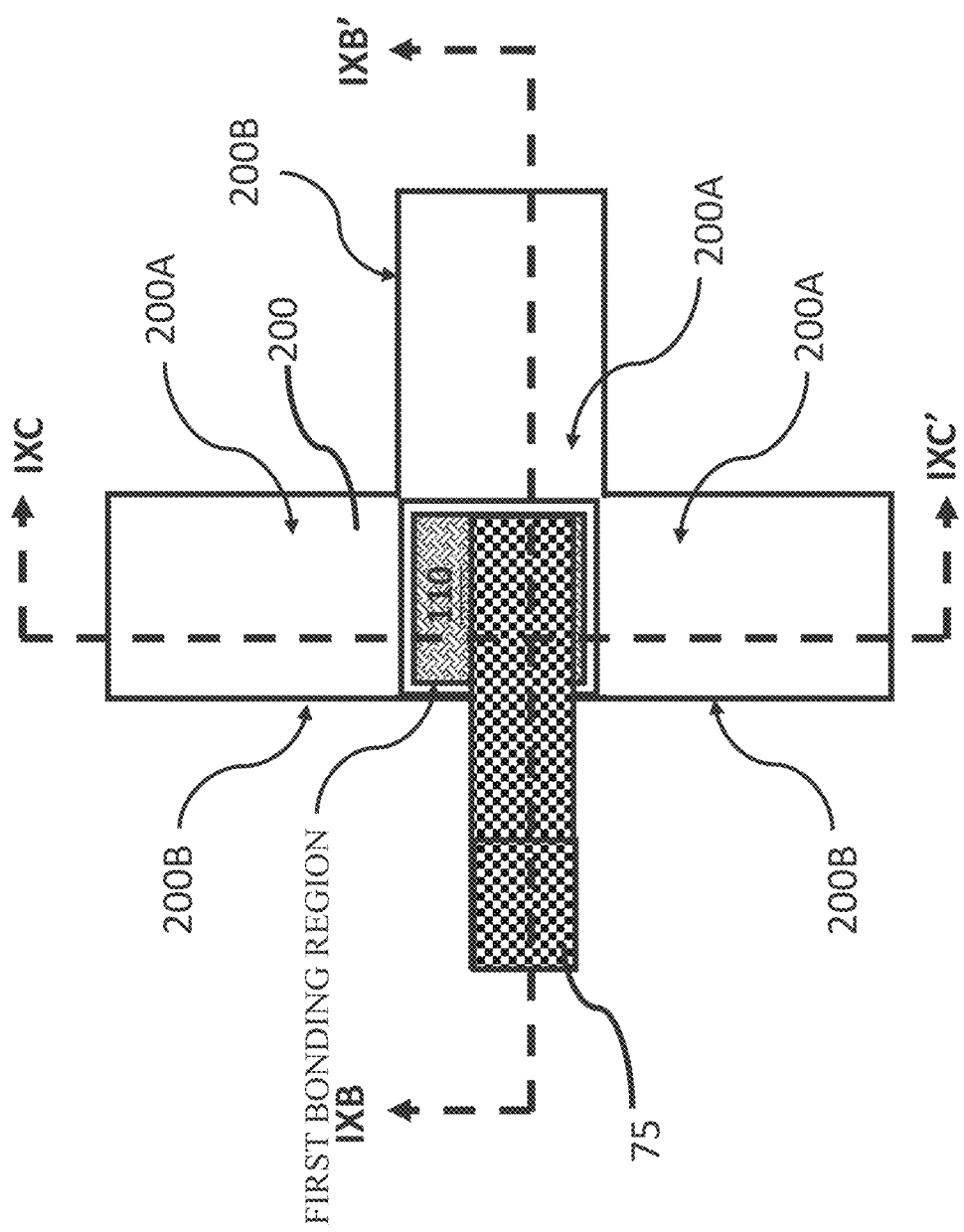
Figures 2, 9A:
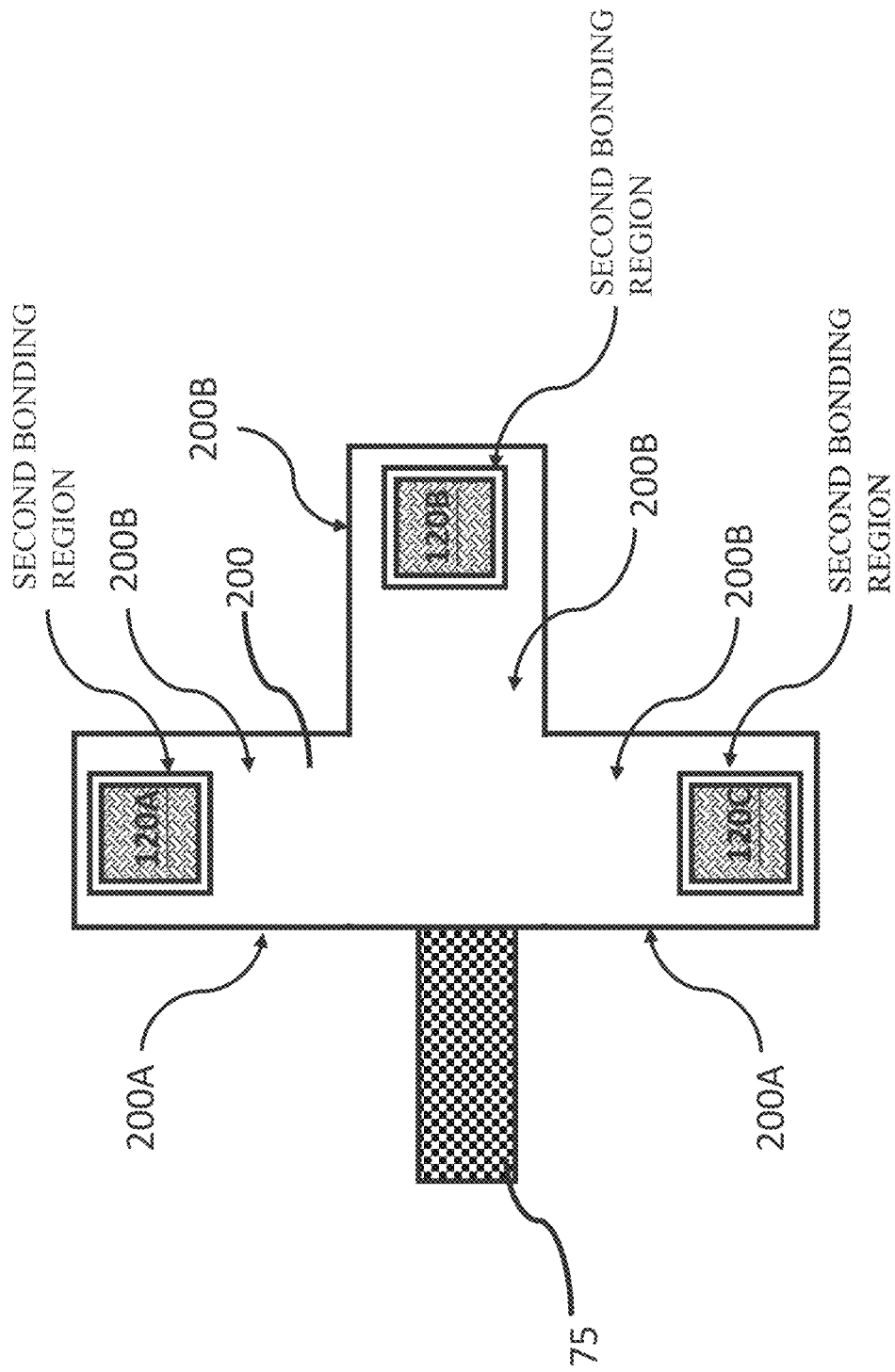

Next, as shown in FIGS. 1B~1C, the flexible circuit board 20 as shown in FIG. 1A was appropriately cut as FIG. 1B, and then the flexible circuit board 20 on the right side of the semiconductor die 10 was folded to make the first surface 20A of the folded flexible circuit board 20 be attached onto the top surface 10A, the bottom surface 10B and one of the side surfaces 10C of the semiconductor die 10 to generate a semiconductor package unit 50 as shown in FIG. 1C. As shown in FIG. 1 C, the second surface 20B of the folded flexible circuit board 20 where corresponds to the top surface 10A of the semiconductor die 10 further comprises a plurality of second bonding pads 34 and a plurality of conductive holes 42 electrically connected to the circuit 24, and the second surface 20B of the folded flexible circuit board 20 where corresponds to the bottom surface 10B of the semiconductor die 10 further comprises a plurality of third bonding pads 36 and a plurality of second conductive holes 44 electrically connected to the circuit 24, and each of the second bonding pads 34 is electrically connected to the circuit 24 through one of the first conductive holes 42, and each of the third bonding pads 36 is electrically connected to the circuit 24 through one of the second conductive holes 44. According to another embodiment of this invention, additional adhesive layers can be coated on the first surface 20A of the flexible circuit board 20 or the top surface 10A, the bottom surface 10B and one of the side surfaces 10C of the semiconductor die 10 to enhance the adhesion between the first surface 20A of the flexible circuit 20 and the top surface 10A, the bottom surface 10B and one of the side surfaces 10C of the semiconductor die 10.

Furthermore, as shown in FIG. 1D', when the bottommost one of the semiconductor package units 50 comprises a high power consuming semiconductor die 10', a heat dissipating mechanism 75 was introduced and sandwich between the top surface 10A of the high power consuming semiconductor die 10' and first surface 20A of the folded flexible circuit board 20 attached on the top surface 10A of the high power consuming semiconductor die 10 to generate another 3D package configuration 80' according to this embodiment 1 of this invention.

Embodiment 2

Figure 2A:
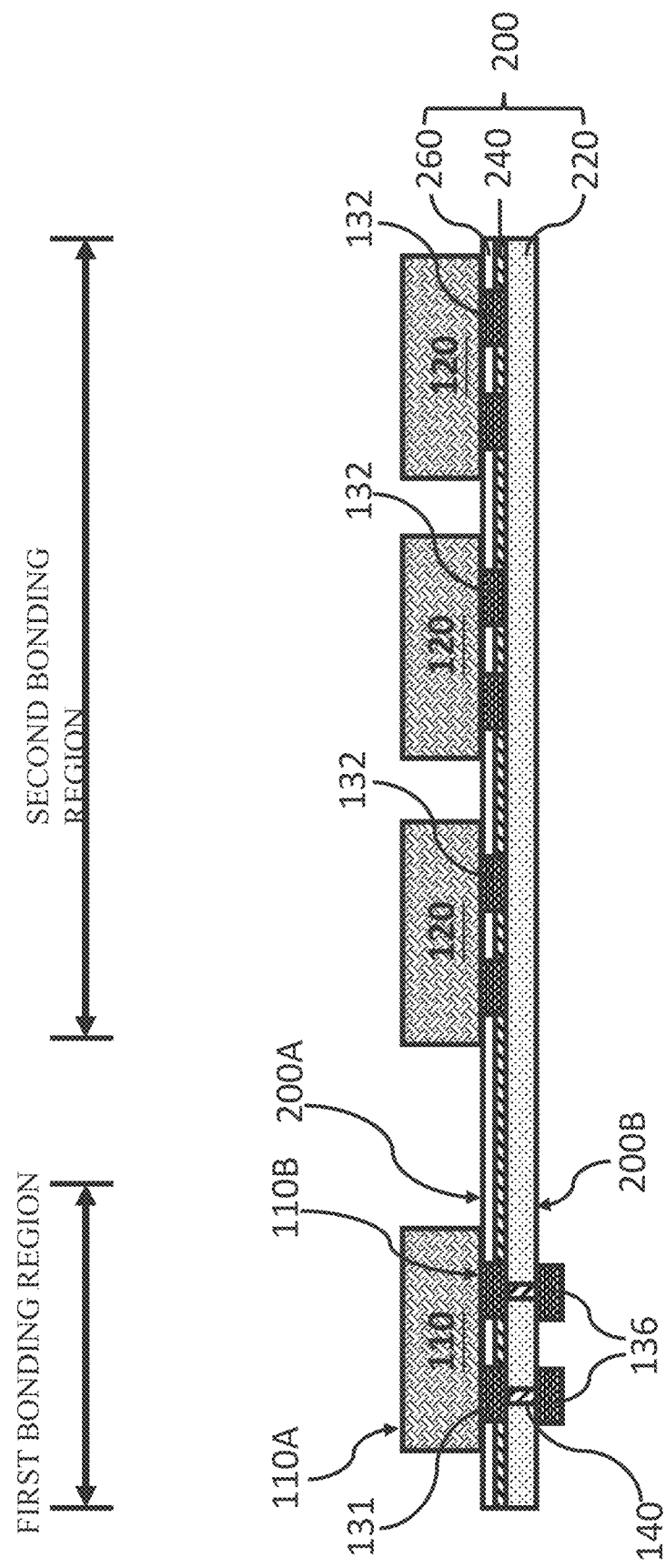

Please refer to FIGS. 2A~2B and 2B'. FIGS. 2A~2B are cross-sectional views showing processes for manufacturing a 3D package configuration 1500 according to Embodiment 2 of this present invention. FIG. 2B' is a cross-sectional view of another 3D package configuration 1500' according to Embodiment 2 of this invention.

This present Embodiment 2 discloses a 3D package configuration 1500 as shown in FIG. 2B, comprising a lead frame 60 and a folded flexible circuit board structure 1000 vertically stacked on the lead frame 60 and electrically connected therewith. The folded flexible circuit board structure 1000 comprises: a flexible circuit board 200 as shown in FIG. 2A comprising a flexible insulating substrate 220, a circuit 240 formed on a surface of the flexible insulating substrate 220 and an insulating layer 260 overlaying the circuit 240, wherein the flexible circuit board 200 has a first surface 200A and a second surface 200B opposite to each other, wherein the first surface 200A includes a first die bonding zone and a plurality of second die bonding zones formed thereon, and the first die bonding zone includes a plurality of first die bonding pads 131 electrically connected to the circuit 240, and each of the second die bonding zones includes a plurality of second die bonding pads 132 electrically connected to the circuit 240, and the second surface 200B under the first die bonding zone further comprises a plurality of lead frame bonding pads 136, wherein each of the lead frame bonding pads 136 corresponding to each of the first die bonding pads 131 and electrically to each other through a first conductive hole 140; a first semiconductor die 110 bonded to the first die bonding zone and electrically connected to the circuit 240 through the first die bonding pads 131; and a plurality of second semiconductor dies 120 bonded to the second die bonding zone and electrically connected to the circuit 240 through the second die bonding pads 132.

The flexible circuit board 200 according to Embodiment 2 of this invention comprises one first semiconductor die 110 bonded to the first die bonding zone. However, the flexible circuit board 200 according to other embodiments of this invention can alternatively comprise more than one first semiconductor dies 110 bonded to the first die bonding zone if necessary.

As shown in FIGS. 2A~2B, the folded flexible circuit board structure 1000 as shown in FIG. 2B was obtained by folding the flexible circuit board 200 shown in FIG. 2A to make the second semiconductor dies 120 be vertically and sequentially stacked above the first semiconductor die 110. The obtained folded flexible circuit board structure 1000 was vertically stacked on the lead frame 60 and electrically connected therewith by the lead frame bonding pads 136, and then placed into a jig for subsequent package treatment to generate a 3D package configuration 1500 as shown in FIG. 2B.

A plurality of second semiconductor dies 120 were bonded to the second die bonding zone formed on the first surface 200A. However, According to another embodiment of this invention, one second semiconductor die 120 can also optionally be bonded to the second die bonding zone formed on the first surface 200A if necessary.

The first semiconductor die 110 and the second semiconductor dies 120 of the 3D package configuration 1500 can respectively be for example but not limited to a CPU die, a GPU die, a DSP die, a MPU die, a MCU die, a DRAM die, a SRAM die, a Standard Logic IC die, an ASIC die for a special application, a sensing die with a specific sensing function, or a driving IC die.

The first die bonding pads 131, the second die bonding pads 132 and the lead frame bonding pads 136 of the 3D package configuration 1500 are for example but not limited to solder balls or metallic bumps formed by a material selected from one of the group consisting of tin, tin alloys including tin/copper alloy, tin/ITO alloy, tin/silver alloy, tin/bismuth alloy and tin/lead alloy, and conductive polymers.

The material for the flexible insulating substrate 220 of the 3D package configuration 1500 is selected from for example but not limited to one of the group consisting of Polyester resin, Polyimide (PI), Modified Polyimide (MPI), Covalent Organic Framework (COF), Liquid Photo-Imageable (LPI), Liquid Crystal Polymer (LCP), Polytetrafluoroethylene (PTFE) and flexible epoxy bonded fiber-glass board, or combinations thereof.

The material for the circuit 240 of the 3D package configuration 1500 is selected from for example but not limited to one of the group consisting of copper, copper alloy, tinned copper, tin alloy, aluminum, aluminum alloys, gold and silver, or combinations thereof.

The above-mentioned 3D package configuration 1500, wherein the circuit 240 of the flexible circuit board 200 can be a single-layered circuit or a multiple-layered circuit, and the insulating layer 260 overlaying the circuit 240 can also be a single-layered insulating layer or a multiple-layered insulating layer.

According to another embodiment of this invention, additional adhesive layers can be coated on the first surface 200A of the flexible circuit board 200 or the second surface 200B of the flexible circuit board 200 to fasten the folded flexible circuit board structure 1500 vertically stacked on the lead frame 60.

Furthermore, as shown in FIG. 2B', when the first semiconductor die 110' was a high power consuming semiconductor die, for example but not limited to a CPU die, a heat dissipating mechanism 75 was introduced and sandwich between the top surface 110A of the high power consuming semiconductor die 110' and first surface 200A of the folded flexible circuit board 200 attached on the top surface 110A of the high power consuming semiconductor die 110' to generate another 3D package configuration 1500' according to Embodiment 2 of this invention.

Embodiment 3

Figure 3A:
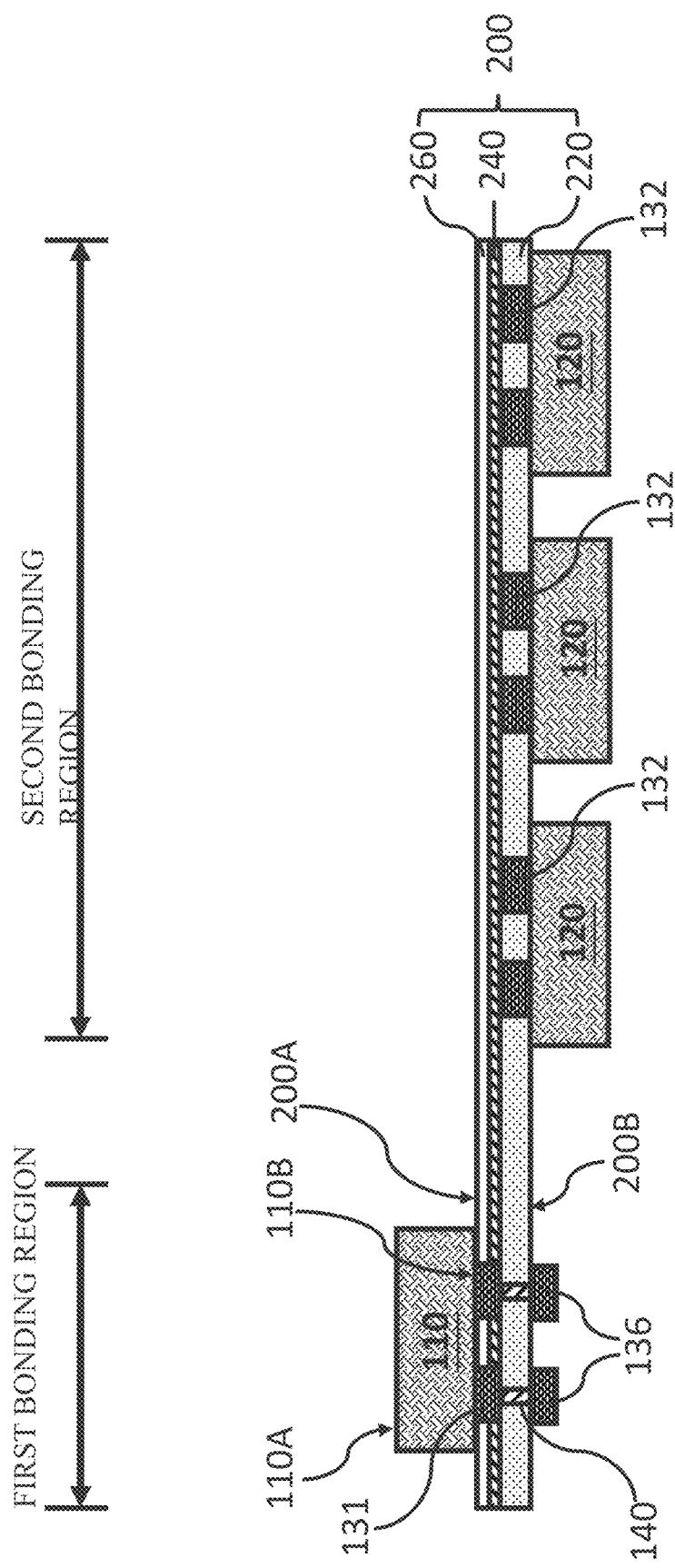
FIGS. 3A~3B are cross-sectional views showing processes for manufacturing a 3D package configuration 1600 according to Embodiment 3 of this present invention.
Figure 3B:
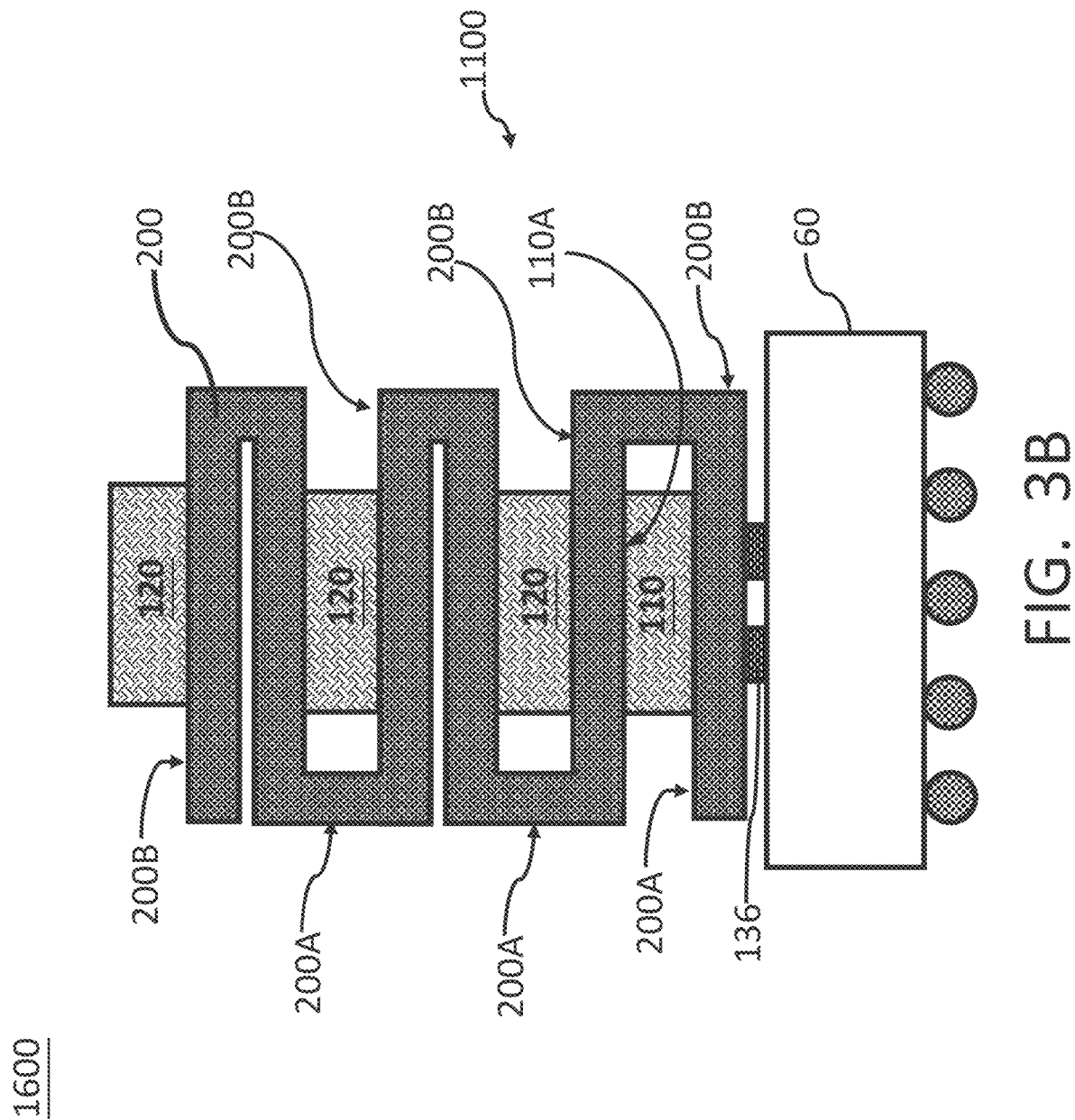

Please refer to FIGS. 3A~3B and 3B'. FIGS. 3A~3B are cross-sectional views showing processes for manufacturing a 3D package configuration 1600 according to Embodiment 3 of this present invention. FIG. 3B' is a cross-sectional view of another 3D package configuration 1600' according to Embodiment 3 of this invention.

This present Embodiment 3 discloses a 3D package configuration 1600 as shown in FIG. 3B, comprising a lead frame 60 and a folded flexible circuit board structure 1100 vertically stacked on the lead frame 60 and electrically connected therewith. The folded flexible circuit board structure 1100 comprises a flexible circuit board 200 as shown in FIG. 3A comprising: a flexible insulating substrate 220, a circuit 240 formed on a surface of the flexible insulating substrate 220 and an insulating layer 260 overlaying the circuit 240, wherein the flexible circuit board 200 has a first surface 200A and a second surface 200B opposite to each other, wherein the first surface 200A includes a first die bonding zone on the second surface 200B includes a plurality of second die bonding zones, and the first die bonding zone includes a plurality of first die bonding pads 131 electrically connected to the circuit 240, and each of the second die bonding zones includes a plurality of second die bonding pads 132 electrically connected to the circuit 240, and the second surface 200B under the first die bonding zone further comprises a plurality of lead frame bonding pads 136, wherein each of the lead frame bonding pads 136 corresponding to each of the first die bonding pads 131 and electrically to each other through a first conductive hole 140; a first semiconductor die 110 bonded to the first die bonding zone and electrically connected to the circuit 240 through the first die bonding pads 131; and a plurality of second semiconductor dies 120 bonded to the second die bonding zone and electrically connected to the circuit 240 through the second die bonding pads 132.

The flexible circuit board 200 according to Embodiment 3 of this invention comprises one first semiconductor die 110 bonded to the first die bonding zone. However, the flexible circuit board 200 according to other embodiments of this invention can alternatively comprise more than one first semiconductor dies 110 bonded to the first die bonding zone if necessary.

As shown in FIGS. 3A~3B, the folded flexible circuit board structure 1100 as shown in FIG. 3B was obtained by folding the flexible circuit board 200 shown in FIG. 3A to make the second semiconductor dies 120 be vertically and sequentially stacked above the first semiconductor die 110. The obtained folded flexible circuit board structure 1100 was vertically stacked on the lead frame 60 and electrically connected therewith by the lead frame bonding pads 136, and then placed into a jig for subsequent package treatment to generate a 3D package configuration 1600 as shown in FIG. 3B.

A plurality of second semiconductor dies 120 were bonded to the second die bonding zone formed on the first surface 200A. However, According to another embodiment of this invention, one second semiconductor die 120 can also optionally be bonded to the second die bonding zone formed on the second surface 200B if necessary.

The first semiconductor die 110 and the second semiconductor dies 120 of the 3D package configuration 1600 can respectively be for example but not limited to a CPU die, a GPU die, a DSP die, a MPU die, a MCU die, a DRAM die, a SRAM die, a Standard Logic IC die, an ASIC die for a special application, a sensing die with a specific sensing function, or a driving IC die.

The first die bonding pads 131, the second die bonding pads 132 and the lead frame bonding pads 136 of the 3D package configuration 1600 are for example but not limited to solder balls or metallic bumps formed by a material selected from one of the group consisting of tin, tin alloys including tin/copper alloy, tin/ITO alloy, tin/silver alloy, tin/bismuth alloy and tin/lead alloy, and conductive polymers.

The material for the flexible insulating substrate 220 of the 3D package configuration 1600 is selected from for example but not limited to one of the group consisting of Polyester resin, Polyimide (PI), Modified Polyimide (MPI), Covalent Organic Framework (COF), Liquid Photo-Imageable (LPI), Liquid Crystal Polymer (LCP), Polytetrafluoroethylene (PTFE) and flexible epoxy bonded fiber-glass board, or combinations thereof.

The material for the circuit 240 of the 3D package configuration 1600 is selected from for example but not limited to one of the group consisting of copper, copper alloy, tinned copper, tin alloy, aluminum, aluminum alloys, gold and silver, or combinations thereof.

The above-mentioned 3D package configuration 1600, wherein the circuit 240 of the flexible circuit board 200 can be a single-layered circuit or a multiple-layered circuit, and the insulating layer 260 overlaying the circuit 240 can also be a single-layered insulating layer or a multiple-layered insulating layer.

According to another embodiment of this invention, additional adhesive layers can be coated on the first surface 200A of the flexible circuit board 200 or the second surface 200B of the flexible circuit board 200 to fasten the folded flexible circuit board structure 1600 vertically stacked on the lead frame 60.

Furthermore, as shown in FIG. 3B', when the first semiconductor die 110' was a high power consuming semiconductor die, for example but not limited to a CPU die, a heat dissipating mechanism 75 was introduced and sandwich between the top surface 110A of the high power consuming semiconductor die 110' and first surface 200A of the folded flexible circuit board 200 attached on the top surface 110A of the high power consuming semiconductor die 110' to generate another 3D package configuration 1600' according to this embodiment 3 of this invention.

Embodiment 4

Figure 4A:
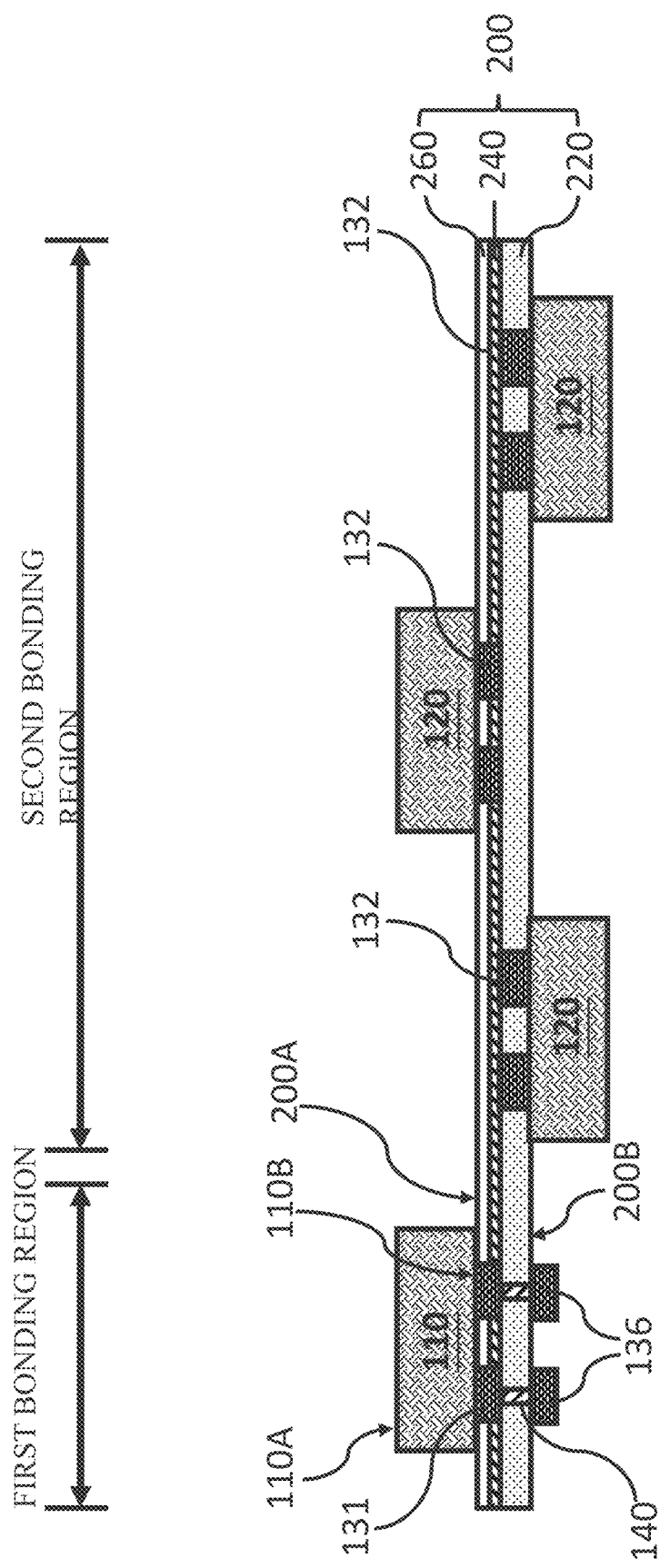
FIGS. 4A~4B are cross-sectional views showing processes for manufacturing a 3D package configuration 1700 according to Embodiment 4 of this present invention.
Figure 4B:
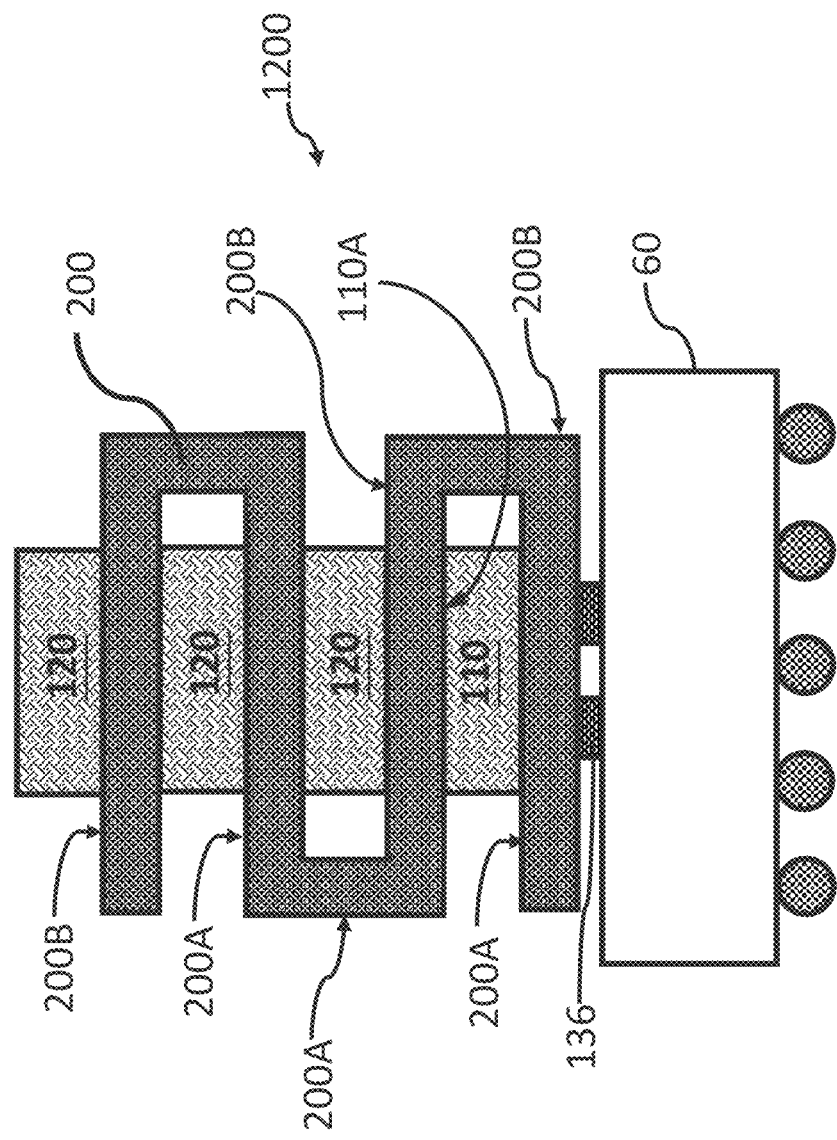

Please refer FIGS. 4A~4B and 4B'. FIGS. 4A~4B are cross-sectional views showing processes for manufacturing a 3D package configuration 1700 according to Embodiment 4 of this present invention. FIG. 4B' is a cross-sectional view of another 3D package configuration 1700' according to Embodiment 4 of this invention.

This present Embodiment 4 discloses a 3D package configuration 1700 as shown in FIG. 4B, comprising a lead frame 60 and a folded flexible circuit board structure 1200 vertically stacked on the lead frame 60 and electrically connected therewith. The folded flexible circuit board structure 1200 comprises: a flexible circuit board 200 as shown in FIG. 4A comprising a flexible insulating substrate 220, a circuit 240 formed on a surface of the flexible insulating substrate 220 and an insulating layer 260 overlaying the circuit 240, wherein the flexible circuit board 200 has a first surface 200A and a second surface 200B opposite to each other, and the flexible circuit board 200 includes a first die bonding zone formed on the first surface 200A and a plurality of second die bonding zones alternatively formed on the first surface 200A and the second surface 200B, and the first die bonding zone includes a plurality of first die bonding pads 131 electrically connected to the circuit 240, and each of the second die bonding zones includes a plurality of second die bonding pads 132 electrically connected to the circuit 240, and the second surface 200B under the first die bonding zone further comprises a plurality of lead frame bonding pads 136, wherein each of the lead frame bonding pads 136 corresponding to each of the first die bonding pads 131 and electrically to each other through a first conductive hole 140; a first semiconductor die 110 bonded to the first die bonding zone and electrically connected to the circuit 240 through the first die bonding pads 131; and a plurality of second semiconductor dies 120 bonded to the second die bonding zone and electrically connected to the circuit 240 through the second die bonding pads 132.

The flexible circuit board 200 according to Embodiment 4 of this invention comprises one first semiconductor die 110 bonded to the first die bonding zone. However, the flexible circuit board 200 according to other embodiments of this invention can alternatively comprise more than one first semiconductor dies 110 bonded to the first die bonding zone if necessary.

As shown in FIGS. 4A~4B, the folded flexible circuit board structure 1200 as shown in FIG. 4B was obtained by folding the flexible circuit board 200 shown in FIG. 4A to make the second semiconductor dies 120 be vertically and sequentially stacked above the first semiconductor die 110. The obtained folded flexible circuit board structure 1200 was vertically stacked on the lead frame 60 and electrically connected therewith by the lead frame bonding pads 136, and then placed into a jig for subsequent package treatment to generate a 3D package configuration 1700 as shown in FIG. 4B.

The first semiconductor die 110 and the second semiconductor dies 120 of the 3D package configuration 1700 can respectively be for example but not limited to a CPU die, a GPU die, a DSP die, a MPU die, a MCU die, a DRAM die, a SRAM die, a Standard Logic IC die, an ASIC die for a special application, a sensing die with a specific sensing function, or a driving IC die.

The first die bonding pads 131, the second die bonding pads 132 and the lead frame bonding pads 136 of the 3D package configuration 1700 are for example but not limited to solder balls or metallic bumps formed by a material selected from one of the group consisting of tin, tin alloys including tin/copper alloy, tin/ITO alloy, tin/silver alloy, tin/bismuth alloy and tin/lead alloy, and conductive polymers.

The material for the flexible insulating substrate 220 of the 3D package configuration 1700 is selected from for example but not limited to one of the group consisting of Polyester resin, Polyimide (PI), Modified Polyimide (MPI), Covalent Organic Framework (COF), Liquid Photo-Imageable (LPI), Liquid Crystal Polymer (LCP), Polytetrafluoroethylene (PTFE) and flexible epoxy bonded fiber-glass board, or combinations thereof.

The above-mentioned 3D package configuration 1700, wherein the circuit 240 of the flexible circuit board 200 can be a single-layered circuit or a multiple-layered circuit, and the insulating layer 260 overlaying the circuit 240 can also be a single-layered insulating layer or a multiple-layered insulating layer.

According to another embodiment of this invention, additional adhesive layers can be coated on the first surface 200A of the flexible circuit board 200 or the second surface 200B of the flexible circuit board 200 to fasten the folded flexible circuit board structure 1200 vertically stacked on the lead frame 60.

Furthermore, as shown in FIG. 4B', when the first semiconductor die 110' was a high power consuming semiconductor die, for example but not limited to a CPU die, a heat dissipating mechanism 75 was introduced and sandwich between the top surface 110A of the high power consuming semiconductor die 110' and first surface 200A of the folded flexible circuit board 200 attached on the top surface 110A of the high power consuming semiconductor die 110' to generate another 3D package configuration 1700' according to this embodiment 3 of this invention.

Embodiment 5

Figure 5A:
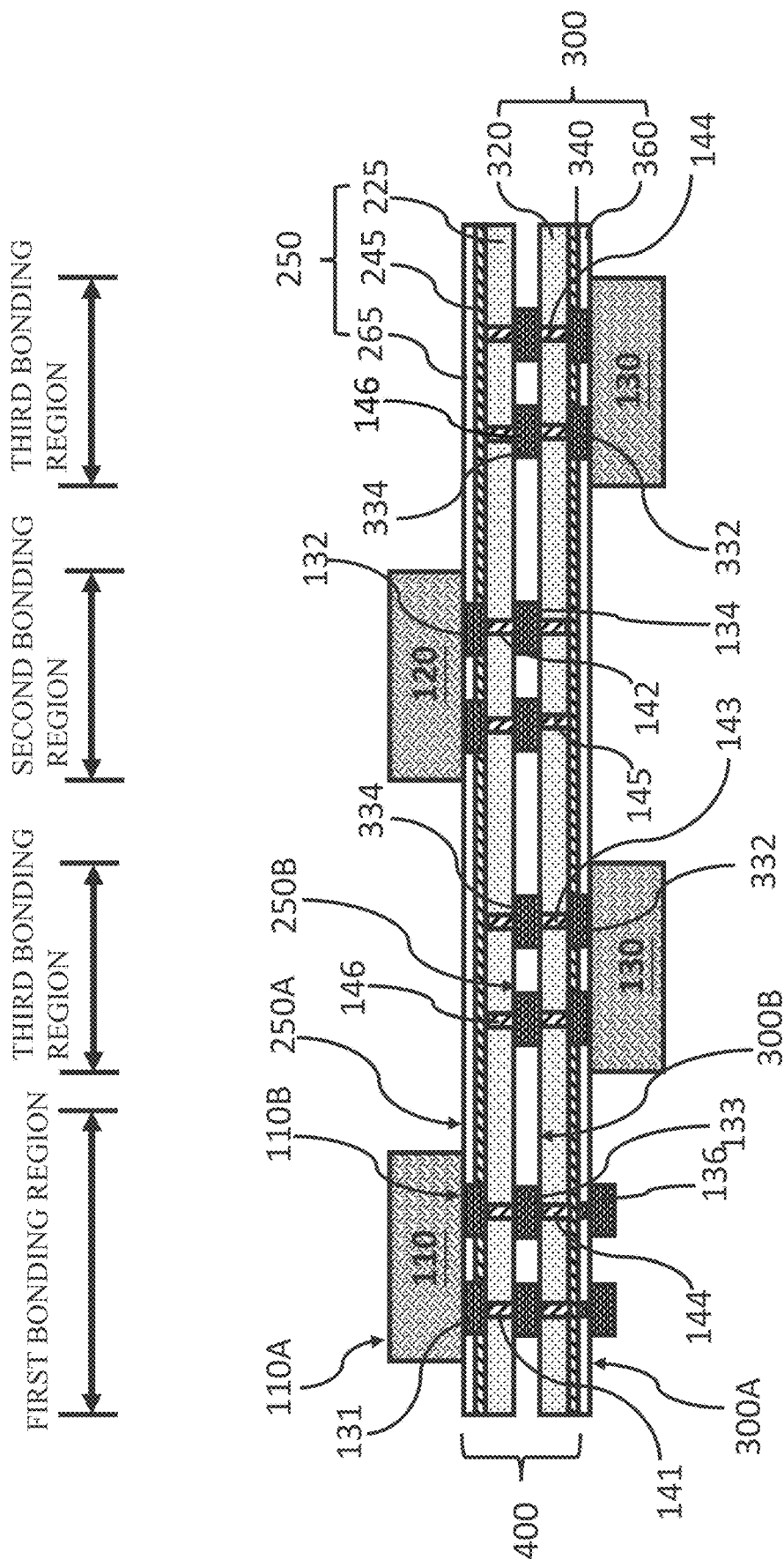
FIGS. 5A~5B are cross-sectional views showing processes for manufacturing a 3D package configuration 1800 according to Embodiment 5 of this present invention.
Figure 5B:
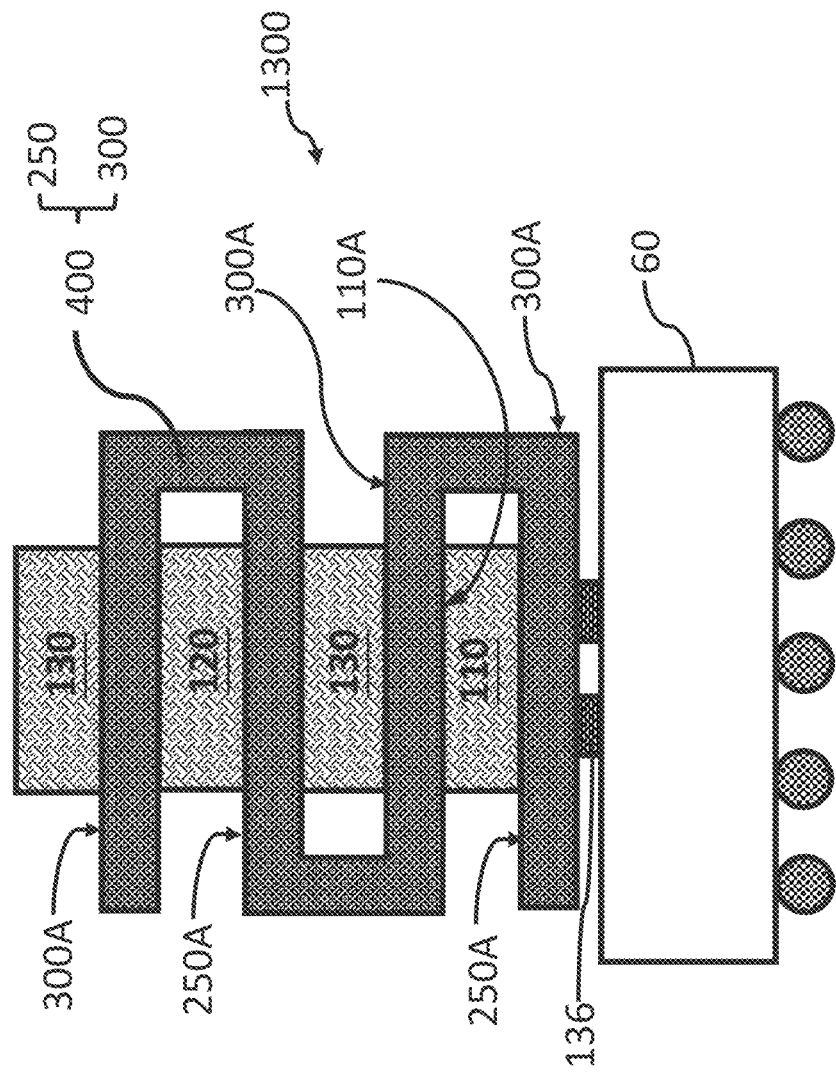

Please refer to FIGS. 5A~5B and 5B'. FIGS. 5A~5B are cross-sectional views showing processes for manufacturing a 3D package configuration 1800 according to Embodiment 5 of this present invention. FIG. 5B' is a cross-sectional view of another 3D package configuration 1800' according to Embodiment 5 of this invention.

This present Embodiment 5 discloses a 3D package configuration 1800 as shown in FIG. 5B, comprising a lead frame 60 and a folded flexible circuit board structure 1300 vertically stacked on the lead frame 60 and electrically connected therewith. The folded flexible circuit board structure 1300 comprises a flexible circuit board 400 as shown in FIG. 5A comprising a first flexible circuit board 250, a second flexible circuit board 300, a first semiconductor die 110 and at least one second semiconductor die 120 bonded to the first flexible circuit board 250, and at least one third semiconductor die 130 bonded to the second flexible circuit board 300. As shown in FIG. 5A, the first flexible circuit board 250 comprises a first insulating substrate 225, a first circuit 245 formed on a surface of the first flexible insulating substrate 225 and a first insulating layer 265 overlaying the first circuit 245, wherein the first flexible circuit board 250 has a first surface 250A with a first die bonding zone and a second die bonding zone formed thereon and a second surface 250B opposite to the first surface 250A, and the first die bonding zone has a plurality of first die bonding pads 131 electrically connected to the first circuit 245, and the second die bonding zone has a plurality of second die bonding pads 132 electrically connected to the first circuit 245, and the second surface 250B corresponding to the first die bonding zone and the second die bonding zone further comprises a plurality of first bonding pads 133 electrically connected to the first circuit 245 through first conductive holes 141 and second bonding pads 134 electrically connected to the first circuit 245 through second conductive holes 142. The first semiconductor die 110 is bonded to the first die bonding zone and electrically connected to the first circuit 245 through the first die bonding pads 131. The at least one second semiconductor die 120 is bonded to the second die bonding zone and electrically connected to the first circuit 245 through the second die bonding pads 132. As shown in FIG. 5A, the second flexible circuit board 300 comprises a second insulating substrate 320, a second circuit 240 formed on a surface of the second flexible insulating substrate 320 and a second insulating layer 360 overlaying the second circuit 240, wherein the second flexible circuit board 300 has a third surface 300A with at least one third die bonding zone and a fourth surface 300B opposite to the third surface 300A, and the third die bonding zone has a plurality of third die bonding pads 334 electrically connected to the second circuit 240 through the third conductive holes 143 formed in the second flexible circuit board 300. The at least one die bonding zone, the first die bonding zone and the at least one die bonding zone were alternatively arranged. The at least one third semiconductor die 130 is bonded to the at least one die bonding zone and electrically connected to the second circuit 240 through the third die bonding pads 332. Besides, the first flexible circuit board 250 is bonded to the fourth surface 300B by the second surface 250B thereof through the first bonding pads 133 and the second bonding pads 134 formed on the second surface 250B and the third bonding pads 334 formed on the fourth surface 300B. The at least one third semiconductor die 130 and the at least one second semiconductor die 120 were alternatively stacked above the first semiconductor die 110 to make the first die bonding zone, the second die bonding zone and the third die bonding zone overlap with each other and form a folded flexible circuit board structure 1300 by folding the flexible circuit board 400 including the first flexible circuit board 250 and the second flexible circuit board 300. The folded flexible circuit board structure 1300 was vertically stacked on the lead frame 60 through the lead frame bonding pads 136 formed on the third surface 300A corresponding to the first die bonding zone and electrically connected therewith.

The flexible circuit board 400 according to Embodiment 5 of this invention comprises one first semiconductor die 110 bonded to the first die bonding zone. However, the flexible circuit board 400 according to other embodiments of this invention can alternatively comprise more than one first semiconductor dies 110 bonded to the first die bonding zone if necessary.

As shown in FIG. 5A, the first bonding pads 133 and the second bonding pads 134 of this present Embodiment 5 were respectively electrically connected to the second circuit 240 through the fourth conductive holes 144 and the fifth conductive holes 145 formed in the second flexible substrate 320, and the third bonding pads 334 were electrically connected to the first circuit 245 through the sixth conductive holes 146 formed in the first flexible substrate 225.

As shown in FIGS. 5A~5B, the folded flexible circuit board structure 1300 as shown in FIG. 5B was obtained by folding the flexible circuit board 400 shown in FIG. 5A to make the second semiconductor die 120 and the third semiconductor dies 130 be vertically and alternatively stacked above the first semiconductor die 110 and make the first die bonding zone overlap with the second die bonding zone and the third die bonding zone. The obtained folded flexible circuit board structure 1300 was vertically stacked on the lead frame 60 and electrically connected therewith by the lead frame bonding pads 136, and then placed into a jig for subsequent package treatment to generate a 3D package configuration 1800 as shown in FIG. 5B.

The first semiconductor die 110, the second semiconductor die 120 and the third semiconductor die 130 of the 3D package configuration 1800 can respectively be for example but not limited to a CPU die, a GPU die, a DSP die, a MPU die, a MCU die, a DRAM die, a SRAM die, a Standard Logic IC die, an ASIC die for a special application, a sensing die with a specific sensing function, or a driving IC die.

The first die bonding pads 131, the second die bonding pads 132, the third die bonding pads 332, the first bonding pads 133, the second bonding pads 134, the third bonding pads 334 and the lead frame bonding pads 136 of the 3D package configuration 1800 are for example but not limited to solder balls or metallic bumps formed by a material selected from one of the group consisting of tin, tin alloys including tin/copper alloy, tin/ITO alloy, tin/silver alloy, tin/bismuth alloy and tin/lead alloy, and conductive polymers.

The material for the first flexible insulating substrate 225 and the second flexible insulating substrate 320 of the 3D package configuration 1800 is selected from for example but not limited to one of the group consisting of Polyester resin, Polyimide (PI), Modified Polyimide (MPI), Covalent Organic Framework (COF), Liquid Photo-Imageable (LPI), Liquid Crystal Polymer (LCP), Polytetrafluoroethylene (PTFE) and flexible epoxy bonded fiber-glass board, or combinations thereof.

The material for the first circuit 245 and the second circuit 240 of the 3D package configuration 1800 is selected from for example but not limited to one of the group consisting of copper, copper alloy, tinned copper, tin alloy, aluminum, aluminum alloys, gold and silver, or combinations thereof.

The above-mentioned 3D package configuration 1800, wherein the first circuit 245 of the first flexible circuit board 250 and the second circuit 240 of the second flexible circuit board 300 can be a single-layered circuit or a multiple-layered circuit, and the first insulating layer 265 overlaying the first circuit 245 and the second insulating layer 360 overlaying the second circuit 240 can also be a single-layered insulating layer or a multiple-layered insulating layer.

According to another embodiment of this invention, additional adhesive layers can be coated on the first surface 250A and the second surface 250B of the first flexible circuit board 250, and/or the third surface 300A and the fourth surface 300B of the second flexible circuit board 300 to fasten the folded flexible circuit board structure 1300 vertically stacked on the lead frame 60.

Furthermore, as shown in FIG. 5B', when the first semiconductor die 110' was a high power consuming semiconductor die, for example but not limited to a CPU die, a heat dissipating mechanism 75 was introduced and sandwich between the top surface 110A of the high power consuming semiconductor die 110' and the folded flexible circuit board 400 attached on the top surface 110A of the high power consuming semiconductor die 110' to generate another 3D package configuration 1800' according to this embodiment 5 of this invention.

Embodiment 6

Figure 6A:
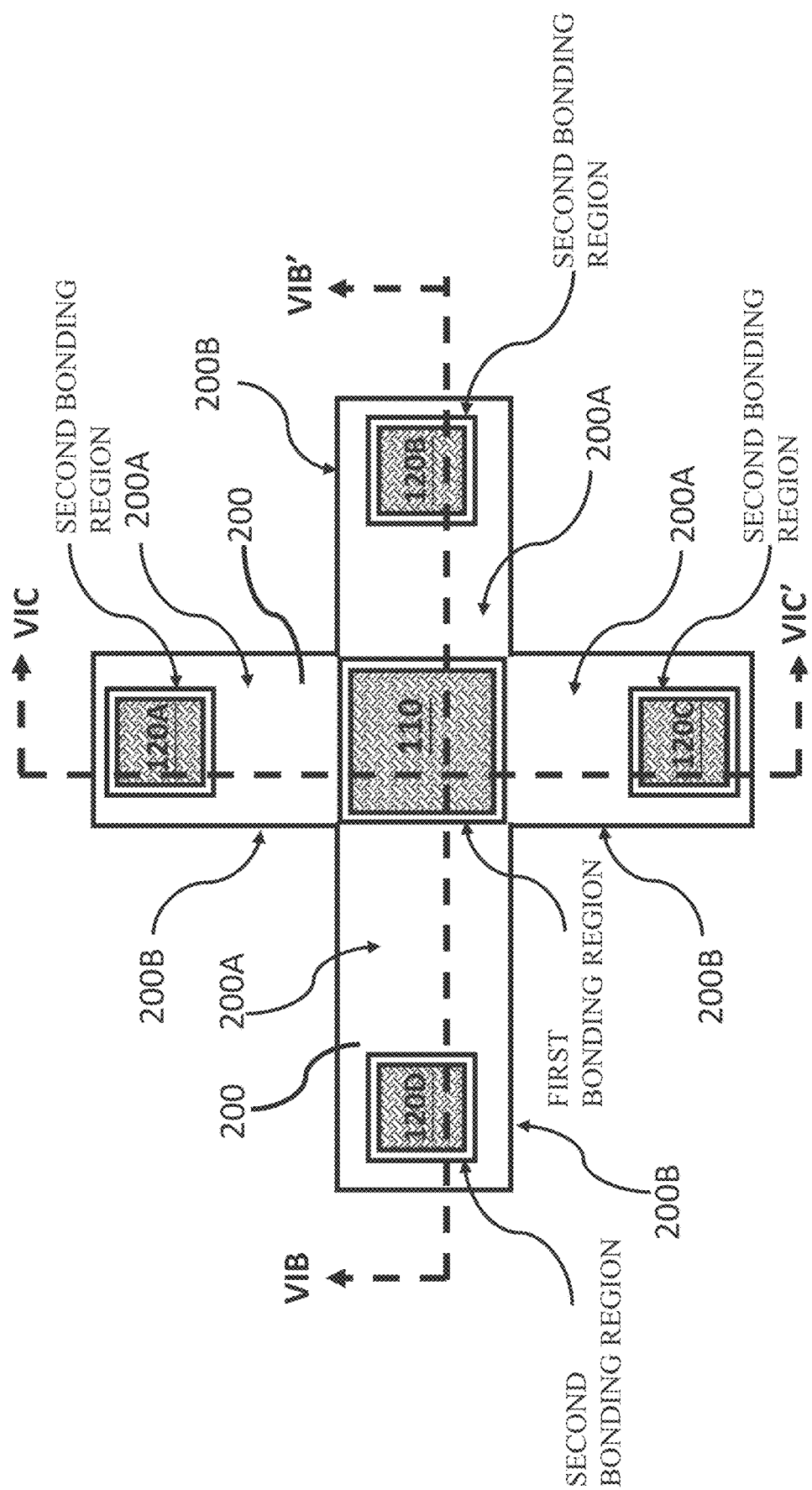
FIG. 6A is a top view of a flexible circuit board according to Embodiment 6 of this invention.
Figure 6B:
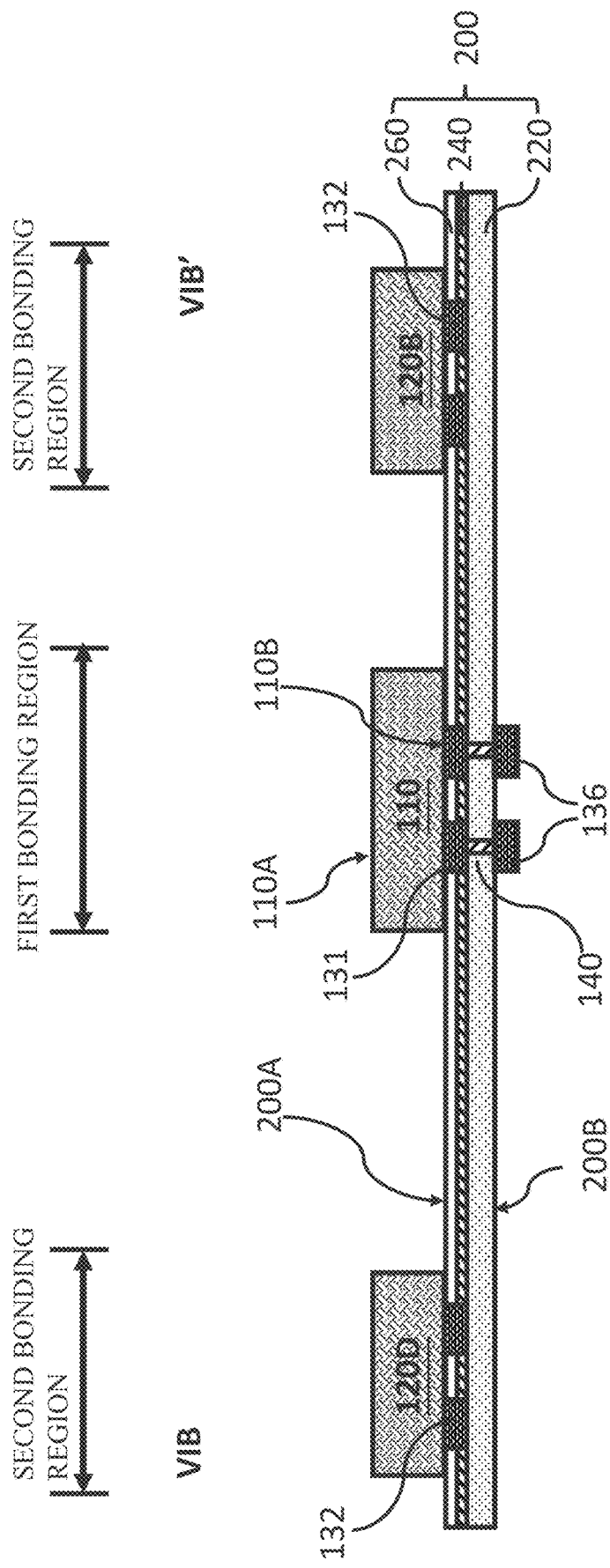
FIG. 6B is a cross-sectional view along with the cross-sectional line VIB-VIB' shown in FIG. 6A.
Figure 6C:
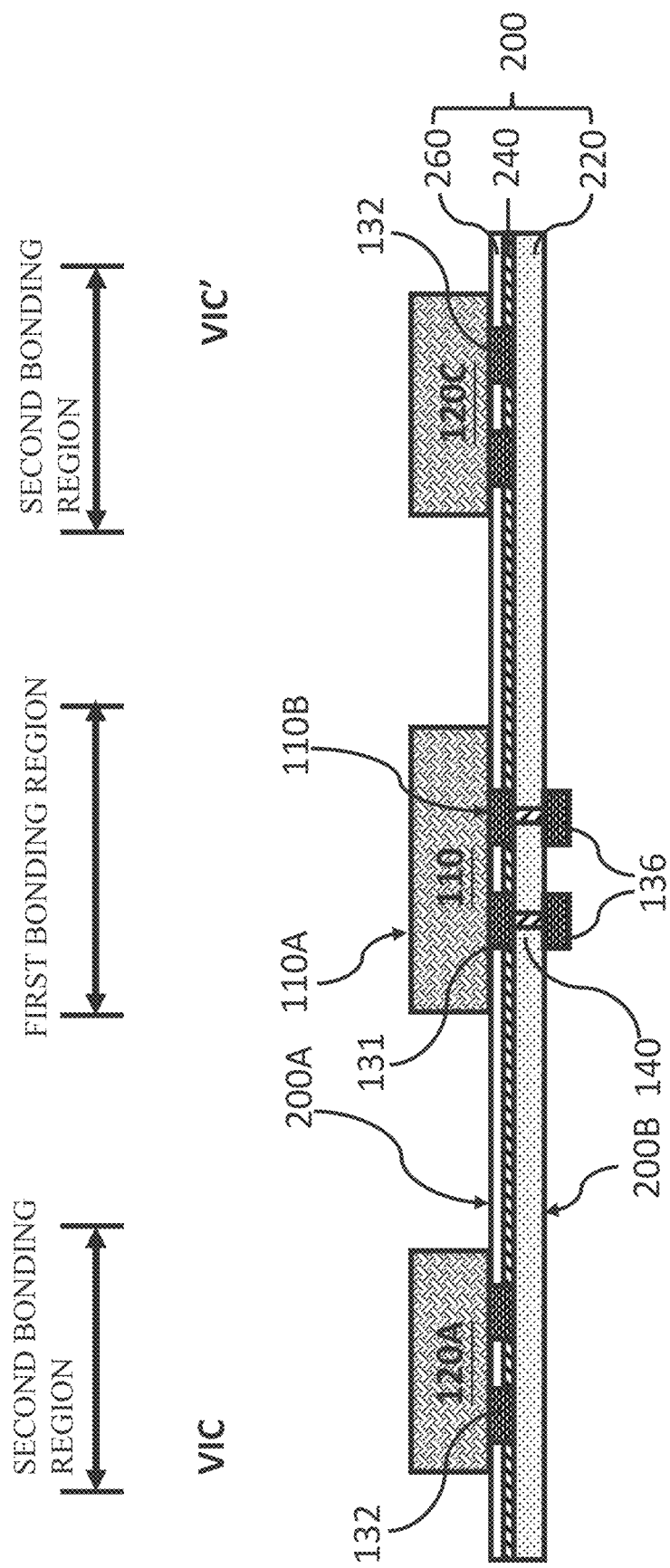
FIG. 6C is a cross-sectional view along with the cross-sectional line VIC-VIC' shown in FIG. 6A.
Figure 6D:
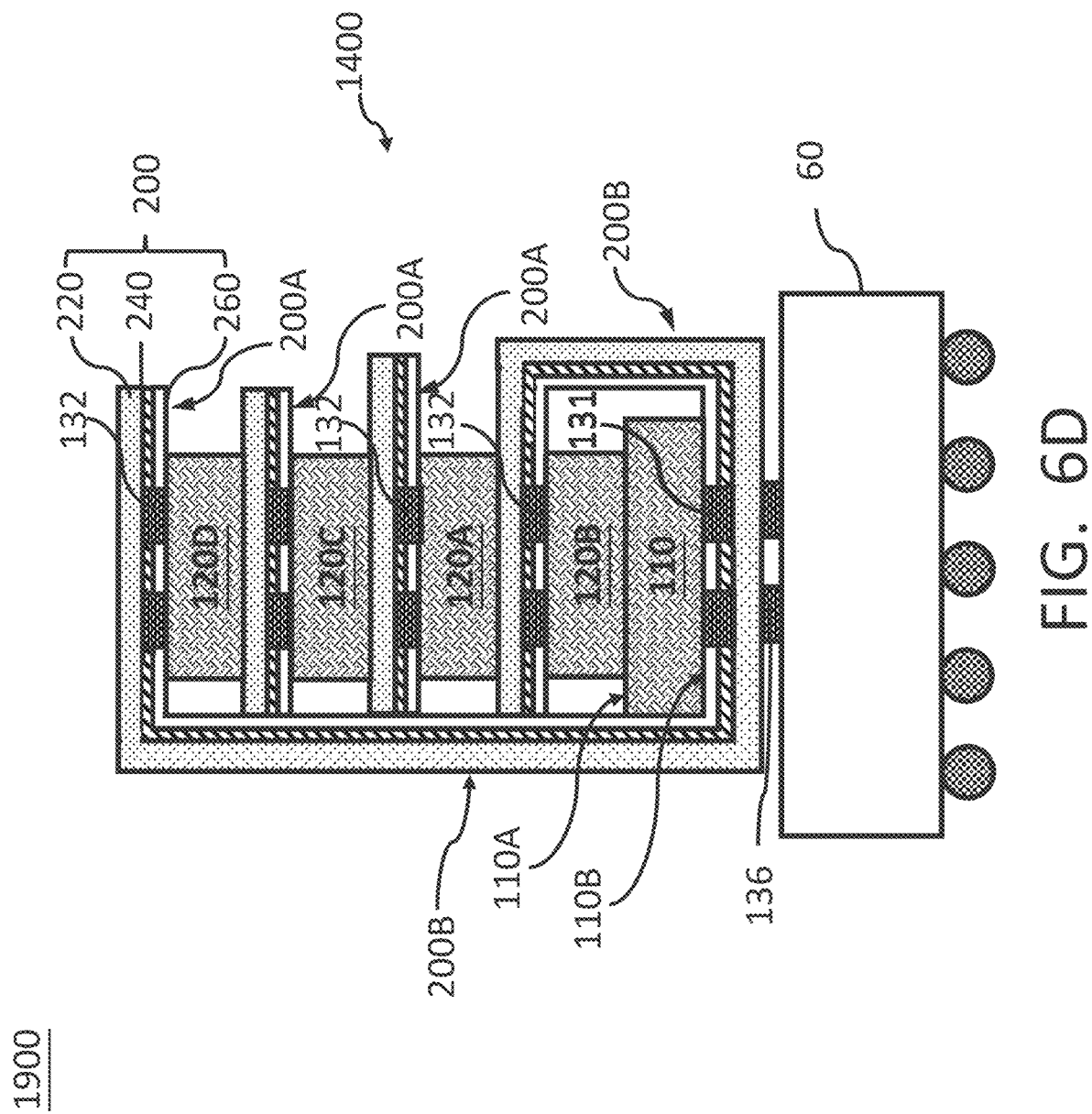
FIG. 6D is a cross-sectional view of a 3D package configuration 1900 according to Embodiment 6 of this present invention.

Please refer to FIGS. 6A~6C, and FIGS. 6D, 6D' and 6D". FIG. 6A is a top view of a flexible circuit board according to Embodiment 6 of this invention. FIG. 6B is a cross-sectional view along with the cross-sectional line VIB-VIB' shown in FIG. 6A. FIG. 6C is a cross-sectional view along with the cross-sectional line VIC-VIC' shown in FIG. 6A. FIG. 6D is a cross-sectional view of a 3D package configuration 1900 according to Embodiment 6 of this present invention. FIG. 6D' is a cross-sectional view of another 3D package configuration 1900' according to Embodiment 6 of this invention. FIG. 6D" is a cross-sectional view of another 3D package configuration 1900" according to Embodiment 6 of this invention.

This present Embodiment 6 discloses a 3D package configuration 1900 as shown in FIG. 6D, comprising a lead frame 60 and a folded flexible circuit board structure 1400 vertically stacked on the lead frame 60 and electrically connected therewith. The folded flexible circuit board structure 1400 comprises: a cross-shaped flexible circuit board 200 as shown in FIG. 6A comprising a flexible insulating substrate 220, a circuit 240 formed on a surface of the flexible insulating substrate 220 and an insulating layer 260 overlaying the circuit 240, wherein the flexible circuit board 200 has a first surface 200A and a second surface 200B opposite to each other, wherein the first surface 200A includes a first die bonding zone and a plurality of second die bonding zones formed thereon, and the first die bonding zone includes a plurality of first die bonding pads 131 electrically connected to the circuit 240, and each of the second die bonding zones includes a plurality of second die bonding pads 132 electrically connected to the circuit 240, and the second surface 200B under the first die bonding zone further comprises a plurality of lead frame bonding pads 136, wherein each of the lead frame bonding pads 136 corresponding to each of the first die bonding pads 131 and electrically to each other through a first conductive hole 140; a first semiconductor die 110 bonded to the first die bonding zone and electrically connected to the circuit 240 through the first die bonding pads 131; and a plurality of second semiconductor dies including 120A, 120B, 120C and 120D respectively bonded to each of the second die bonding zones and electrically connected to the circuit 240 through the second die bonding pads 132 therein.

The flexible circuit boards 200 of this present Embodiment 6 comprises a first semiconductor die 110 bonded to the first die bonding zone, and a plurality of second semiconductor dies including 120A, 120B, 120C and 120D respectively bonded to each of the second die bonding zones. However, the flexible circuit board 200 according to other embodiments of this invention can alternatively comprise more than one first semiconductor dies 110 bonded to the first die bonding zone, and more than one second semiconductor dies 120A, 120B, 120C and 120D bonded to each of the second die bonding zones, if necessary.

As shown in FIGS. 6A~6C and 6D, the folded flexible circuit board structure 1400 as shown in FIG. 6D was obtained by folding the cross-shaped flexible circuit board 200 shown in FIGS. 6A~6C in sequence to make the cross-shaped flexible circuit board 200 with the second semiconductor die 120B be bonded thereon be folded above the first semiconductor die 110, and then the cross-shaped flexible circuit board 200 with the second semiconductor die 120A be bonded thereon be folded above the second semiconductor die 120B, and then the cross-shaped flexible circuit board 200 with the second semiconductor die 120C be bonded thereon be folded above the second semiconductor die 120A, and then the cross-shaped flexible circuit board 200 with the second semiconductor die 120D be bonded thereon be folded above the second semiconductor die 120C, wherein the second semiconductor dies 120B, 120A, 120C and 120D were vertically stacked above the first semiconductor die 110 in sequence. The folded flexible circuit board structure 1400 was vertically stacked on the lead frame 60 through the lead frame bonding pads 136 and electrically connected therewith, and then placed into a jig for subsequent package treatment to generate a 3D package configuration 1900 as shown in FIG. 6D.

Alternatively, as shown in FIGS. 6A~6C and 6D', according to another embodiment of this Embodiment 6, another folded flexible circuit board structure 1400' as shown in FIG. 6D' was obtained by folding the cross-shaped flexible circuit board 200 shown in FIGS. 6A~6C in sequence to make the cross-shaped flexible circuit board 200 with the second semiconductor die 120A be bonded thereon be folded above the first semiconductor die 110, and then the cross-shaped flexible circuit board 200 with the second semiconductor die 120B be bonded thereon be folded above the second semiconductor die 120A, and then the cross-shaped flexible circuit board 200 with the second semiconductor die 120C be bonded thereon be folded above the second semiconductor die 120B, and then the cross-shaped flexible circuit board 200 with the second semiconductor die 120D be bonded thereon be folded above the second semiconductor die 120C, wherein the second semiconductor dies 120A, 120B, 120C and 120D were vertically stacked above the first semiconductor die 110 in sequence. The folded flexible circuit board structure 1400' was vertically stacked on the lead frame 60 through the lead frame bonding pads 136 and electrically connected therewith, and then placed into a jig for subsequent package treatment to generate a 3D package configuration 1900' as shown in FIG. 6D'.

Alternatively, as shown in FIGS. 6A~6C and 6D", according to another embodiment of this Embodiment 6, another folded flexible circuit board structure 1400" as shown in FIG. 6D" was obtained by folding the cross-shaped flexible circuit board 200 shown in FIGS. 6A~6C in sequence to make the cross-shaped flexible circuit board 200 with the second semiconductor die 120A be bonded thereon be folded above the first semiconductor die 110, and then the cross-shaped flexible circuit board 200 with the second semiconductor die 120C be bonded thereon be folded above the second semiconductor die 120A, and then the cross-shaped flexible circuit board 200 with the second semiconductor die 120B be bonded thereon be folded above the second semiconductor die 120C, and then the cross-shaped flexible circuit board 200 with the second semiconductor die 120D be bonded thereon be folded above the second semiconductor die 120B, wherein the second semiconductor dies 120A, 120C, 120B and 120D were vertically stacked above the first semiconductor die 110 in sequence. The folded flexible circuit board structure 1400" was vertically stacked on the lead frame 60 through the lead frame bonding pads 136 and electrically connected therewith, and then placed into a jig for subsequent package treatment to generate a 3D package configuration 1900" as shown in FIG. 6D".

The first semiconductor die 110 and the second semiconductor dies 120A, 120B, 120C and 120D of the 3D package configurations 1900, 1900' and 1900" can respectively be for example but not limited to a CPU die, a GPU die, a DSP die, a MPU die, a MCU die, a DRAM die, a SRAM die, a Standard Logic IC die, an ASIC die for a special application, a sensing die with a specific sensing function, or a driving IC die.

The first die bonding pads 131, the second die bonding pads 132 and the lead frame bonding pads 136 of the 3D package configurations 1900, 1900' and 1900" are respectively for example but not limited to solder balls or metallic bumps formed by a material selected from one of the group consisting of tin, tin alloys including tin/copper alloy, tin/ITO alloy, tin/silver alloy, tin/bismuth alloy and tin/lead alloy, and conductive polymers.

The material for the flexible insulating substrate 220 of the 3D package configurations 1900, 1900' and 1900" can be selected from for example but not limited to one of the group consisting of Polyester resin, Polyimide (PI), Modified Polyimide (MPI), Covalent Organic Framework (COF), Liquid Photo-Imageable (LPI), Liquid Crystal Polymer (LCP), Polytetrafluoroethylene (PTFE) and flexible epoxy bonded fiber-glass board, or combinations thereof.

The material for the circuit 240 of the 3D package configurations 1900, 1900' and 1900" is selected from for example but not limited to one of the group consisting of copper, copper alloy, tinned copper, tin alloy, aluminum, aluminum alloys, gold and silver, or combinations thereof.

The above-mentioned 3D package configurations 1900, 1900' and 1900", wherein the circuit 240 of the flexible circuit board 200 can be a single-layered circuit or a multiple-layered circuit, and the insulating layer 260 overlaying the circuit 240 can also be a single-layered insulating layer or a multiple-layered insulating layer.

According to another embodiment of this invention, additional adhesive layers can be coated on the first surface 200A or the second surface 200B of the flexible circuit board 200 of the 3D package configurations 1900, 1900' and 1900" to fasten the folded flexible circuit board structures 1400, 1400' and 1400" vertically stacked on the lead frame 60.

Embodiment 7

Figures 2, 7A:
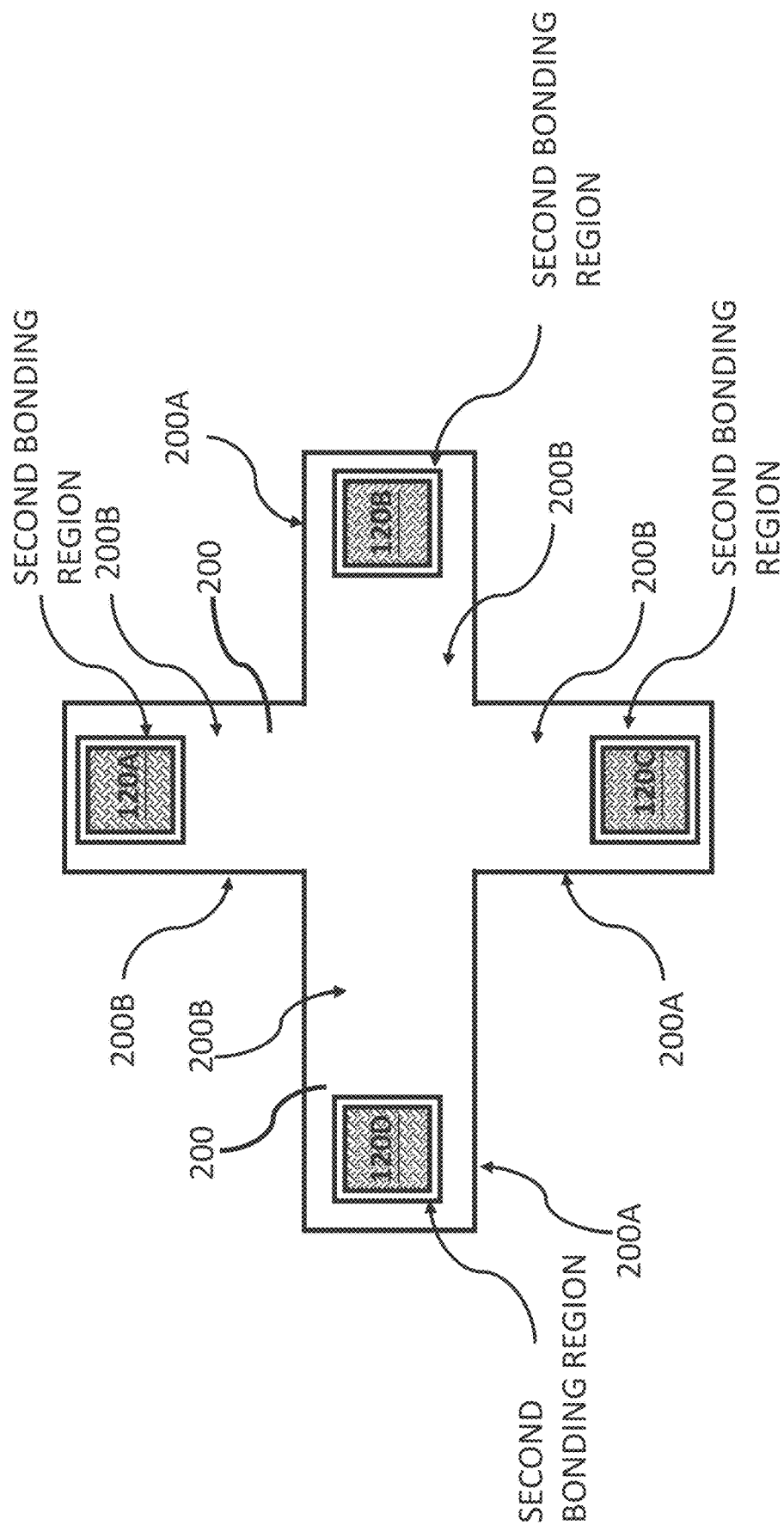
Figure 7B:
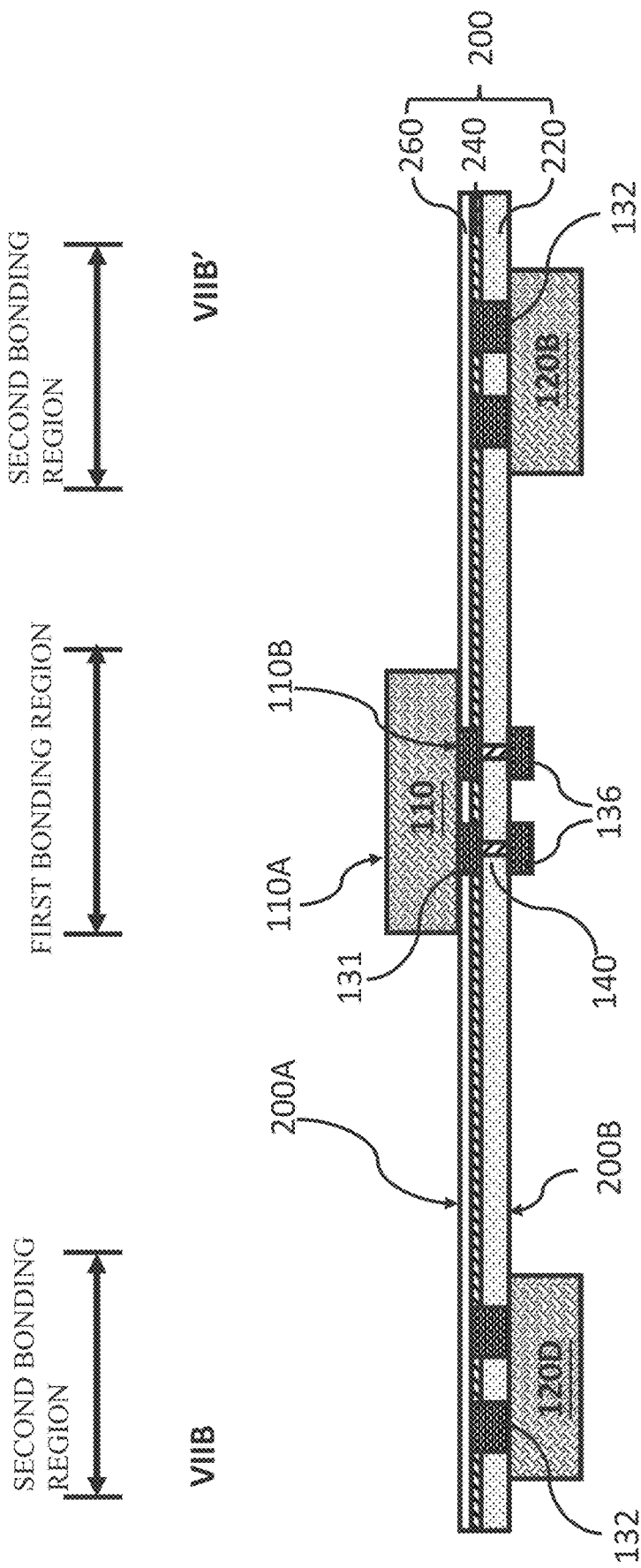
FIG. 7B is a cross-sectional view along with the cross-sectional line VIIB-VIIB' shown in FIG. 7A-1.
Figure 7C:
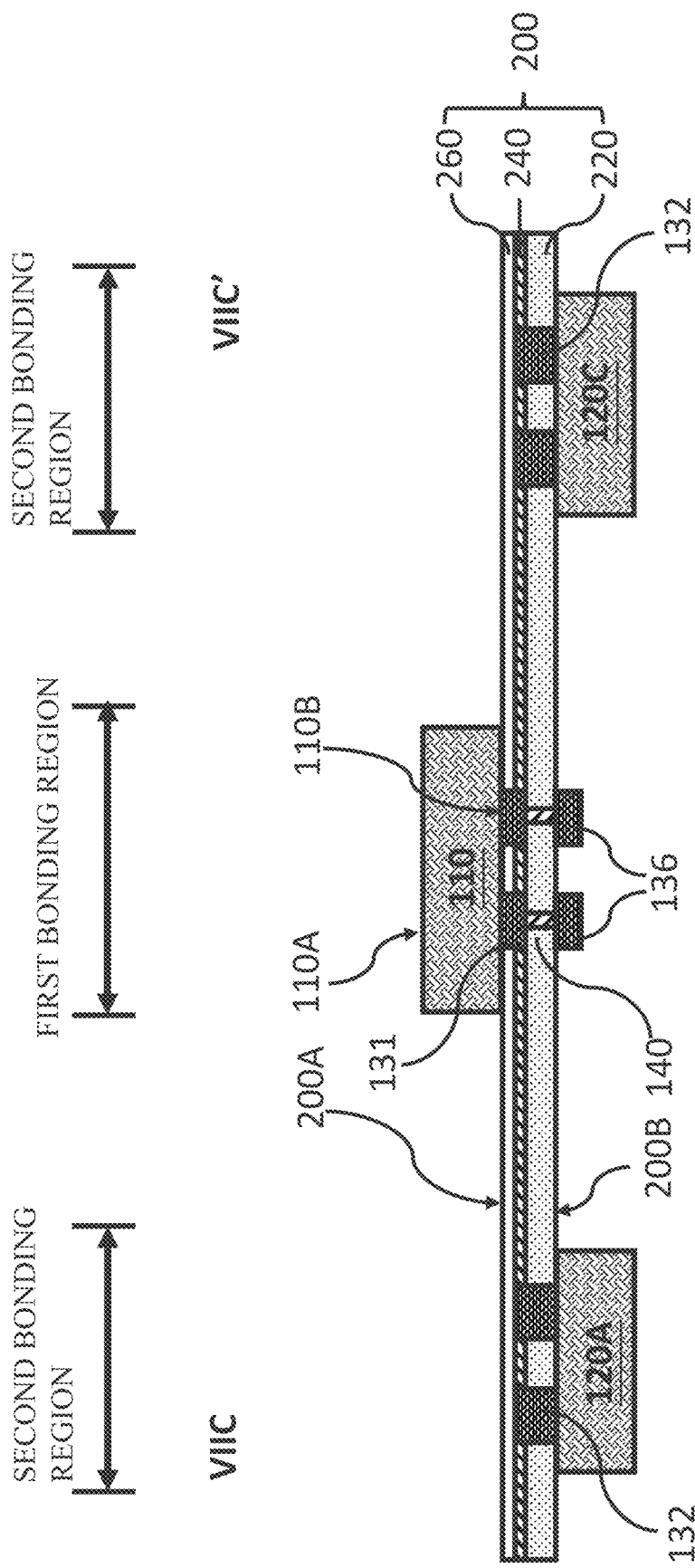
FIG. 7C is a cross-sectional view along with the cross-sectional line VIIC-VIIC' shown in FIG. 7A-1.
Figure 7D:
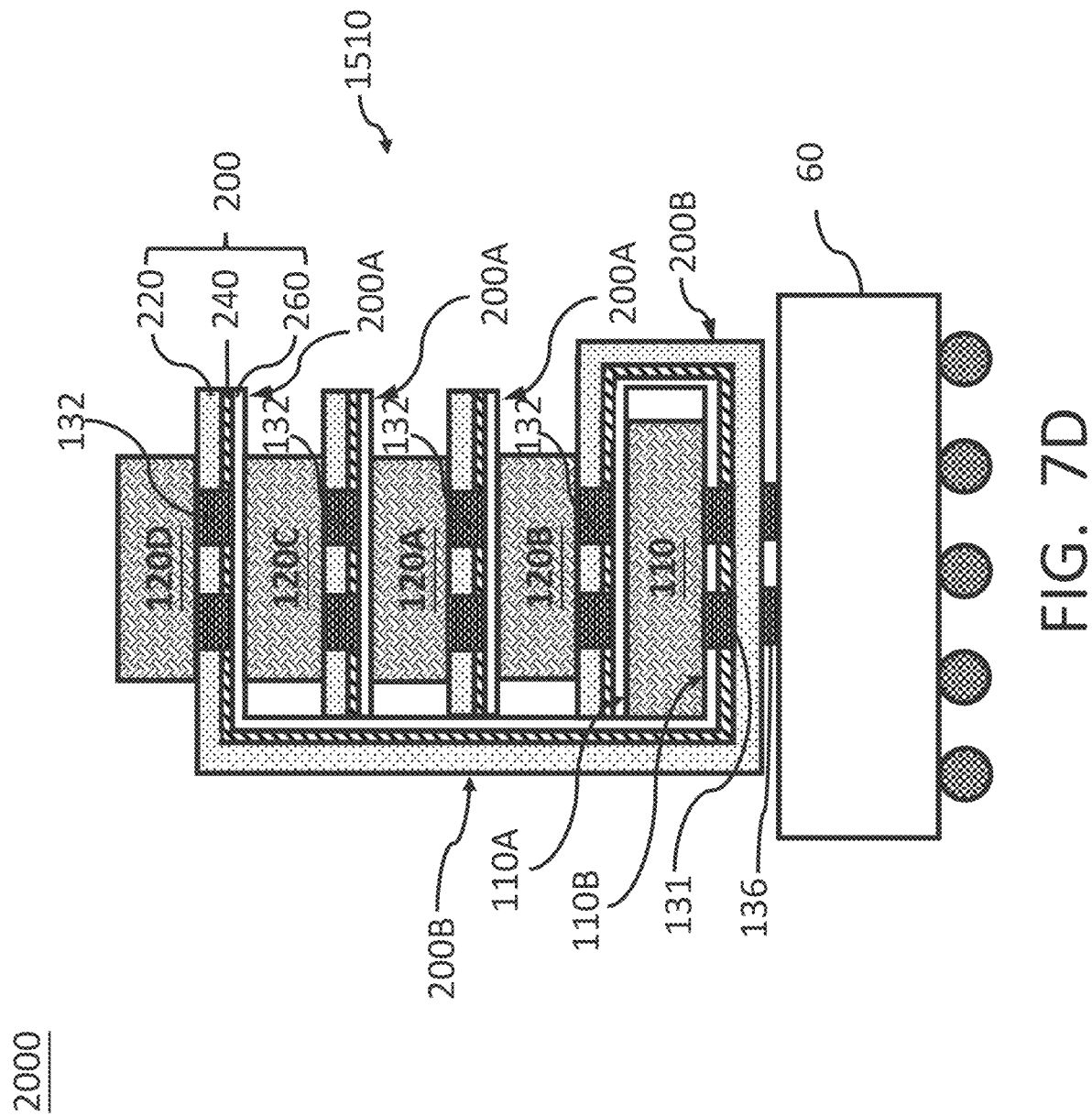
FIG. 7D is a cross-sectional view of a 3D package configuration 2000 according to Embodiment 7 of this present invention.

Please refer to FIGS. 7A-1, 7A-2, 7B-7C, and FIGS. 7D, 7D', 7D". FIG. 7A-1 is a top view of a flexible circuit board according to Embodiment 7 of this invention. FIG. 7A-2 is a bottom view of a flexible circuit board according to Embodiment 7 of this invention. FIG. 7B is a cross-sectional view along with the cross-sectional line VIIB-VIIB' shown in FIG. 7A-1. FIG. 7C is a cross-sectional view along with the cross-sectional line VIIC-VIIC' shown in FIG. 7A-1. FIG. 7D is a cross-sectional view of a 3D package configuration 2000 according to Embodiment 7 of this present invention. FIG. 7D' is a cross-sectional view of another 3D package configuration 2000' according to Embodiment 7 of this invention. FIG. 7D" is a cross-sectional view of another 3D package configuration 2000' according to Embodiment 7 of this invention.

This present Embodiment 7 discloses a 3D configuration 2000 as shown in FIG. 7D, comprising a lead frame 60; and a folded flexible circuit board structure 1510 vertically stacked on the lead frame 60 and electrically connected therewith. The folded flexible circuit board structure 1510 comprises a cross-shaped flexible circuit board 200 as shown in FIG. 7A comprising a flexible insulating substrate 220, a circuit 240 formed on a surface of the flexible insulating substrate 220 and an insulating layer 260 overlaying the circuit 240, wherein the flexible circuit board 200 has a first surface 200A with a first die bonding zone formed thereon and a second surface 200B with a plurality of second die bonding zones formed thereon and opposite to the first surface 200A, and the first die bonding zone includes a plurality of first die bonding pads 131 electrically connected to the circuit 240, and each of the second die bonding zones includes a plurality of second die bonding pads 132 electrically connected to the circuit 240, and the second surface 200B under the first die bonding zone further comprises a plurality of lead frame bonding pads 136, wherein each of the lead frame bonding pads 136 corresponding to each of the first die bonding pads 131 and electrically to each other through a first conductive hole 140; a first semiconductor die 110 bonded to the first die bonding zone and electrically connected to the circuit 240 through the first die bonding pads 131; and a plurality of second semiconductor dies including 120A, 120B, 120C and 120D respectively bonded to each of the second die bonding zones and electrically connected to the circuit 240 through the second die bonding pads 132 therein.

The flexible circuit boards 200 of this present Embodiment 7 comprises a first semiconductor die 110 bonded to the first die bonding zone, and a plurality of second semiconductor dies including 120A, 120B, 120C and 120D respectively bonded to each of the second die bonding zones. However, the flexible circuit board 200 according to other embodiments of this invention can alternatively comprise more than one first semiconductor dies 110 bonded to the first die bonding zone, and more than one second semiconductor dies 120A, 120B, 120C and 120D bonded to each of the second die bonding zones, if necessary.

As shown in FIGS. 7A-1, 7A-2, 7B~7C and 7D, the folded flexible circuit board structure 1510 as shown in FIG. 7D was obtained by folding the cross-shaped flexible circuit board 200 shown in FIGS. 7A-1, 7A-2 and 7B~7C in sequence to make the cross-shaped flexible circuit board 200 with the second semiconductor die 120B be bonded thereon be folded above the first semiconductor die 110, and then the cross-shaped flexible circuit board 200 with the second semiconductor die 120A be bonded thereon be folded above the second semiconductor die 120B, and then the cross-shaped flexible circuit board 200 with the second semiconductor die 120C be bonded thereon be folded above the second semiconductor die 120A, and then the cross-shaped flexible circuit board 200 with the second semiconductor die 120D be bonded thereon be folded above the second semiconductor die 120C, wherein the second semiconductor dies 120B, 120A, 120C and 120D were vertically stacked above the first semiconductor die 110 in sequence. The folded flexible circuit board structure 1510 was vertically stacked on the lead frame 60 through the lead frame bonding pads 136 and electrically connected therewith, and then placed into a jig for subsequent package treatment to generate a 3D package configuration 2000 as shown in FIG. 7D.

Alternatively, as shown in FIGS. 7A-1, 7A-2, 7B~7C and 7D', according to another embodiment of this Embodiment 7, another folded flexible circuit board structure 1510' as shown in FIG. 7D' was obtained by folding the cross-shaped flexible circuit board 200 shown in FIGS. 7A-1, 7A-2 and 7B~7C in sequence to make the cross-shaped flexible circuit board 200 with the second semiconductor die 120A be bonded thereon be folded above the first semiconductor die 110, and then the cross-shaped flexible circuit board 200 with the second semiconductor die 120B be bonded thereon be folded above the second semiconductor die 120A, and then the cross-shaped flexible circuit board 200 with the second semiconductor die 120C be bonded thereon be folded above the second semiconductor die 120B, and then the cross-shaped flexible circuit board 200 with the second semiconductor die 120D be bonded thereon be folded above the second semiconductor die 120C, wherein the second semiconductor dies 120A, 120B, 120C and 120D were vertically stacked above the first semiconductor die 110 in sequence. The folded flexible circuit board structure 1510' was vertically stacked on the lead frame 60 through the lead frame bonding pads 136 and electrically connected therewith, and then placed into a jig for subsequent package treatment to generate a 3D package configuration 2000' as shown in FIG. 7D'.

Alternatively, as shown in FIGS. 7A-1, 7A-2, 7B~7C and 7D", according to another embodiment of this Embodiment 7, another folded flexible circuit board structure 1510" as shown in FIG. 7D" was obtained by folding the cross-shaped flexible circuit board 200 shown in FIGS. 7A-1, 7A-2 and 7B~7C in sequence to make the cross-shaped flexible circuit board 200 with the second semiconductor die 120A be bonded thereon be folded above the first semiconductor die 110, and then the cross-shaped flexible circuit board 200 with the second semiconductor die 120C be bonded thereon be folded above the second semiconductor die 120A, and then the cross-shaped flexible circuit board 200 with the second semiconductor die 120B be bonded thereon be folded above the second semiconductor die 120C, and then the cross-shaped flexible circuit board 200 with the second semiconductor die 120D be bonded thereon be folded above the second semiconductor die 120B, wherein the second semiconductor dies 120A, 120C, 120B and 120D were vertically stacked above the first semiconductor die 110 in sequence. The folded flexible circuit board structure 1510" was vertically stacked on the lead frame 60 through the lead frame bonding pads 136 and electrically connected therewith, and then placed into a jig for subsequent package treatment to generate a 3D package configuration 2000" as shown in FIG. 7D".

The first semiconductor die 110 and the second semiconductor dies 120A, 120B, 120C and 120D of the 3D package configurations 2000, 2000' and 2000" can respectively be for example but not limited to a CPU die, a GPU die, a DSP die, a MPU die, a MCU die, a DRAM die, a SRAM die, a Standard Logic IC die, an ASIC die for a special application, a sensing die with a specific sensing function, or a driving IC die.

The first die bonding pads 131, the second die bonding pads 132 and the lead frame bonding pads 136 of the 3D package configurations 2000, 2000' and 2000" are respectively for example but not limited to solder balls or metallic bumps formed by a material selected from one of the group consisting of tin, tin alloys including tin/copper alloy, tin/ITO alloy, tin/silver alloy, tin/bismuth alloy and tin/lead alloy, and conductive polymers.

The material for the flexible insulating substrate 220 of the 3D package configurations 2000, 2000' and 2000" can be selected from for example but not limited to one of the group consisting of Polyester resin, Polyimide (PI), Modified Polyimide (MPI), Covalent Organic Framework (COF), Liquid Photo-Imageable (LPI), Liquid Crystal Polymer (LCP), Polytetrafluoroethylene (PTFE) and flexible epoxy bonded fiber-glass board, or combinations thereof.

The material for the circuit 240 of the 3D package configurations 2000, 2000' and 2000" is selected from for example but not limited to one of the group consisting of copper, copper alloy, tinned copper, tin alloy, aluminum, aluminum alloys, gold and silver, or combinations thereof.

The above-mentioned 3D package configurations 2000, 2000' and 2000", wherein the circuit 240 of the flexible circuit board 200 can be a single-layered circuit or a multiple-layered circuit, and the insulating layer 260 overlaying the circuit 240 can also be a single-layered insulating layer or a multiple-layered insulating layer.

According to another embodiment of this invention, additional adhesive layers can be coated on the first surface 200A or the second surface 200B of the flexible circuit board 200 of the 3D package configurations 2000, 2000' and 2000" to fasten the folded flexible circuit board structures 1510, 1510' and 1510" vertically stacked on the lead frame 60.

Embodiment 8

Figure 8A:
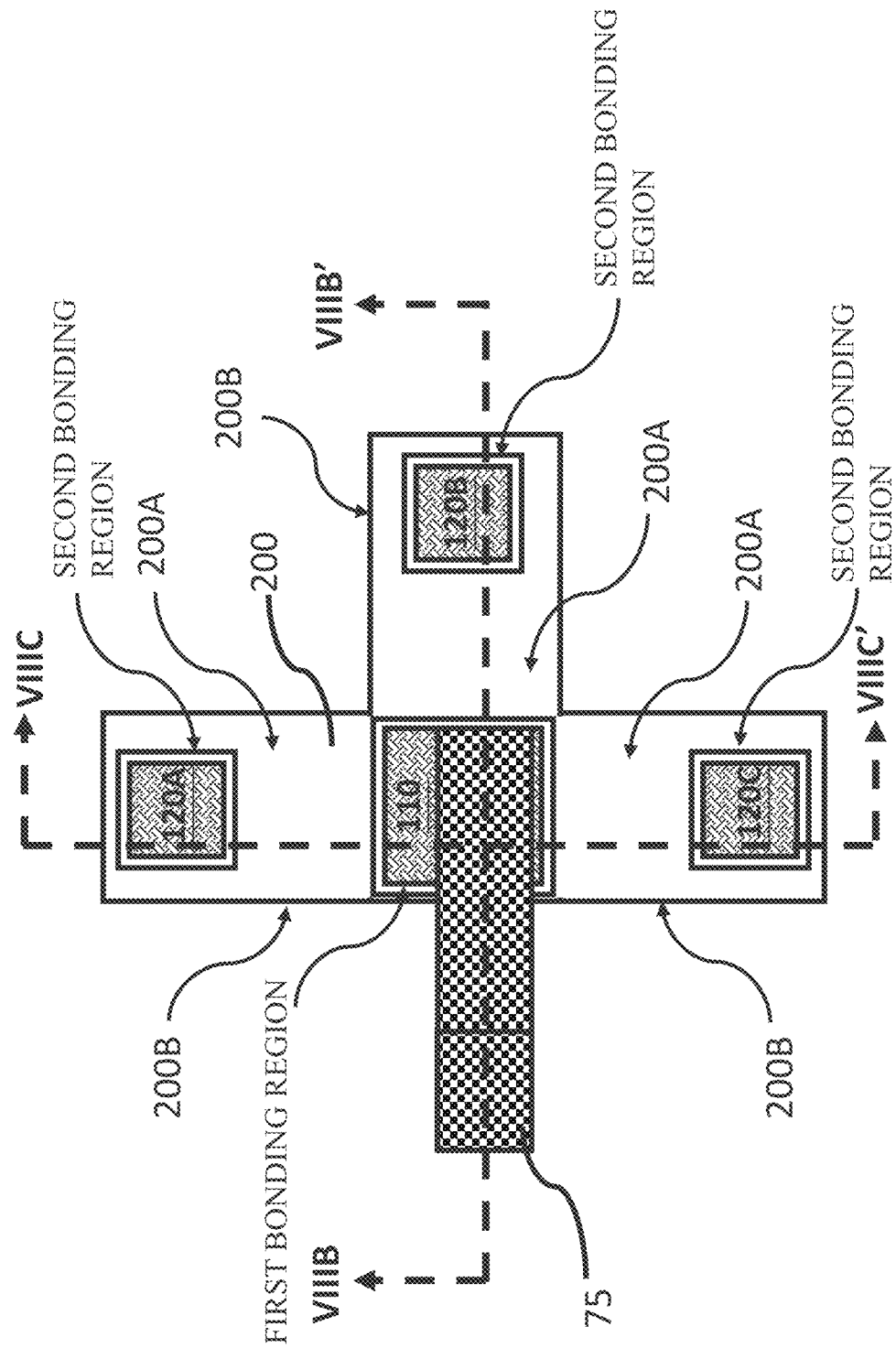
FIG. 8A is a top view of a flexible circuit board according to Embodiment 8 of this invention.
Figure 8B:
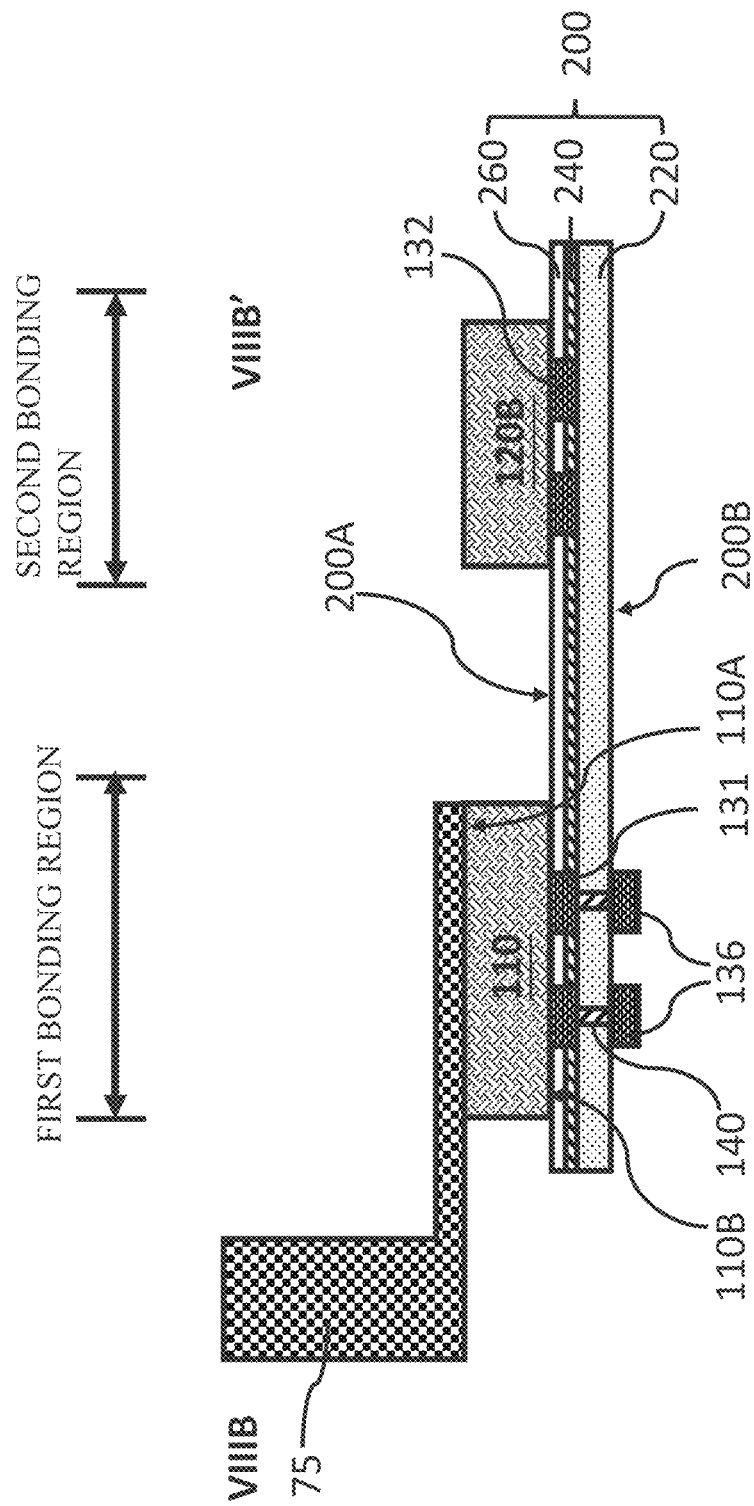
FIG. 8B is a cross-sectional view along with the cross-sectional line VIIIB-VIIIB' shown in FIG. 8A.
Figure 8C:
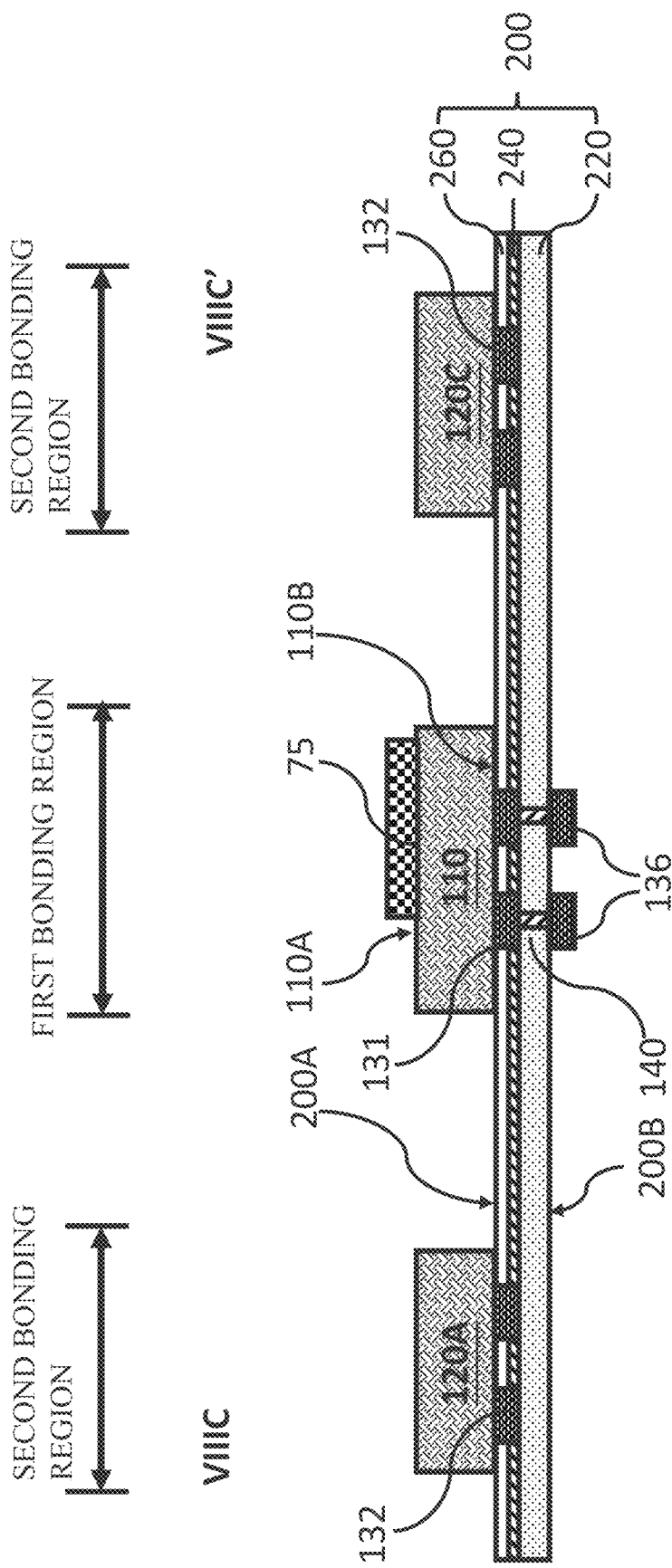
FIG. 8C is a cross-sectional view along with the cross-sectional line VIIIC-VIIIC' shown in FIG. 8A.
Figure 8D:
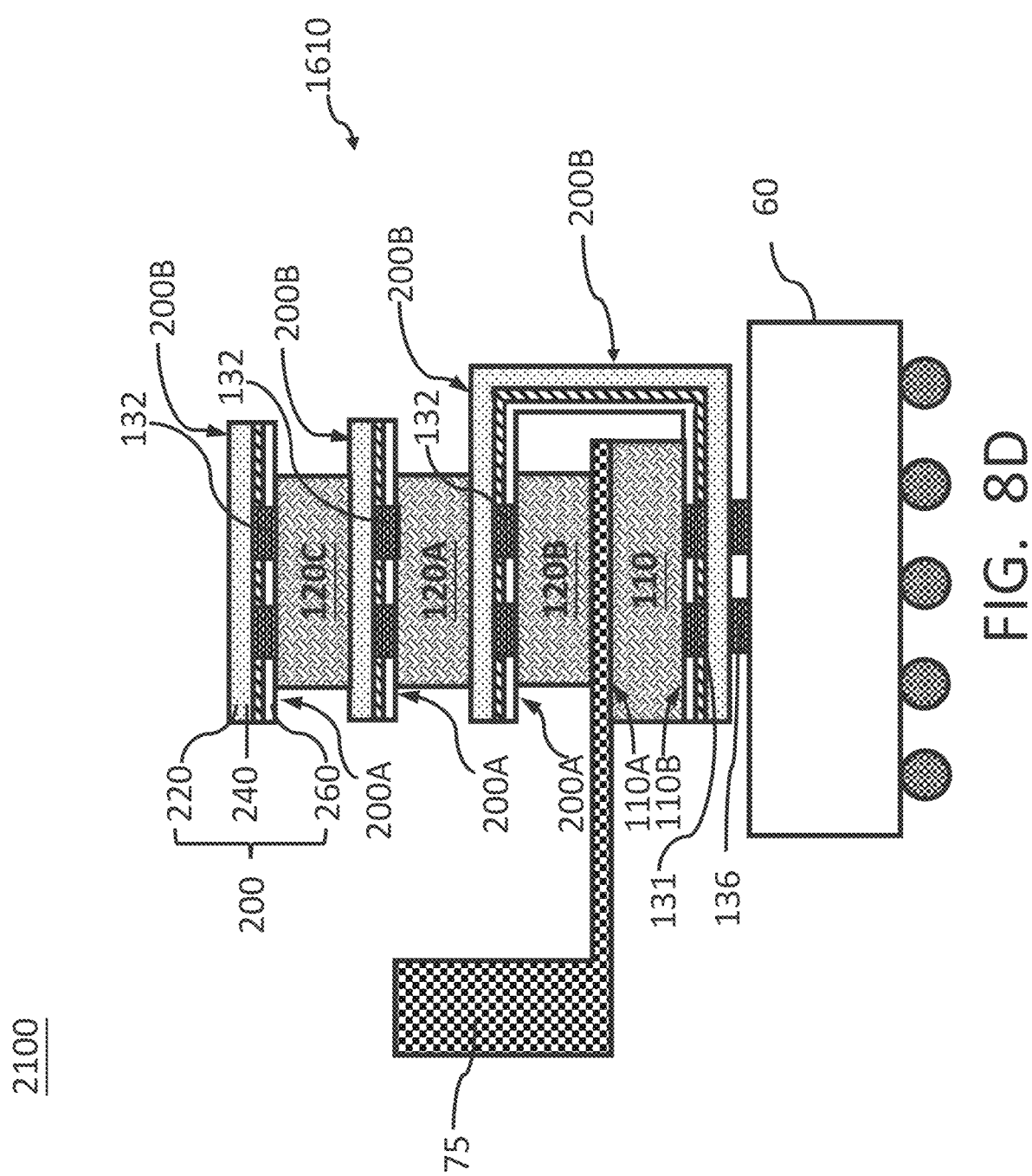
FIG. 8D is a cross-sectional view of a 3D package configuration 2100 according to Embodiment 8 of this present invention.
Figure 8D:
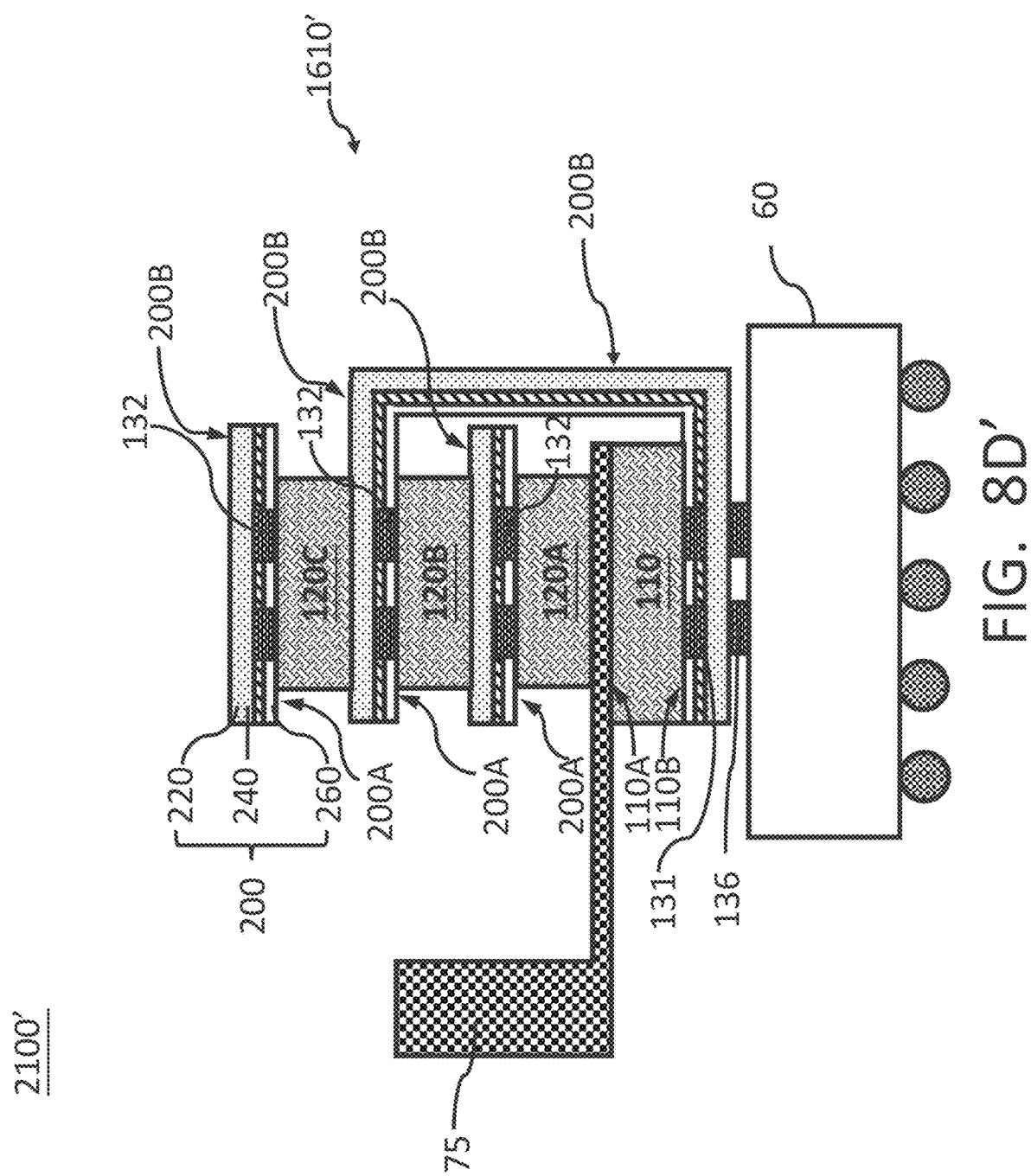

Please refer to FIGS. 8A~8C and FIGS. 8D, 8D', 8D". FIG. 8A is a top view of a flexible circuit board according to Embodiment 8 of this invention. FIG. 8B is a cross-sectional view along with the cross-sectional line VIIIB-VIIIB' shown in FIG. 8A. FIG. 8C is a cross-sectional view along with the cross-sectional line VIIIC-VIIIC' shown in FIG. 8A. FIG. 8D is a cross-sectional view of a 3D package configuration 2100 according to Embodiment 8 of this present invention. FIG. 8D' is a cross-sectional view of another 3D package configuration 2100' according to Embodiment 8 of this invention. FIG. 8D" is a cross-sectional view of another 3D package configuration 2100" according to Embodiment 8 of this invention.

This present Embodiment 8 discloses a 3D package configuration 2100 as shown in FIG. 8D, comprising a lead frame 60; a folded flexible circuit board structure 1610 vertically stacked on the lead frame 60 and electrically connected therewith; and a heat dissipating mechanism 75. The folded flexible circuit board structure 1610 comprises a cross-shaped flexible circuit board 200 as shown in FIG. 8A comprising a flexible insulating substrate 220, a circuit 240 formed on a surface of the flexible insulating substrate 220 and an insulating layer 260 overlaying the circuit 240, wherein the flexible circuit board 200 has a first surface 200A with a first die bonding zone and a plurality of second die bonding zones formed thereon and a second surface 200B opposite to the first surface 200A, and the first die bonding zone includes a plurality of first die bonding pads 131 electrically connected to the circuit 240, and each of the second die bonding zones includes a plurality of second die bonding pads 132 electrically connected to the circuit 240, and the second surface 200B under the first die bonding zone further comprises a plurality of lead frame bonding pads 136, wherein each of the lead frame bonding pads 136 corresponding to each of the first die bonding pads 131 and electrically to each other through a first conductive hole 140; a first semiconductor die 110 bonded to the first die bonding zone and electrically connected to the circuit 240 through the first die bonding pads 131; and a plurality of second semiconductor dies including 120A, 120B and 120C respectively bonded to each of the second die bonding zones and electrically connected to the circuit 240 through the second die bonding pads 132 therein. The heat dissipating mechanism 75 is bonded to the top surface 110A of the first semiconductor die 110.

The flexible circuit boards 200 of this present Embodiment 8 comprises a first semiconductor die 110 bonded to the first die bonding zone, and a plurality of second semiconductor dies including 120A, 120B and 120C respectively bonded to each of the second die bonding zones. However, the flexible circuit board 200 according to other embodiments of this invention can alternatively comprise more than one first semiconductor dies 110 bonded to the first die bonding zone, and more than one second semiconductor dies 120A, 120B, and 120C bonded to each of the second die bonding zones, if necessary.

As shown in FIGS. 8A~8C and 8D, the folded flexible circuit board structure 1610 as shown in FIG. 8D was obtained by folding the cross-shaped flexible circuit board 200 shown in FIGS. 8A~8C in sequence to make the cross-shaped flexible circuit board 200 with the second semiconductor die 120B be bonded thereon be folded above the heat dissipating mechanism 75 bonded to the top surface 110A of the first semiconductor die 110, and then the cross-shaped flexible circuit board 200 with the second semiconductor die 120A be bonded thereon be folded above the second semiconductor die 120B, and then the cross-shaped flexible circuit board 200 with the second semiconductor die 120C be bonded thereon be folded above the second semiconductor die 120A, wherein the second semiconductor dies 120B, 120A and 120C were vertically stacked above the first semiconductor die 110 in sequence. The folded flexible circuit board structure 1610 was vertically stacked on the lead frame 60 through the lead frame bonding pads 136 and electrically connected therewith, and then placed into a jig for subsequent package treatment to generate a 3D package configuration 2100 as shown in FIG. 8D.

Alternatively, as shown in FIGS. 8A~8C and 8D', the folded flexible circuit board structure 1610' as shown in FIG. 8D' was obtained by folding the cross-shaped flexible circuit board 200 shown in FIGS. 8A~8C in sequence to make the cross-shaped flexible circuit board 200 with the second semiconductor die 120A be bonded thereon be folded above the heat dissipating mechanism 75 bonded to the top surface 110A of the first semiconductor die 110, and then the cross-shaped flexible circuit board 200 with the second semiconductor die 120B be bonded thereon be folded above the second semiconductor die 120A, and then the cross-shaped flexible circuit board 200 with the second semiconductor die 120C be bonded thereon be folded above the second semiconductor die 120B, wherein the second semiconductor dies 120A, 120B and 120C were vertically stacked above the first semiconductor die 110 in sequence. The folded flexible circuit board structure 1610' was vertically stacked on the lead frame 60 through the lead frame bonding pads 136 and electrically connected therewith, and then placed into a jig for subsequent package treatment to generate a 3D package configuration 2100' as shown in FIG. 8D'.

Alternatively, as shown in FIGS. 8A~8C and 8D", the folded flexible circuit board structure 1610" as shown in FIG. 8D" was obtained by folding the cross-shaped flexible circuit board 200 shown in FIGS. 8A~8C in sequence to make the cross-shaped flexible circuit board 200 with the second semiconductor die 120A be bonded thereon be folded above the heat dissipating mechanism 75 bonded to the top surface 110A of the first semiconductor die 110, and then the cross-shaped flexible circuit board 200 with the second semiconductor die 120C be bonded thereon be folded above the second semiconductor die 120A, and then the cross-shaped flexible circuit board 200 with the second semiconductor die 120B be bonded thereon be folded above the second semiconductor die 120C, wherein the second semiconductor dies 120A, 120C and 120B were vertically stacked above the first semiconductor die 110 in sequence. The folded flexible circuit board structure 1610" was vertically stacked on the lead frame 60 through the lead frame bonding pads 136 and electrically connected therewith, and then placed into a jig for subsequent package treatment to generate a 3D package configuration 2100" as shown in FIG. 8D".

The first semiconductor die 110 and the second semiconductor dies 120A, 120B and 120C of the 3D package configurations 2100, 2100' and 2100" can respectively be for example but not limited to a CPU die, a GPU die, a DSP die, a MPU die, a MCU die, a DRAM die, a SRAM die, a Standard Logic IC die, an ASIC die for a special application, a sensing die with a specific sensing function, or a driving IC die.

The first die bonding pads 131, the second die bonding pads 132 and the lead frame bonding pads 136 of the 3D package configurations 2100, 2100' and 2100" are respectively for example but not limited to solder balls or metallic bumps formed by a material selected from one of the group consisting of tin, tin alloys including tin/copper alloy, tin/ITO alloy, tin/silver alloy, tin/bismuth alloy and tin/lead alloy, and conductive polymers.

The material for the flexible insulating substrate 220 of the 3D package configurations 2100, 2100' and 2100" can be selected from for example but not limited to one of the group consisting of Polyester resin, Polyimide (PI), Modified Polyimide (MPI), Covalent Organic Framework (COF), Liquid Photo-Imageable (LPI), Liquid Crystal Polymer (LCP), Polytetrafluoroethylene (PTFE) and flexible epoxy bonded fiber-glass board, or combinations thereof.

The material for the circuit 240 of the 3D package configurations 2100, 2100' and 2100" is selected from for example but not limited to one of the group consisting of copper, copper alloy, tinned copper, tin alloy, aluminum, aluminum alloys, gold and silver, or combinations thereof.

The above-mentioned 3D package configurations 2100, 2100' and 2100", wherein the circuit 240 of the flexible circuit board 200 can be a single-layered circuit or a multiple-layered circuit, and the insulating layer 260 overlaying the circuit 240 can also be a single-layered insulating layer or a multiple-layered insulating layer.

According to another embodiment of this invention, additional adhesive layers can be coated on the first surface 200A or the second surface 200B of the flexible circuit board 200 of the 3D package configurations 2100, 2100' and 2100" to fasten the folded flexible circuit board structures 1610, 1610' and 1610" vertically stacked on the lead frame 60.

Embodiment 9

Figure 9B:
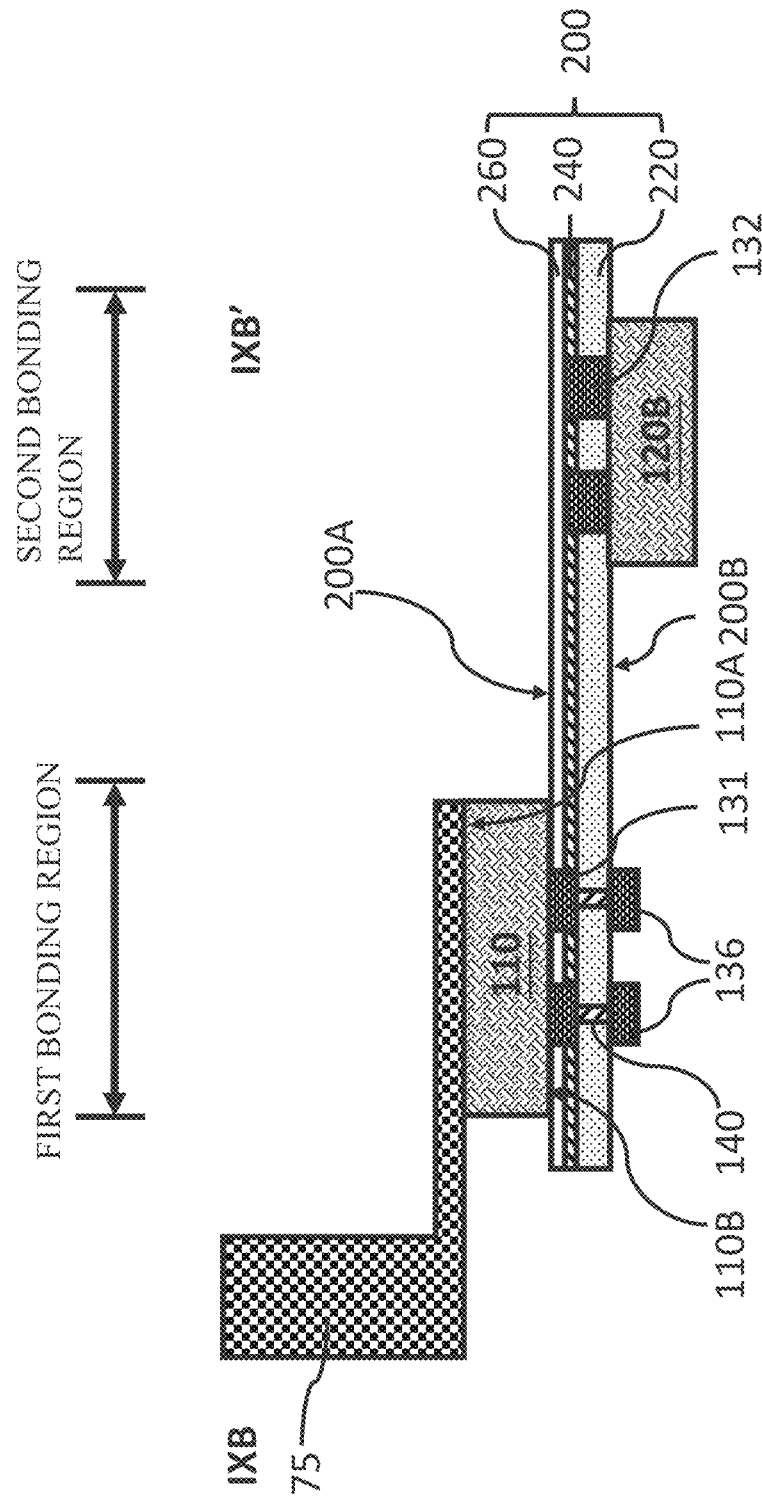
FIG. 9B is a cross-sectional view along with the cross-sectional line IXB-IXB' shown in FIG. 9A-1.
Figure 9C:
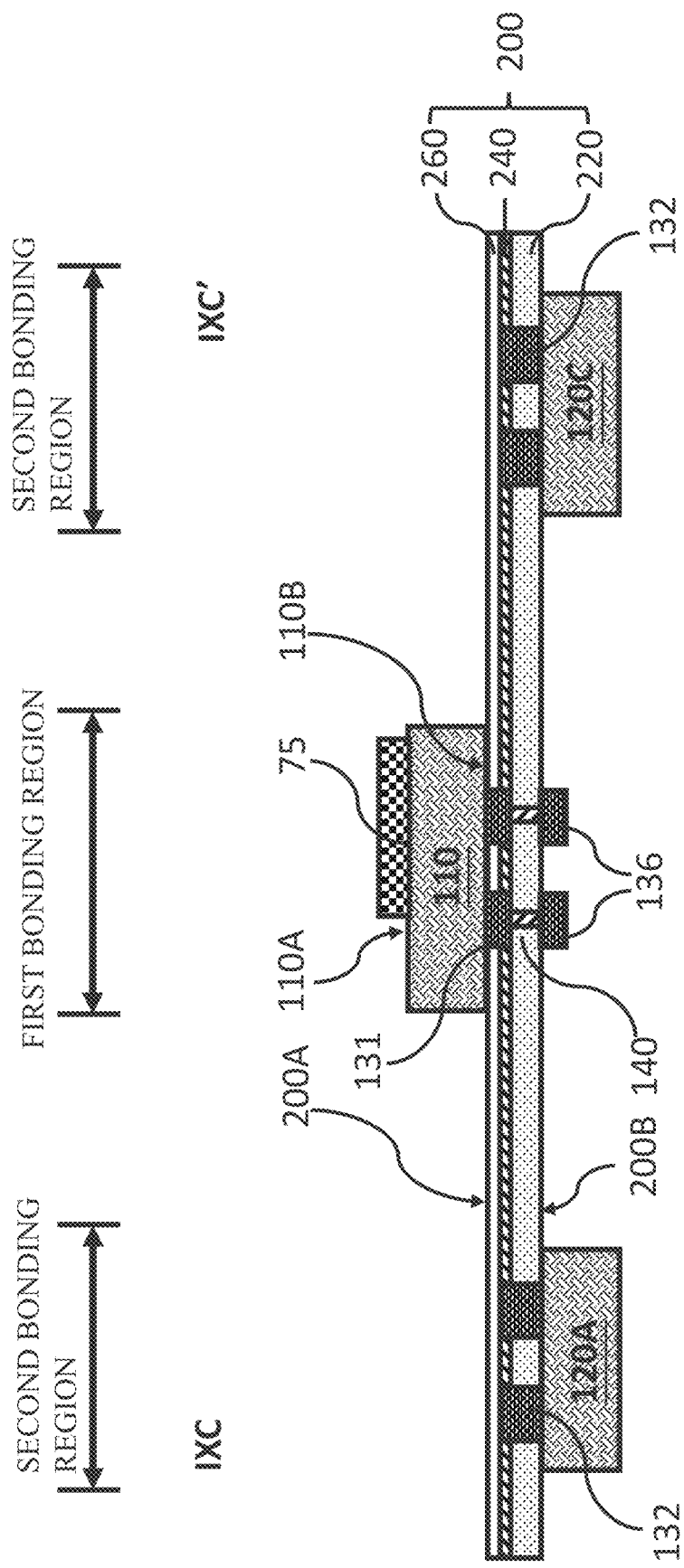
FIG. 9C is a cross-sectional view along with the cross-sectional line IXC-IXC' shown in FIG. 9A-1.
Figure 9D:
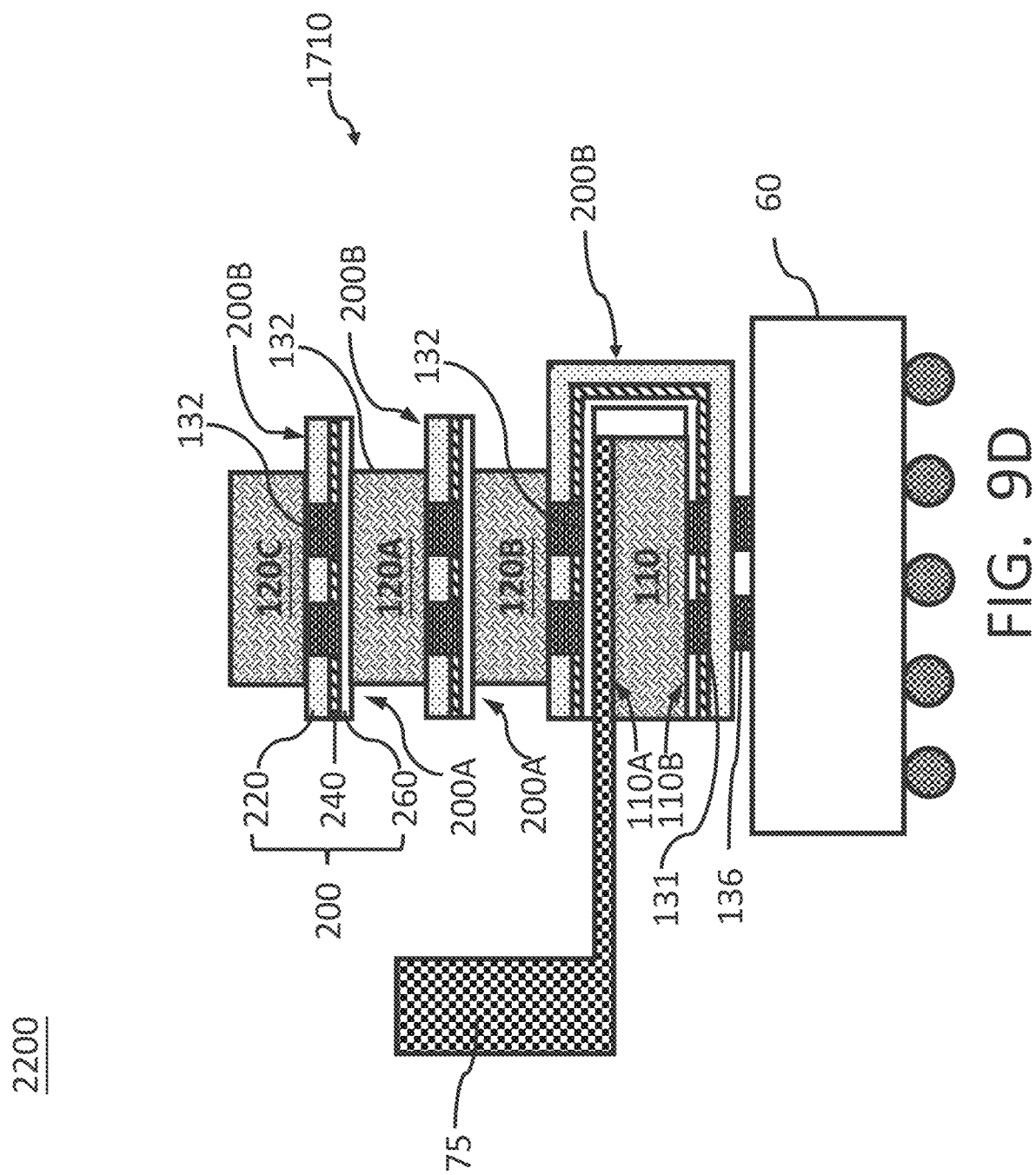
FIG. 9D is a cross-sectional view of a 3D package configuration 2200 according to Embodiment 9 of this present invention.
Figure 9D:
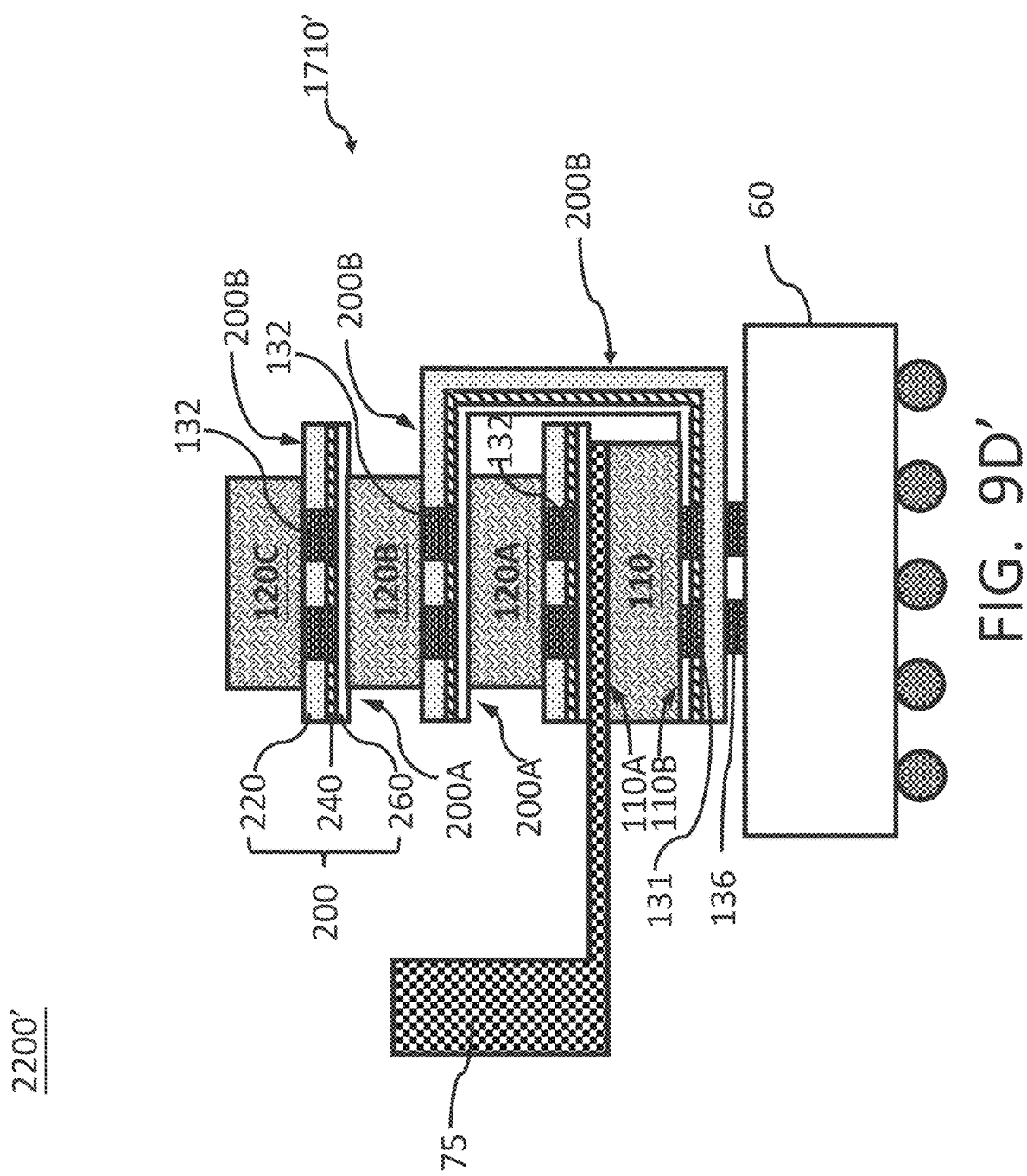

Please refer to FIGS. 9A-1, 9A-2, 9B~9C, and FIGS. 9D, 9D', and 9D". FIG. 9A-1 is a top view of a flexible circuit board according to Embodiment 9 of this invention. FIG. 9A-2 is a bottom view of a flexible circuit board according to Embodiment 9 of this invention. FIG. 9B is a cross-sectional view along with the cross-sectional line IXB-IXB' shown in FIG. 9A-1. FIG. 9C is a cross-sectional view along with the cross-sectional line IXC-IXC' shown in FIG. 9A-1. FIG. 9D is a cross-sectional view of a 3D package configuration 2200 according to Embodiment 9 of this present invention. FIG. 9D' is a cross-sectional view of another 3D package configuration 2200' according to Embodiment 9 of this invention. FIG. 9D" is a cross-sectional view of another 3D package configuration 2200" according to Embodiment 9 of this invention.

This present Embodiment 9 discloses a 3D configuration 2200 as shown in FIG. 9D, comprising a lead frame 60; a folded flexible circuit board structure 1710 vertically stacked on the lead frame 60 and electrically connected therewith; and a heat dissipating mechanism 75. The folded flexible circuit board structure 1710 comprises a cross-shaped flexible circuit board 200 as shown in FIG. 9A comprising a flexible insulating substrate 220, a circuit 240 formed on a surface of the flexible insulating substrate 220 and an insulating layer 260 overlaying the circuit 240, wherein the flexible circuit board 200 has a first surface 200A with a first die bonding zone and a second surface 200B with a plurality of second die bonding zone opposite to the first surface 200A, and the first die bonding zone includes a plurality of first die bonding pads 131 electrically connected to the circuit 240, and each of the second die bonding zones includes a plurality of second die bonding pads 132 electrically connected to the circuit 240, and the second surface 200B under the first die bonding zone further comprises a plurality of lead frame bonding pads 136, wherein each of the lead frame bonding pads 136 corresponding to each of the first die bonding pads 131 and electrically to each other through a first conductive hole 140; a first semiconductor die 110 bonded to the first die bonding zone and electrically connected to the circuit 240 through the first die bonding pads 131; and a plurality of second semiconductor dies including 120A, 120B and 120C respectively bonded to each of the second die bonding zones and electrically connected to the circuit 240 through the second die bonding pads 132 therein. The heat dissipating mechanism 75 is bonded to the top surface 110A of the first semiconductor die 110.

The flexible circuit boards 200 of this present Embodiment 9 comprises a first semiconductor die 110 bonded to the first die bonding zone, and a plurality of second semiconductor dies including 120A, 120B and 120C respectively bonded to each of the second die bonding zones. However, the flexible circuit board 200 according to other embodiments of this invention can alternatively comprise more than one first semiconductor dies 110 bonded to the first die bonding zone, and more than one second semiconductor dies 120A, 120B, and 120C bonded to each of the second die bonding zones, if necessary.

As shown in FIGS. 9A-1, 9A-2, 9B~9C and 9D, the folded flexible circuit board structure 1710 as shown in FIG. 9D was obtained by folding the cross-shaped flexible circuit board 200 shown in FIGS. 9A-1, 9A-2 and 9B~9C in sequence to make the cross-shaped flexible circuit board 200 with the second semiconductor die 120B be bonded thereon be folded above the heat dissipating mechanism 75 bonded to the top surface 110A of the first semiconductor die 110, and then the cross-shaped flexible circuit board 200 with the second semiconductor die 120A be bonded thereon be folded above the second semiconductor die 120B, and then the cross-shaped flexible circuit board 200 with the second semiconductor die 120C be bonded thereon be folded above the second semiconductor die 120A, wherein the second semiconductor dies 120B, 120A and 120C were vertically stacked above the first semiconductor die 110 in sequence. The folded flexible circuit board structure 1710 was vertically stacked on the lead frame 60 through the lead frame bonding pads 136 and electrically connected therewith, and then placed into a jig for subsequent package treatment to generate a 3D package configuration 2200 as shown in FIG. 9D.

Alternatively, as shown in FIGS. 9A-1, 9A-2, 9B~9C and 9D', the folded flexible circuit board structure 1710' as shown in FIG. 9D' was obtained by folding the cross-shaped flexible circuit board 200 shown in FIGS. 9A-1, 9A-2 and 9B~9C in sequence to make the cross-shaped flexible circuit board 200 with the second semiconductor die 120A be bonded thereon be folded above the heat dissipating mechanism 75 bonded to the top surface 110A of the first semiconductor die 110, and then the cross-shaped flexible circuit board 200 with the second semiconductor die 120B be bonded thereon be folded above the second semiconductor die 120A, and then the cross-shaped flexible circuit board 200 with the second semiconductor die 120C be bonded thereon be folded above the second semiconductor die 120B, wherein the second semiconductor dies 120A, 120B and 120C were vertically stacked above the first semiconductor die 110 in sequence. The folded flexible circuit board structure 1710' was vertically stacked on the lead frame 60 through the lead frame bonding pads 136 and electrically connected therewith, and then placed into a jig for subsequent package treatment to generate a 3D package configuration 2200' as shown in FIG. 9D'.

Alternatively, as shown in FIGS. 9A-1, 9A-2, 9B~9C and 9D", the folded flexible circuit board structure 1710" as shown in FIG. 9D" was obtained by folding the cross-shaped flexible circuit board 200 shown in FIGS. 9A-1, 9A-2 and 9B~9C in sequence to make the cross-shaped flexible circuit board 200 with the second semiconductor die 120A be bonded thereon be folded above the heat dissipating mechanism 75 bonded to the top surface 110A of the first semiconductor die 110, and then the cross-shaped flexible circuit board 200 with the second semiconductor die 120C be bonded thereon be folded above the second semiconductor die 120A, and then the cross-shaped flexible circuit board 200 with the second semiconductor die 120B be bonded thereon be folded above the second semiconductor die 120C, wherein the second semiconductor dies 120A, 120C and 120B were vertically stacked above the first semiconductor die 110 in sequence. The folded flexible circuit board structure 1710" was vertically stacked on the lead frame 60 through the lead frame bonding pads 136 and electrically connected therewith, and then placed into a jig for subsequent package treatment to generate a 3D package configuration 2200" as shown in FIG. 9D".

The first semiconductor die 110 and the second semiconductor dies 120A, 120B and 120C of the 3D package configurations 2200, 2200' and 2200" can respectively be for example but not limited to a CPU die, a GPU die, a DSP die, a MPU die, a MCU die, a DRAM die, a SRAM die, a Standard Logic IC die, an ASIC die for a special application, a sensing die with a specific sensing function, or a driving IC die.

The first die bonding pads 131, the second die bonding pads 132 and the lead frame bonding pads 136 of the 3D package configurations 2200, 2200' and 2200" are respectively for example but not limited to solder balls or metallic bumps formed by a material selected from one of the group consisting of tin, tin alloys including tin/copper alloy, tin/ITO alloy, tin/silver alloy, tin/bismuth alloy and tin/lead alloy, and conductive polymers.

The material for the flexible insulating substrate 220 of the 3D package configurations 2200, 2200' and 2200" can be selected from for example but not limited to one of the group consisting of Polyester resin, Polyimide (PI), Modified Polyimide (MPI), Covalent Organic Framework (COF), Liquid Photo-Imageable (LPI), Liquid Crystal Polymer (LCP), Polytetrafluoroethylene (PTFE) and flexible epoxy bonded fiber-glass board, or combinations thereof.

The material for the circuit 240 of the 3D package configurations 2200, 2200' and 2200" is selected from for example but not limited to one of the group consisting of copper, copper alloy, tinned copper, tin alloy, aluminum, aluminum alloys, gold and silver, or combinations thereof.

The above-mentioned 3D package configurations 2200, 2200' and 2200", wherein the circuit 240 of the flexible circuit board 200 can be a single-layered circuit or a multiple-layered circuit, and the insulating layer 260 overlaying the circuit 240 can also be a single-layered insulating layer or a multiple-layered insulating layer.

According to another embodiment of this invention, additional adhesive layers can be coated on the first surface 200A or the second surface 200B of the flexible circuit board 200 of the 3D package configurations 2200, 2200' and 2200" to fasten the folded flexible circuit board structures 1710, 1710' and 1710" vertically stacked on the lead frame 60.

Embodiment 10

Figure 10A:
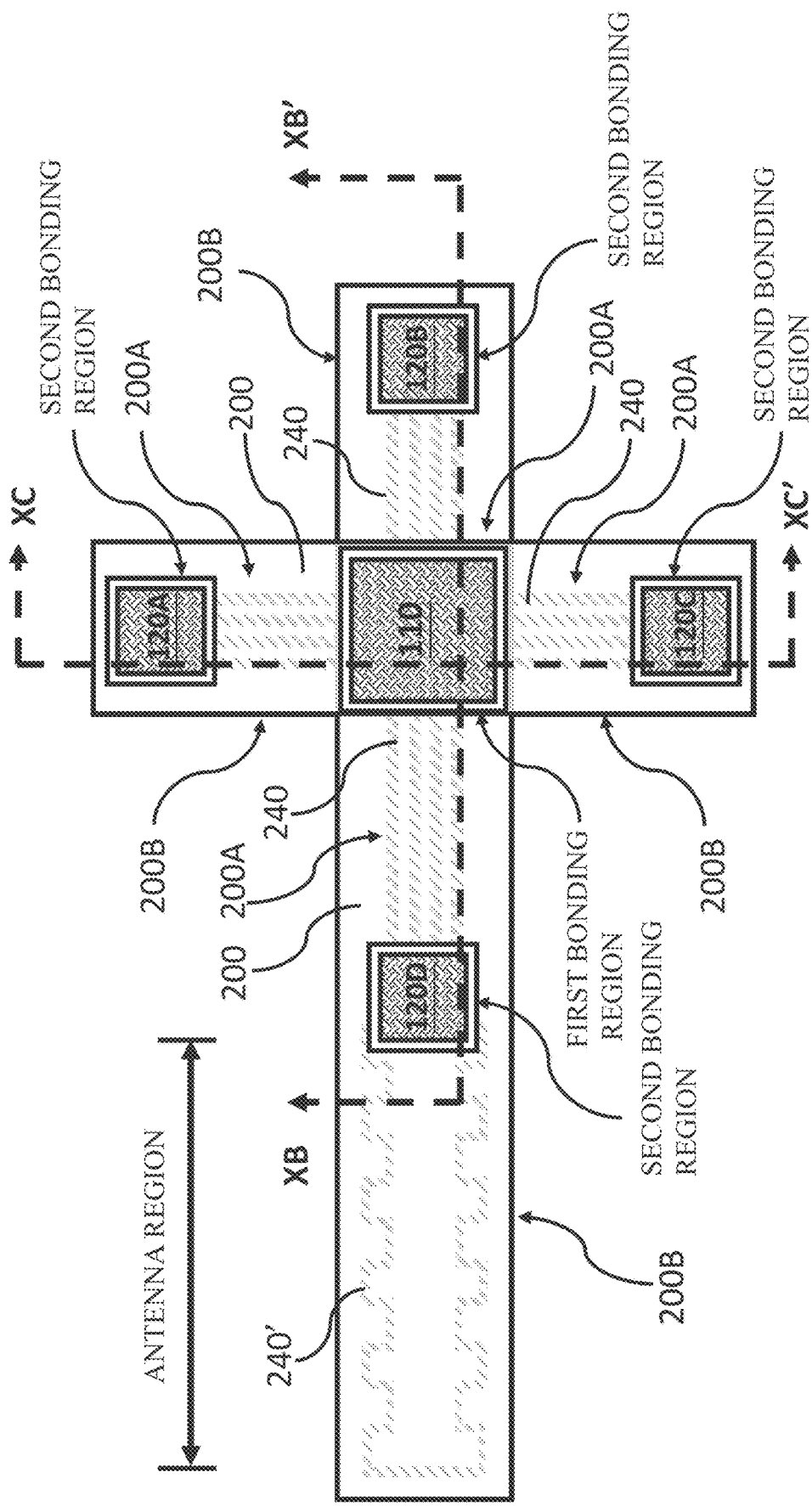
FIG. 10A is a top view of a flexible circuit board according to Embodiment 10 of this invention.
Figure 10B:
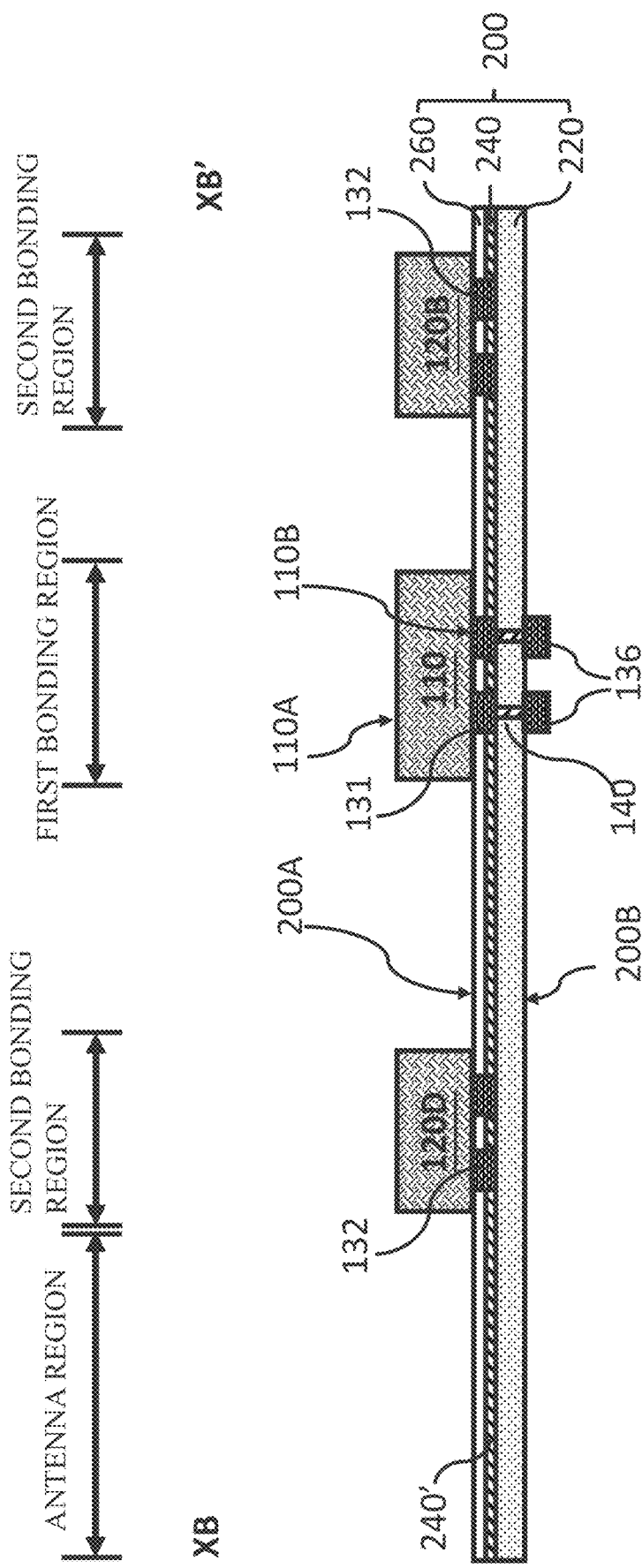
FIG. 10B is a cross-sectional view along with the cross-sectional line XB-XB' shown in FIG. 10A.
Figure 10C:
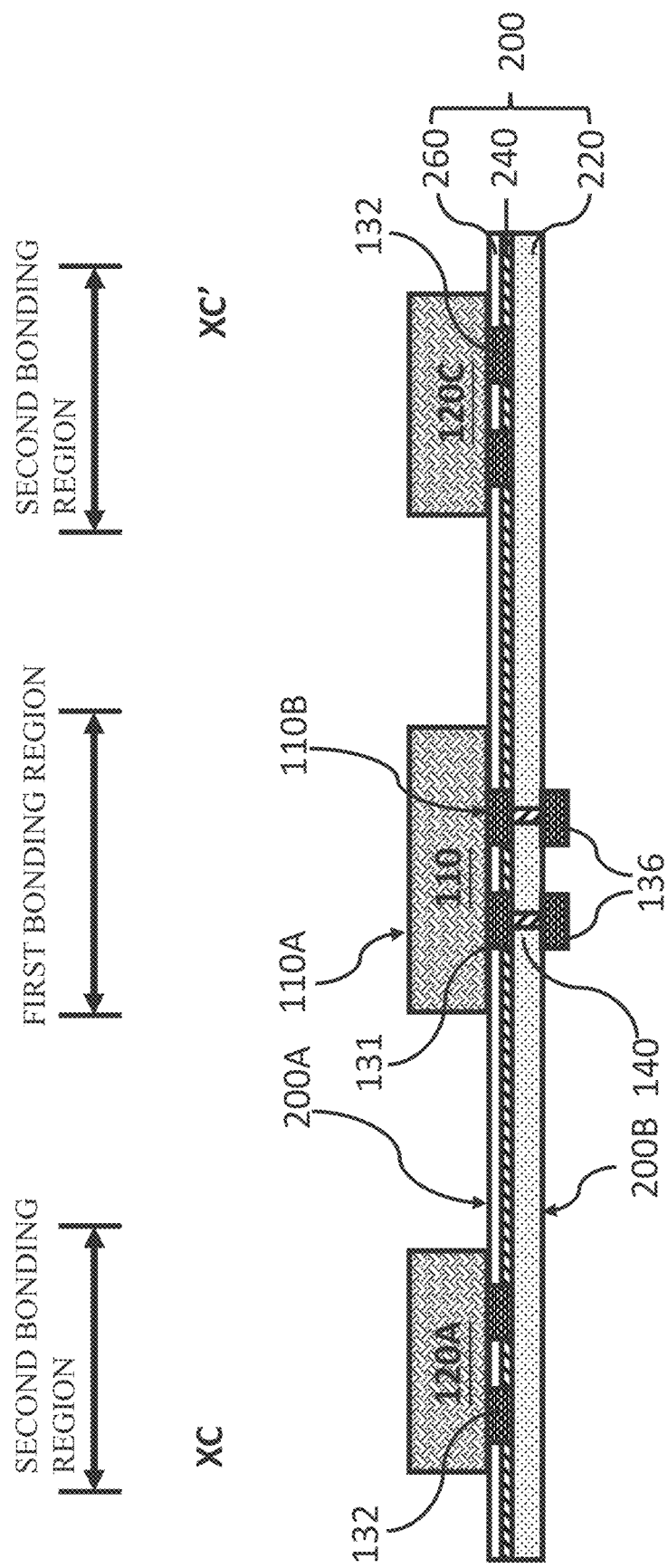
FIG. 10C is a cross-sectional view along with the cross-sectional line XC-XC' shown in FIG. 10A.
Figure 10D:
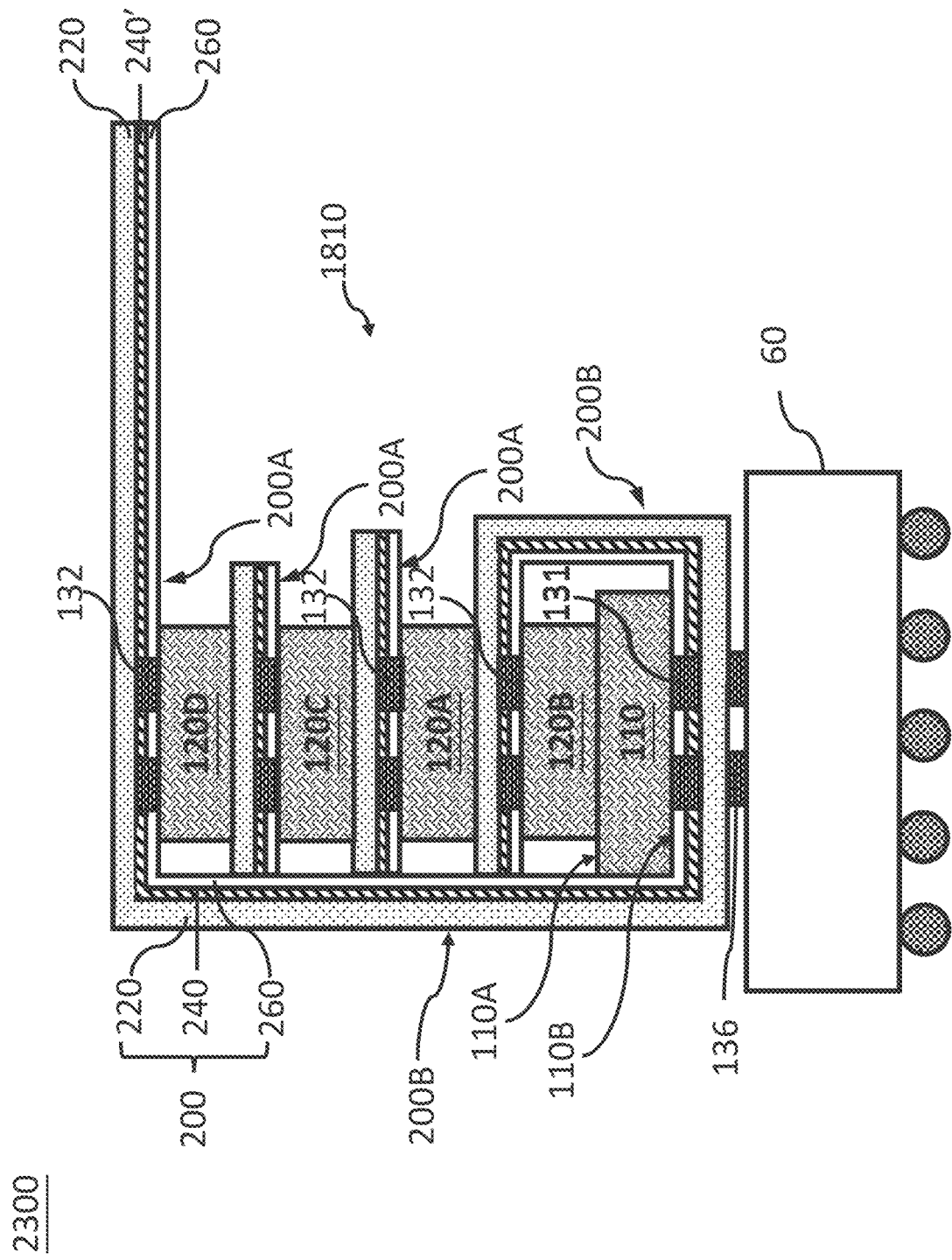
FIG. 10D is a cross-sectional view of a 3D package configuration 2300 according to Embodiment 10 of this present invention.
Figure 10D:
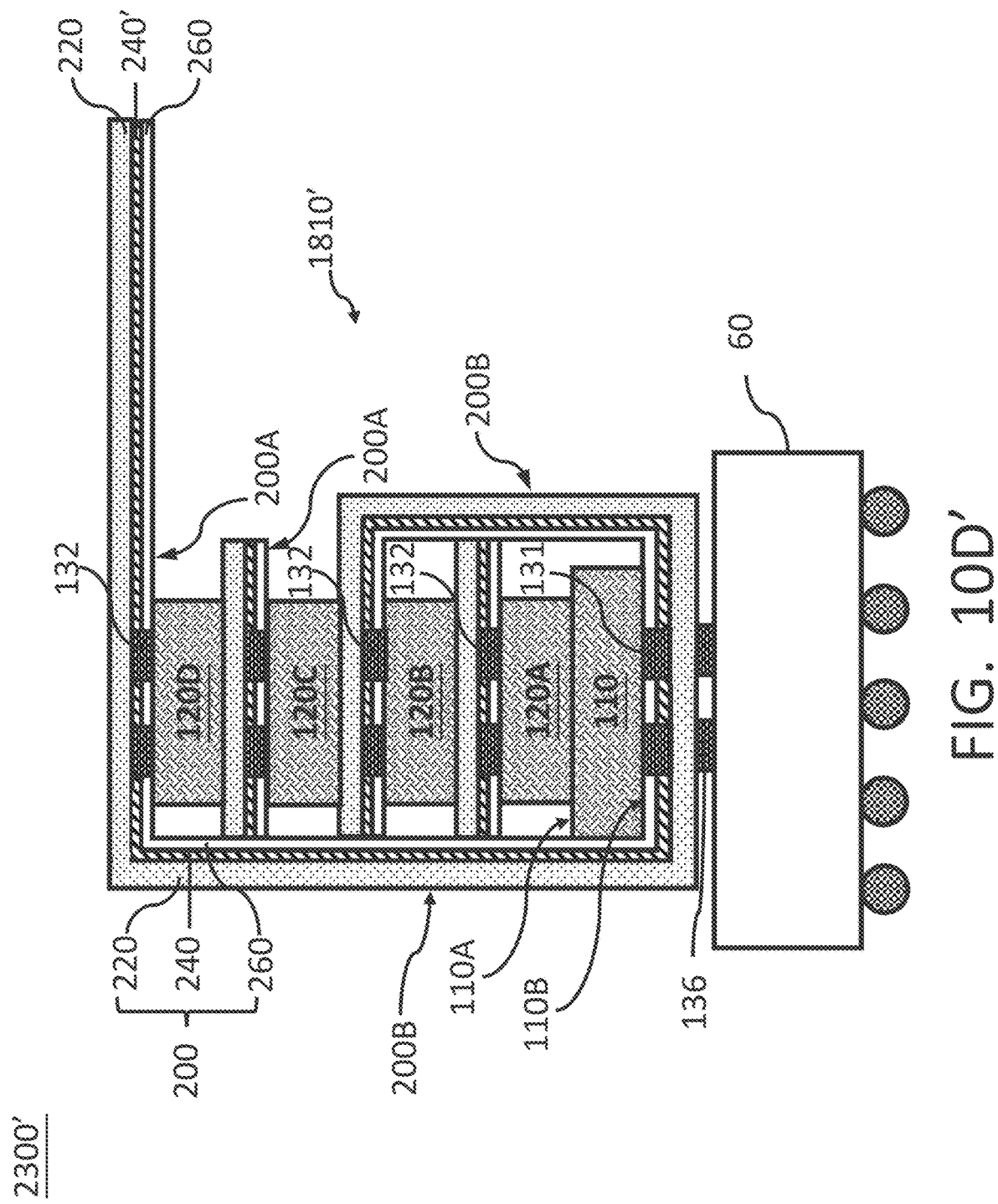

Please refer to FIGS. 10A~10C and FIGS. 10D, 10D' and 10D". FIG. 10A is a top view of a flexible circuit board according to Embodiment 10 of this invention. FIG. 10B is a cross-sectional view along with the cross-sectional line XB-XB' shown in FIG. 10A. FIG. 10C is a cross-sectional view along with the cross-sectional line XC-XC' shown in FIG. 10A. FIG. 10D is a cross-sectional view of a 3D package configuration 2300 according to Embodiment 10 of this present invention. FIG. 10D' is a cross-sectional view of another 3D package configuration 2300' according to Embodiment 10 of this invention. FIG. 10D" is a cross-sectional view of another 3D package configuration 2300" according to Embodiment 10 of this invention.

This present Embodiment 10 discloses a 3D package configuration 2300 as shown in FIG. 10D, comprising a lead frame 60 and a folded flexible circuit board structure 1810 vertically stacked on the lead frame 60 and electrically connected therewith. The folded flexible circuit board structure 1810 comprises a cross-shaped flexible circuit board 200 as shown in FIG. 10A comprising a flexible insulating substrate 220, a circuit 240 formed on a surface of the flexible insulating substrate 220 and an insulating layer 260 overlaying the circuit 240, wherein the flexible circuit board 200 has a first surface 200A and a second surface 200B opposite to each other, wherein the first surface 200A includes a first die bonding zone and a plurality of second die bonding zones formed thereon, and the first die bonding zone includes a plurality of first die bonding pads 131 electrically connected to the circuit 240, and each of the second die bonding zones includes a plurality of second die bonding pads 132 electrically connected to the circuit 240, and the second surface 200B under the first die bonding zone further comprises a plurality of lead frame bonding pads 136, wherein each of the lead frame bonding pads 136 corresponding to each of the first die bonding pads 131 and electrically to each other through a first conductive hole 140; a first semiconductor die 110 bonded to the first die bonding zone and electrically connected to the circuit 240 through the first die bonding pads 131; and a plurality of second semiconductor dies including 120A, 120B, 120C and 120D respectively bonded to each of the second die bonding zones and electrically connected to the circuit 240 through the second die bonding pads 132 therein. Moreover, the second semiconductor die 120D be bonded to one of the second chip bonding regions adjacent to a terminal of the flexible circuit board 200 is a tel-communication chip, and an antenna region as shown in FIGS. 10A~10B is formed between the terminal of the flexible circuit board 200 and the second semiconductor die 120D, wherein the antenna region comprises an integrated antenna circuit 240' formed on the insulating substrate 220 of the flexible circuit board 200 and overlaid by the insulating layer 260 of the flexible circuit board 200, and the second semiconductor die 120D is electrically connected to the integrated antenna circuit 240' through the second chip bonding pads 132 to ensure that the second chip bonding pads 132 is electrically connected to the integrated antenna circuit 240' in the shortest pathway to reduce the noise.

The flexible circuit boards 200 of this present Embodiment 10 comprises a first semiconductor die 110 bonded to the first die bonding zone, and a plurality of second semiconductor dies including 120A, 120B, 120C and 120D respectively bonded to each of the second die bonding zones. However, the flexible circuit board 200 according to other embodiments of this invention can alternatively comprise more than one first semiconductor dies 110 bonded to the first die bonding zone, and more than one second semiconductor dies 120A, 120B, 120C and 120D bonded to each of the second die bonding zones, if necessary.

As shown in FIGS. 10A~10C and 10D, the folded flexible circuit board structure 1810 as shown in FIG. 10D was obtained by folding the cross-shaped flexible circuit board 200 shown in FIGS. 10A~10C in sequence to make the cross-shaped flexible circuit board 200 with the second semiconductor die 120B be bonded thereon be folded above the first semiconductor die 110, and then the cross-shaped flexible circuit board 200 with the second semiconductor die 120A be bonded thereon be folded above the second semiconductor die 120B, and then the cross-shaped flexible circuit board 200 with the second semiconductor die 120C be bonded thereon be folded above the second semiconductor die 120A, and then the cross-shaped flexible circuit board 200 with the antenna region and the second semiconductor die 120D be bonded thereon be folded above the second semiconductor die 120C, wherein the second semiconductor dies 120B, 120A, 120C and 120D were vertically stacked above the first semiconductor die 110 in sequence, and the antenna region was outward extended from the folded flexible circuit board structure 1810. The folded flexible circuit board structure 1810 was vertically stacked on the lead frame 60 through the lead frame bonding pads 136 and electrically connected therewith, and then placed into a jig for subsequent package treatment to generate a 3D package configuration 2300 as shown in FIG. 10D.

Alternatively, as shown in FIGS. 10A~10C and 10D', the folded flexible circuit board structure 1810' as shown in FIG. 10D' was obtained by folding the cross-shaped flexible circuit board 200 shown in FIGS. 10A~10C in sequence to make the cross-shaped flexible circuit board 200 with the second semiconductor die 120A be bonded thereon be folded above the first semiconductor die 110, and then the cross-shaped flexible circuit board 200 with the second semiconductor die 120B be bonded thereon be folded above the second semiconductor die 120A, and then the cross-shaped flexible circuit board 200 with the second semiconductor die 120C be bonded thereon be folded above the second semiconductor die 120B, and then the cross-shaped flexible circuit board 200 with the antenna region and the second semiconductor die 120D be bonded thereon be folded above the second semiconductor die 120C, wherein the second semiconductor dies 120A, 120B, 120C and 120D were vertically stacked above the first semiconductor die 110 in sequence, and the antenna region was outward extended from the folded flexible circuit board structure 1810'. The folded flexible circuit board structure 1810' was vertically stacked on the lead frame 60 through the lead frame bonding pads 136 and electrically connected therewith, and then placed into a jig for subsequent package treatment to generate a 3D package configuration 2300' as shown in FIG. 10D'.

Alternatively, as shown in FIGS. 10A~10C and 10D", the folded flexible circuit board structure 1810" as shown in FIG. 10D" was obtained by folding the cross-shaped flexible circuit board 200 shown in FIGS. 10A~10C in sequence to make the cross-shaped flexible circuit board 200 with the second semiconductor die 120A be bonded thereon be folded above the first semiconductor die 110, and then the cross-shaped flexible circuit board 200 with the second semiconductor die 120C be bonded thereon be folded above the second semiconductor die 120A, and then the cross-shaped flexible circuit board 200 with the second semiconductor die 120B be bonded thereon be folded above the second semiconductor die 120C, and then the cross-shaped flexible circuit board 200 with the antenna region and the second semiconductor die 120D be bonded thereon be folded above the second semiconductor die 120B, wherein the second semiconductor dies 120A, 120C, 120B and 120D were vertically stacked above the first semiconductor die 110 in sequence, and the antenna region was outward extended from the folded flexible circuit board structure 1810". The folded flexible circuit board structure 1810" was vertically stacked on the lead frame 60 through the lead frame bonding pads 136 and electrically connected therewith, and then placed into a jig for subsequent package treatment to generate a 3D package configuration 2300" as shown in FIG. 10D".

The first semiconductor die 110 and the second semiconductor dies 120A, 120B, 120C and 120D of the 3D package configurations 2300, 2300' and 2300" can respectively be for example but not limited to a CPU die, a GPU die, a DSP die, a MPU die, a MCU die, a DRAM die, a SRAM die, a Standard Logic IC die, an ASIC die for a special application, a sensing die with a specific sensing function, or a driving IC die.

The first die bonding pads 131, the second die bonding pads 132 and the lead frame bonding pads 136 of the 3D package configurations 2300, 2300' and 2300" are respectively for example but not limited to solder balls or metallic bumps formed by a material selected from one of the group consisting of tin, tin alloys including tin/copper alloy, tin/ITO alloy, tin/silver alloy, tin/bismuth alloy and tin/lead alloy, and conductive polymers.

The material for the flexible insulating substrate 220 of the 3D package configurations 2300, 2300' and 2300" can be selected from for example but not limited to one of the group consisting of Polyester resin, Polyimide (PI), Modified Polyimide (MPI), Covalent Organic Framework (COF), Liquid Photo-Imageable (LPI), Liquid Crystal Polymer (LCP), Polytetrafluoroethylene (PTFE) and flexible epoxy bonded fiber-glass board, or combinations thereof.

The material for the circuit 240 and the antenna circuit 240' of the 3D package configurations 2300, 2300' and 2300" is selected from for example but not limited to one of the group consisting of copper, copper alloy, tinned copper, tin alloy, aluminum, aluminum alloys, gold and silver, or combinations thereof.

The above-mentioned 3D package configurations 2300, 2300' and 2300", wherein the circuit 240 and the antenna circuit 240' of the flexible circuit board 200 can be a single-layered circuit or a multiple-layered circuit, and the insulating layer 260 overlaying the circuit 240 and the antenna circuit 240' can also be a single-layered insulating layer or a multiple-layered insulating layer.

According to another embodiment of this invention, additional adhesive layers can be coated on the first surface 200A or the second surface 200B of the flexible circuit board 200 of the 3D package configurations 2300, 2300' and 2300" to fasten the folded flexible circuit board structures 1810, 1810' and 1810" vertically stacked on the lead frame 60.

Embodiment 11

Figures 1, 11A:
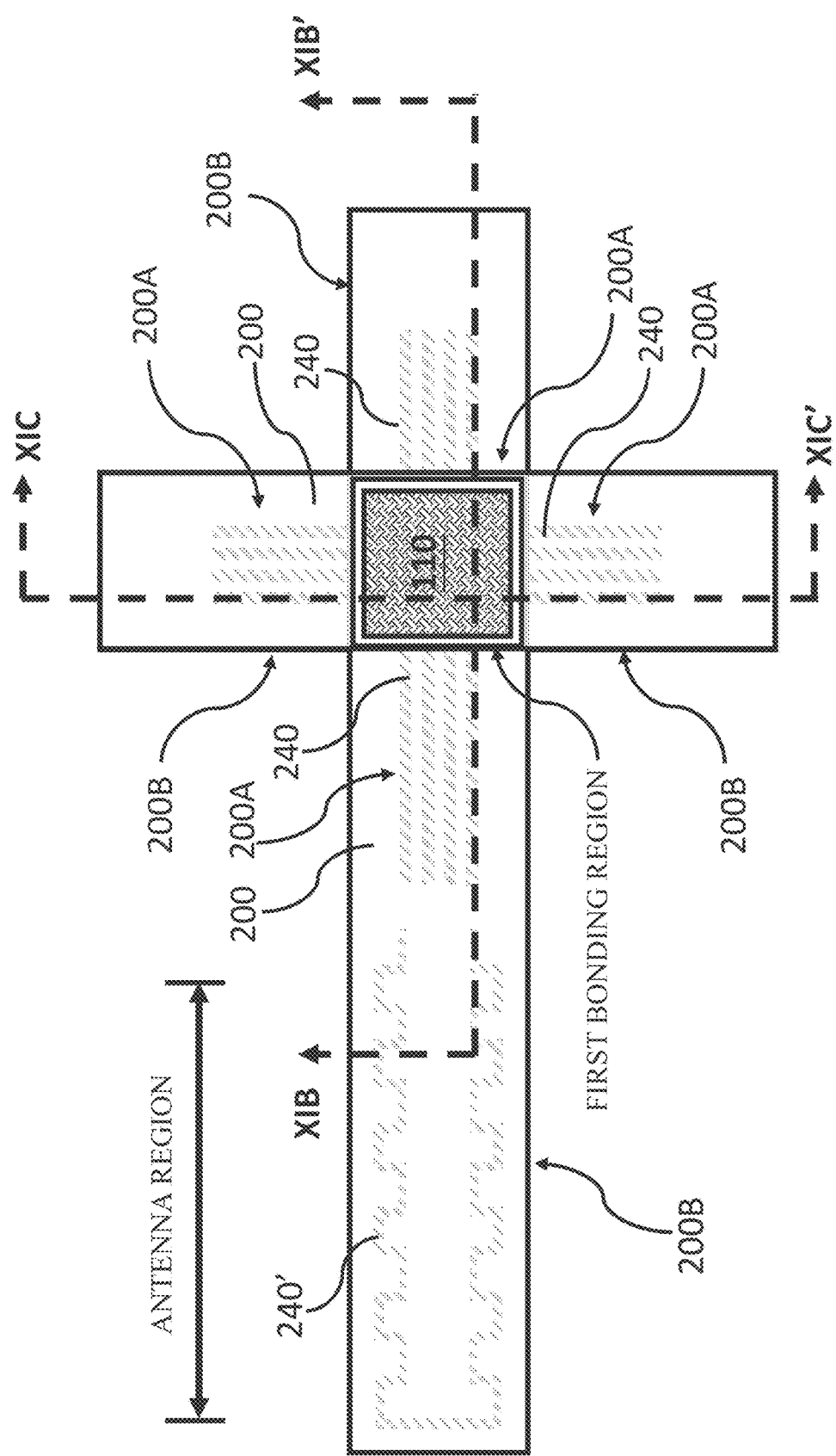
Figures 2, 11A:
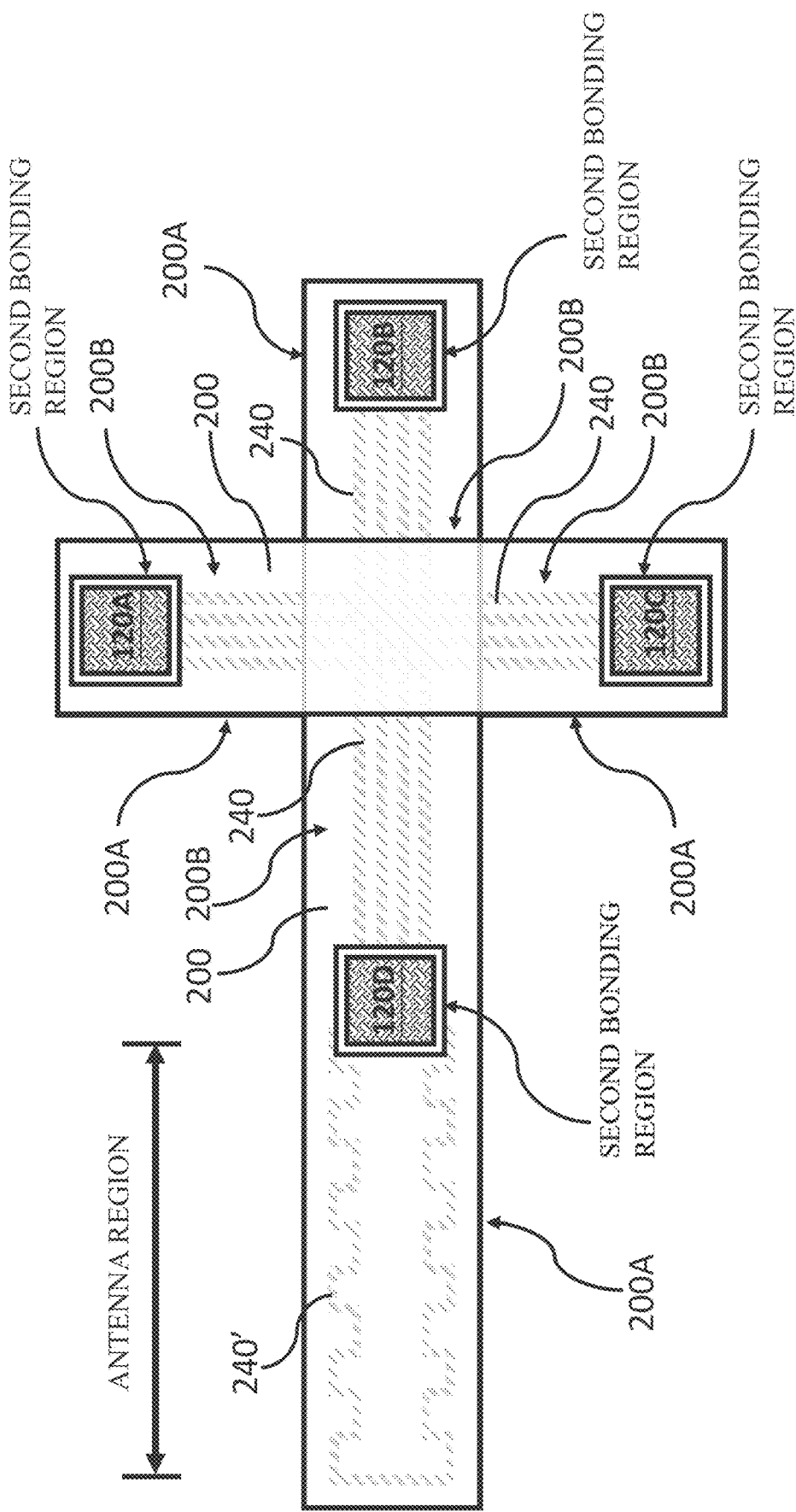
Figure 11B:
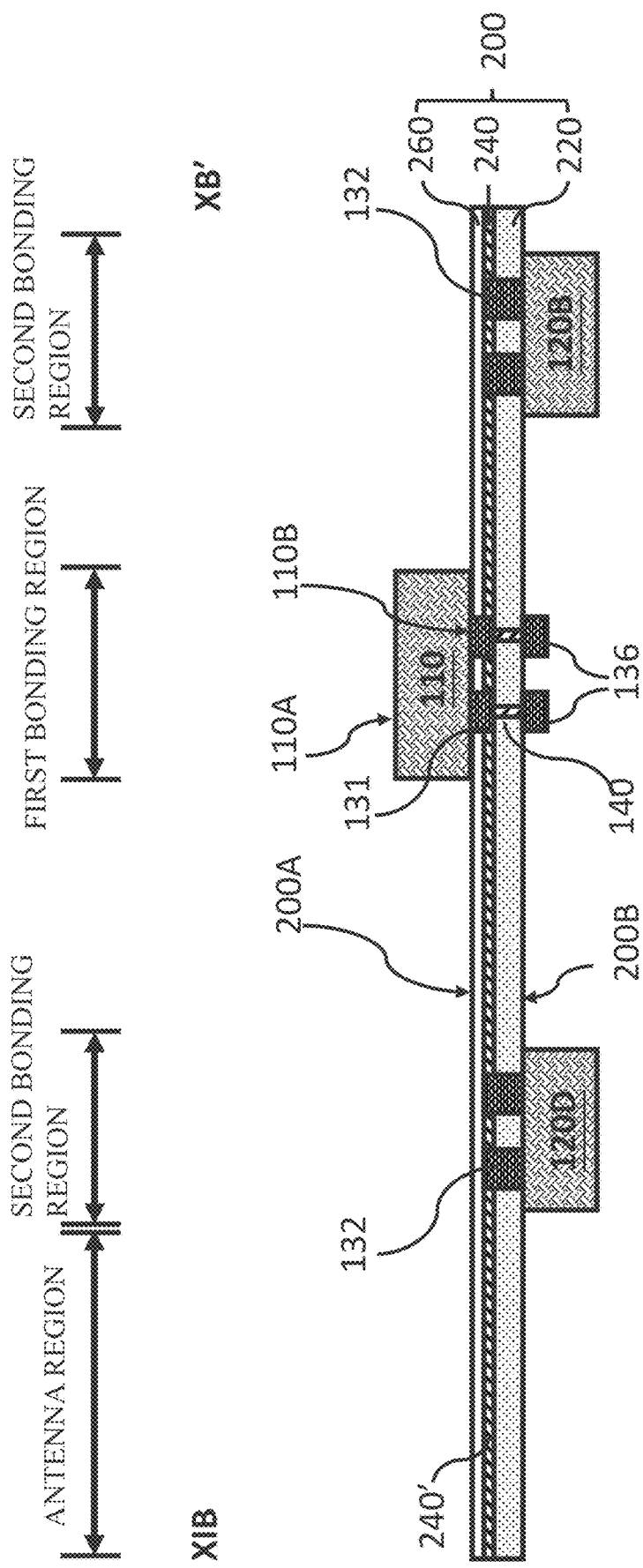
FIG. 11B is a cross-sectional view along with the cross-sectional line XIB-XIB' shown in FIG. 11A-1.
Figure 11C:
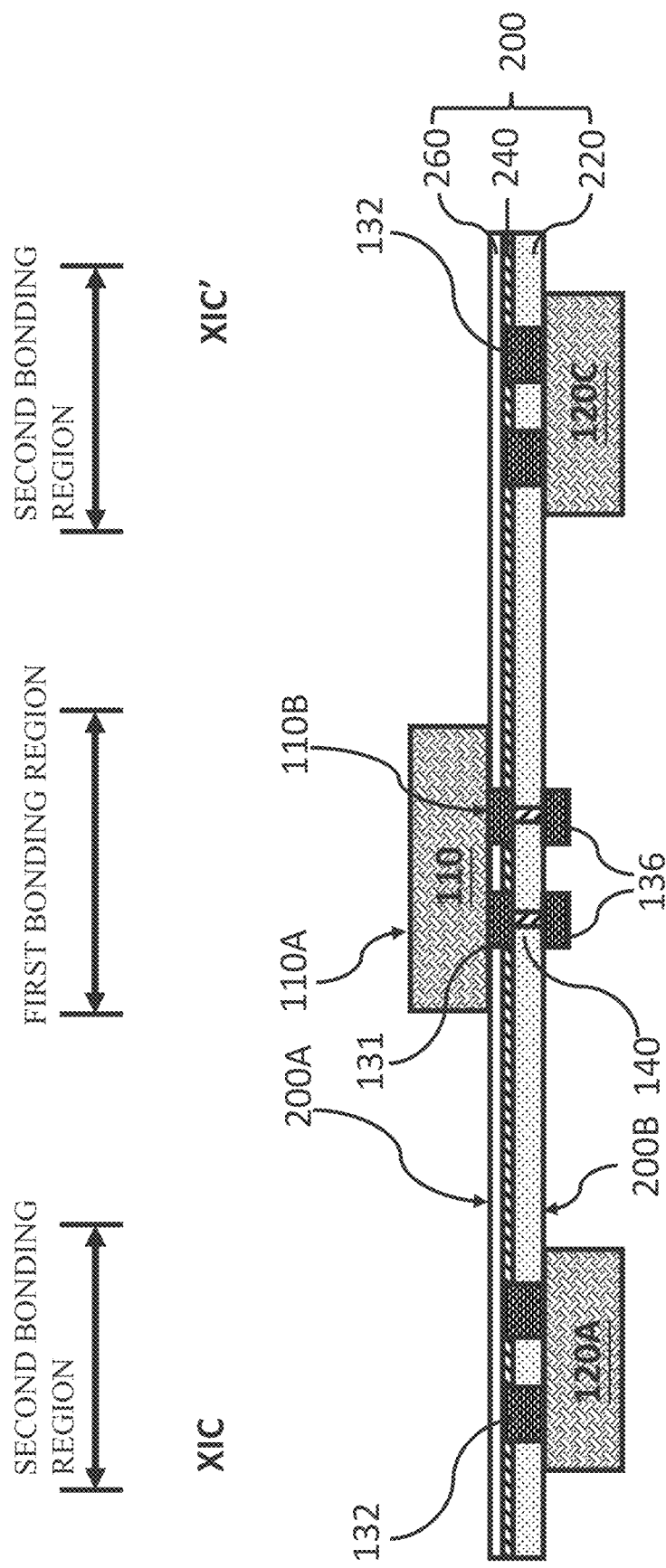
FIG. 11C is a cross-sectional view along with the cross-sectional line XIC-XIC' shown in FIG. 11A-1.
Figure 11D:
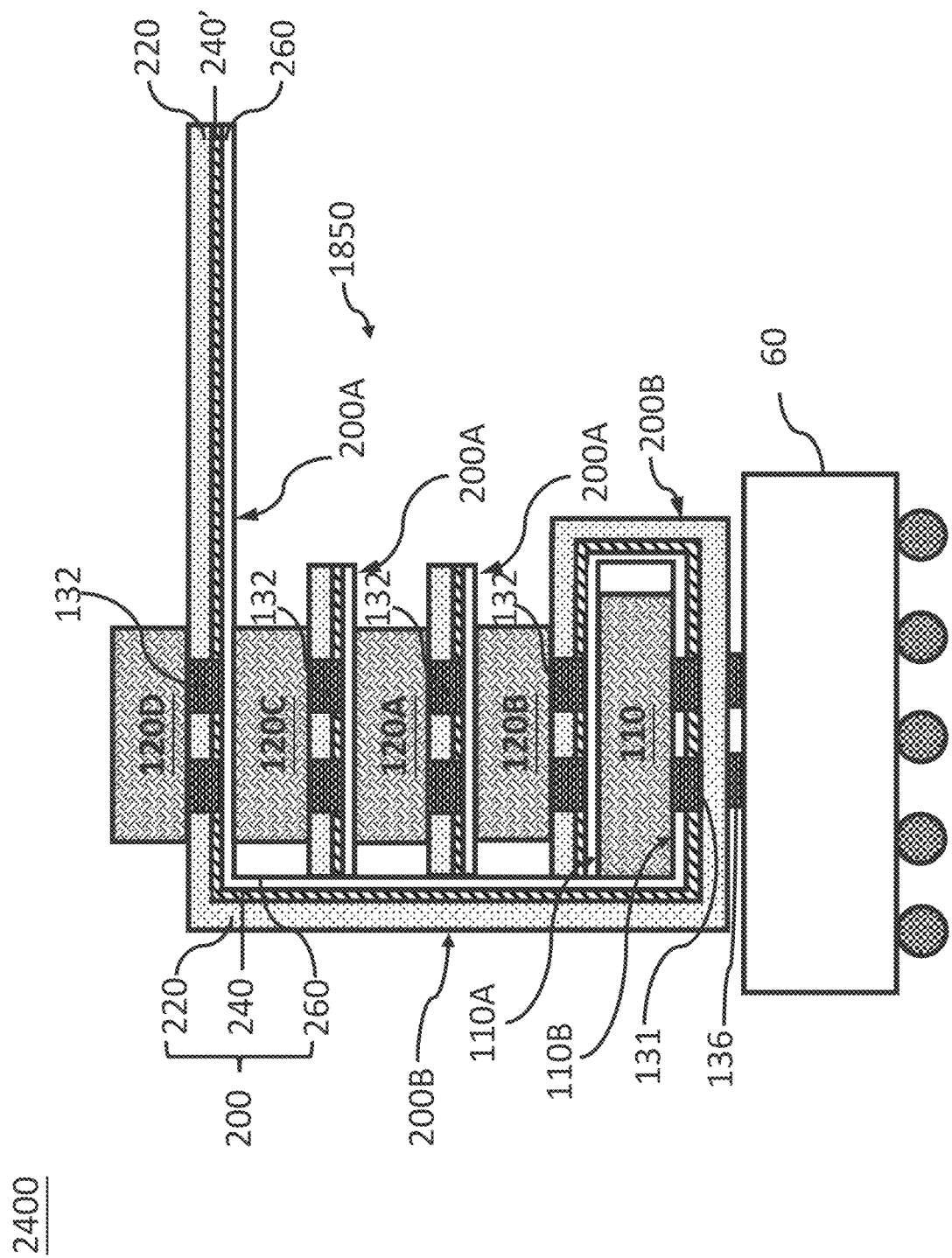
FIG. 11D is a cross-sectional view of a 3D package configuration 2400 according to Embodiment 11 of this present invention.
Figure 11D:
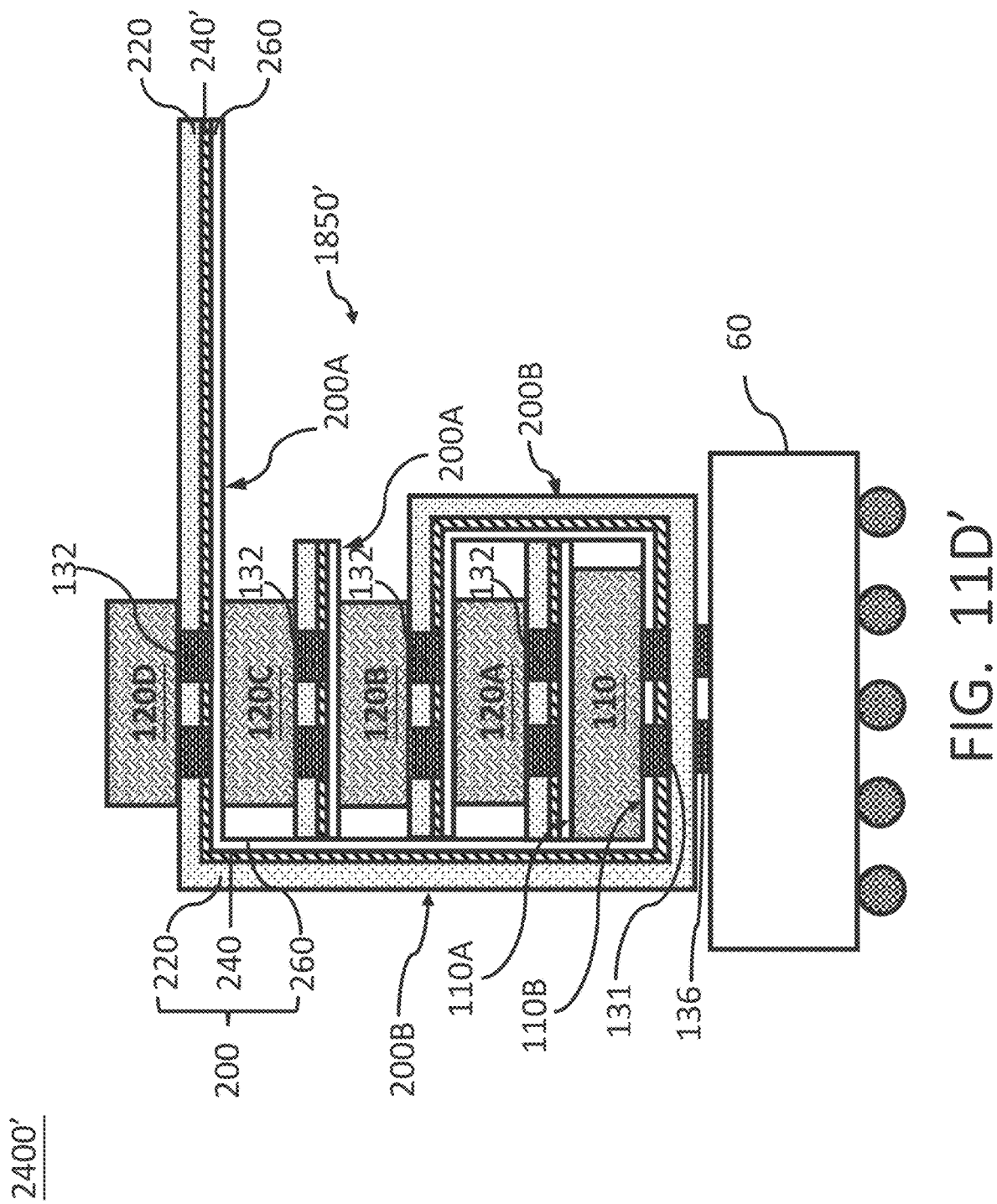

Please refer to FIGS. 11A-1, 11A-2, 11B~11C, and FIGS. 11D, 11D', and 11D". FIG. 11A-1 is a top view of a flexible circuit board according to Embodiment 11 of this invention. FIG. 11A-2 is a bottom view of a flexible circuit board according to Embodiment 11 of this invention. FIG. 11B is a cross-sectional view along with the cross-sectional line XIB-XIB' shown in FIG. 11A-1. FIG. 11C is a cross-sectional view along with the cross-sectional line XIC-XIC' shown in FIG. 11A-1. FIG. 11D is a cross-sectional view of a 3D package configuration 2400 according to Embodiment 11 of this present invention. FIG. 11D' is a cross-sectional view of another 3D package configuration 2400' according to Embodiment 11 of this invention. FIG. 11D" is a cross-sectional view of another 3D package configuration 2400" according to Embodiment 11 of this invention.

This present Embodiment 11 discloses a 3D package configuration 2400 as shown in FIG. 11D, comprising a lead frame 60 and a folded flexible circuit board structure 1850 vertically stacked on the lead frame 60 and electrically connected therewith. The folded flexible circuit board structure 1850 comprises a cross-shaped flexible circuit board 200 as shown in FIGS. 11A-1 and 11A-2 comprising a flexible insulating substrate 220, a circuit 240 formed on a surface of the flexible insulating substrate 220 and an insulating layer 260 overlaying the circuit 240, wherein the flexible circuit board 200 has a first surface 200A and a second surface 200B opposite to each other, wherein the first surface 200A includes a first die bonding zone formed thereon, and the second surface 200B includes a plurality of second die bonding zones formed thereon, and the first die bonding zone includes a plurality of first die bonding pads 131 electrically connected to the circuit 240, and each of the second die bonding zones includes a plurality of second die bonding pads 132 electrically connected to the circuit 240, and the second surface 200B under the first die bonding zone further comprises a plurality of lead frame bonding pads 136, wherein each of the lead frame bonding pads 136 corresponding to each of the first die bonding pads 131 and electrically to each other through a first conductive hole 140; a first semiconductor die 110 bonded to the first die bonding zone and electrically connected to the circuit 240 through the first die bonding pads 131; and a plurality of second semiconductor dies including 120A, 120B, 120C and 120D respectively bonded to each of the second die bonding zones and electrically connected to the circuit 240 through the second die bonding pads 132 therein. Moreover, the second semiconductor die 120D be bonded to one of the second chip bonding regions adjacent to a terminal of the flexible circuit board 200 was a tel-communication chip, and an antenna region as shown in FIGS. 11A-1 and 11A-2 was formed between one terminal of the flexible circuit board 200 and the second semiconductor die 120D, wherein the antenna region comprises an integrated antenna circuit 240' formed on the insulating substrate 220 of the flexible circuit board 200 and overlaid by the insulating layer 260 of the flexible circuit board 200, and the second semiconductor die 120D is electrically connected to the integrated antenna circuit 240' through the second chip bonding pads 132 to ensure that the second chip bonding pads 132 is electrically connected to the integrated antenna circuit 240' in the shortest pathway to reduce the noise.

The flexible circuit boards 200 of this present Embodiment 11 comprises a first semiconductor die 110 bonded to the first die bonding zone, and a plurality of second semiconductor dies including 120A, 120B, 120C and 120D respectively bonded to each of the second die bonding zones. However, the flexible circuit board 200 according to other embodiments of this invention can alternatively comprise more than one first semiconductor dies 110 bonded to the first die bonding zone, and more than one second semiconductor dies 120A, 120B, 120C and 120D be bonded to each of the second die bonding zones, if necessary.

As shown in FIGS. 11A-1, 11A-2, 11B~11C and 11D, the folded flexible circuit board structure 1850 as shown in FIG. 11D was obtained by folding the cross-shaped flexible circuit board 200 shown in FIGS. 11A-1, 11A-2 and 11B~11C in sequence to make the cross-shaped flexible circuit board 200 with the second semiconductor die 120B be bonded thereon be folded above the first semiconductor die 110, and then the cross-shaped flexible circuit board 200 with the second semiconductor die 120A be bonded thereon be folded above the second semiconductor die 120B, and then the cross-shaped flexible circuit board 200 with the second semiconductor die 120C be bonded thereon be folded above the second semiconductor die 120A, and then the cross-shaped flexible circuit board 200 with the antenna region and the second semiconductor die 120D be bonded thereon be folded above the second semiconductor die 120C, wherein the second semiconductor dies 120B, 120A, 120C and 120D were vertically stacked above the first semiconductor die 110 in sequence, and the antenna region was outward extended from the folded flexible circuit board structure 1850. The folded flexible circuit board structure 1850 was vertically stacked on the lead frame 60 through the lead frame bonding pads 136 and electrically connected therewith, and then placed into a jig for subsequent package treatment to generate a 3D package configuration 2400 as shown in FIG. 11D.

Alternatively, as shown in FIGS. 11A-1, 11A-2, 11B-10C and 11D', the folded flexible circuit board structure 1850' as shown in FIG. 11D' was obtained by folding the cross-shaped flexible circuit board 200 shown in FIGS. 11A-1, 11A-2 and 11B~11C in sequence to make the cross-shaped flexible circuit board 200 with the second semiconductor die 120A be bonded thereon be folded above the first semiconductor die 110, and then the cross-shaped flexible circuit board 200 with the second semiconductor die 120B be bonded thereon be folded above the second semiconductor die 120A, and then the cross-shaped flexible circuit board 200 with the second semiconductor die 120C be bonded thereon be folded above the second semiconductor die 120B, and then the cross-shaped flexible circuit board 200 with the antenna region and the second semiconductor die 120D be bonded thereon be folded above the second semiconductor die 120C, wherein the second semiconductor dies 120A, 120B, 120C and 120D were vertically stacked above the first semiconductor die 110 in sequence, and the antenna region was outward extended from the folded flexible circuit board structure 1850'. The folded flexible circuit board structure 1850' was vertically stacked on the lead frame 60 through the lead frame bonding pads 136 and electrically connected therewith, and then placed into a jig for subsequent package treatment to generate a 3D package configuration 2400' as shown in FIG. 11D'.

Alternatively, as shown in FIGS. 11A-1, 11A-2, 11B~11C and 11D", the folded flexible circuit board structure 1850" as shown in FIG. 11D" was obtained by folding the cross-shaped flexible circuit board 200 shown in FIGS. 11A-1, 11A-2 and 11B~11C in sequence to make the cross-shaped flexible circuit board 200 with the second semiconductor die 120A be bonded thereon be folded above the first semiconductor die 110, and then the cross-shaped flexible circuit board 200 with the second semiconductor die 120C be bonded thereon be folded above the second semiconductor die 120A, and then the cross-shaped flexible circuit board 200 with the second semiconductor die 120B be bonded thereon be folded above the second semiconductor die 120C, and then the cross-shaped flexible circuit board 200 with the antenna region and the second semiconductor die 120D be bonded thereon be folded above the second semiconductor die 120B, wherein the second semiconductor dies 120A, 120C, 120B and 120D were vertically stacked above the first semiconductor die 110 in sequence, and the antenna region was outward extended from the folded flexible circuit board structure 1850". The folded flexible circuit board structure 1850" was vertically stacked on the lead frame 60 through the lead frame bonding pads 136 and electrically connected therewith, and then placed into a jig for subsequent package treatment to generate a 3D package configuration 2400" as shown in FIG. 11D".

The first semiconductor die 110 and the second semiconductor dies 120A, 120B, 120C and 120D of the 3D package configurations 2400, 2400' and 2400" can be for example but not limited to a CPU die, a GPU die, a DSP die, a MPU die, a MCU die, a DRAM die, a SRAM die, a Standard Logic IC die, an ASIC die for a special application, a sensing die with a specific sensing function, or a driving IC die.

The first die bonding pads 131, the second die bonding pads 132 and the lead frame bonding pads 136 of the 3D package configurations 2400, 2400' and 2400" are respectively for example but not limited to solder balls or metallic bumps formed by a material selected from one of the group consisting of tin, tin alloys including tin/copper alloy, tin/ITO alloy, tin/silver alloy, tin/bismuth alloy and tin/lead alloy, and conductive polymers.

The material for the flexible insulating substrate 220 of the 3D package configurations 2400, 2400' and 2400" can be selected from for example but not limited to one of the group consisting of Polyester resin, Polyimide (PI), Modified Polyimide (MPI), Covalent Organic Framework (COF), Liquid Photo-Imageable (LPI), Liquid Crystal Polymer (LCP), Polytetrafluoroethylene (PTFE) and flexible epoxy bonded fiber-glass board, or combinations thereof.

The material for the circuit 240 and the antenna circuit 240' of the 3D package configurations 2400, 2400' and 2400" is selected from for example but not limited to one of the group consisting of copper, copper alloy, tinned copper, tin alloy, aluminum, aluminum alloys, gold and silver, or combinations thereof.

The above-mentioned 3D package configurations 2400, 2400' and 2400", wherein the circuit 240 and the antenna circuit 240' of the flexible circuit board 200 can be a single-layered circuit or a multiple-layered circuit, and the insulating layer 260 overlaying the circuit 240 and the antenna circuit 240' can also be a single-layered insulating layer or a multiple-layered insulating layer.

According to another embodiment of this invention, additional adhesive layers can be coated on the first surface 200A or the second surface 200B of the flexible circuit board 200 of the 3D package configurations 2400, 2400' and 2400" to fasten the folded flexible circuit board structures 1850, 1850' and 1850" vertically stacked on the lead frame 60.

Embodiment 12

Figure 12A:
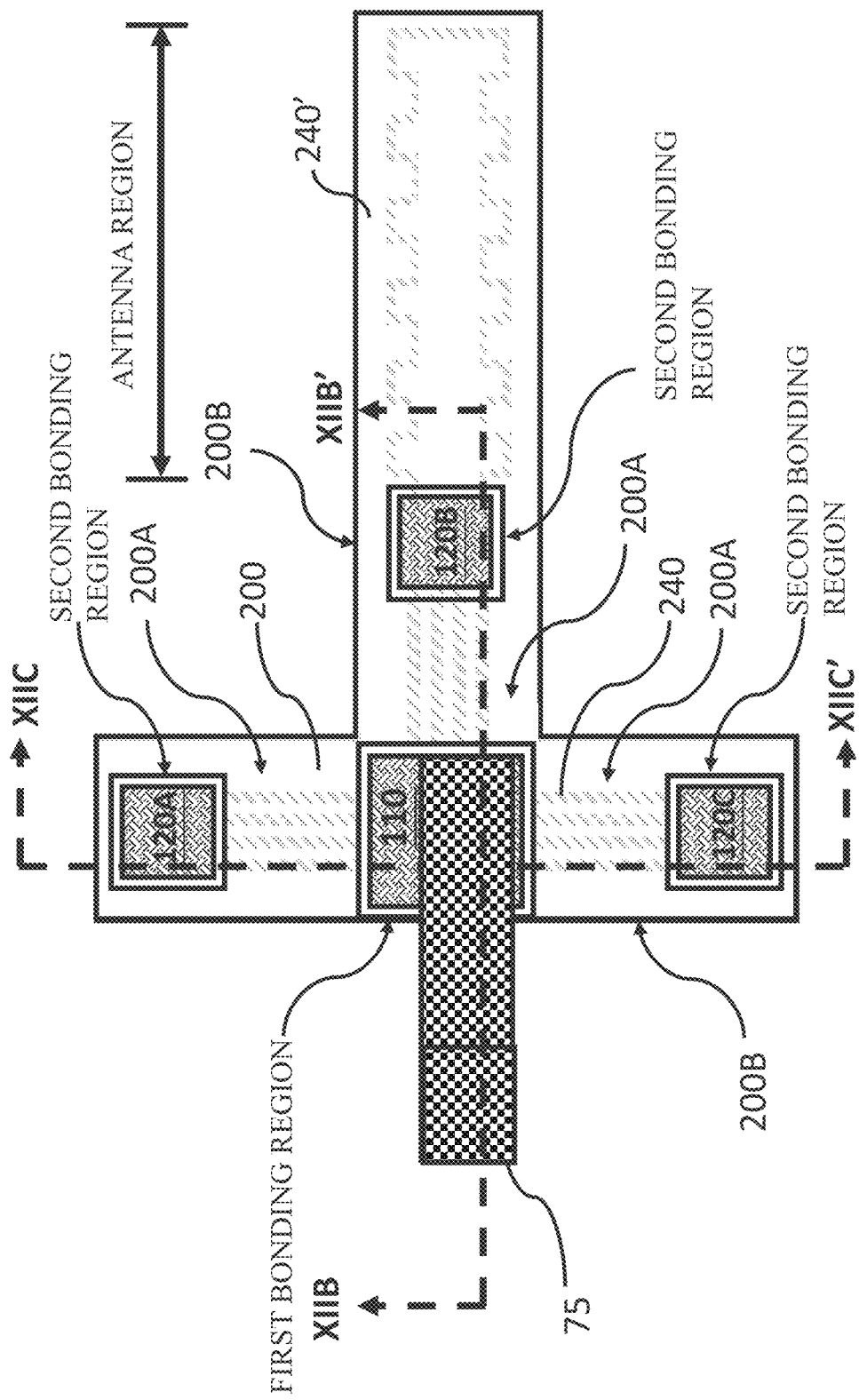
FIG. 12A is a top view of a flexible circuit board according to Embodiment 12 of this invention.
Figure 12B:
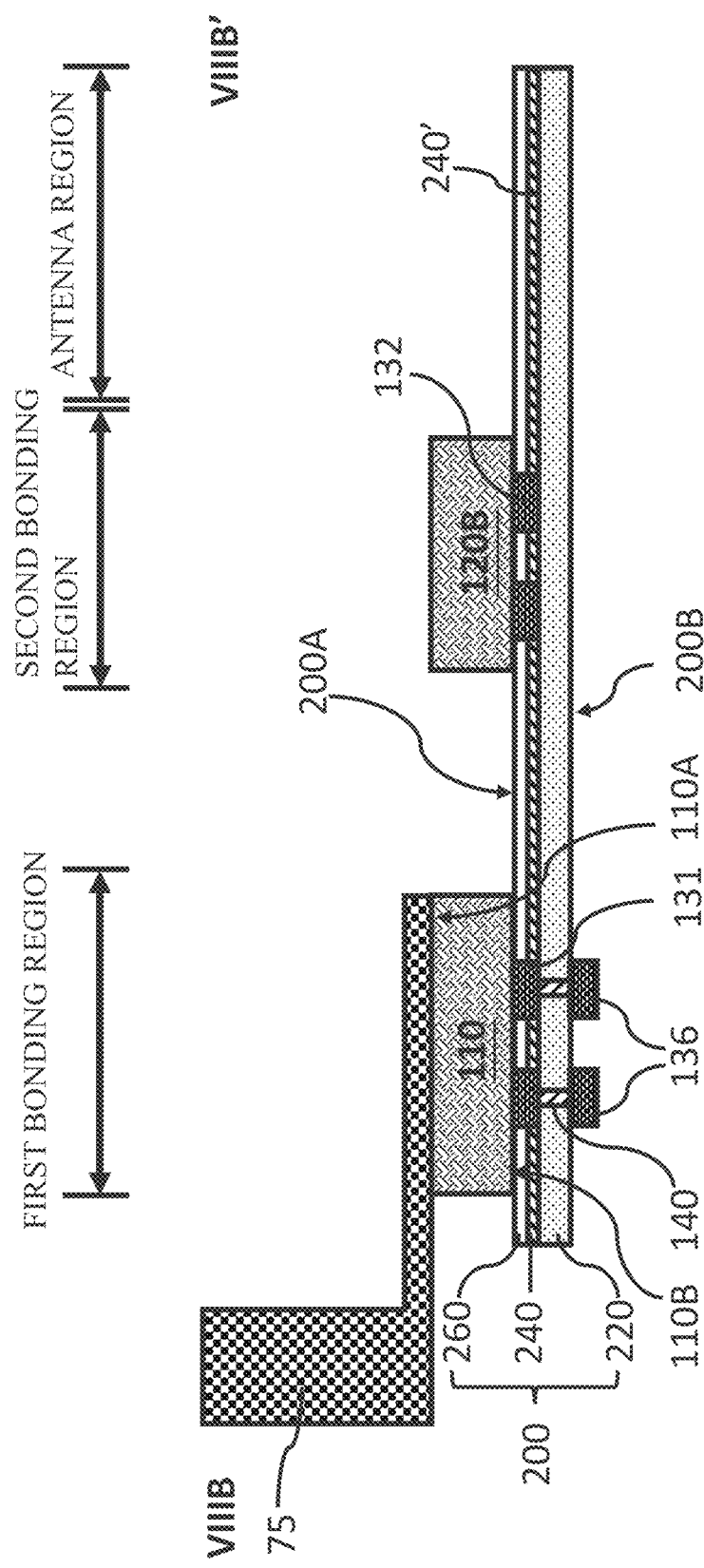
FIG. 12B is a cross-sectional view along with the cross-sectional line XIIB-XIIB' shown in FIG. 12A.
Figure 12C:
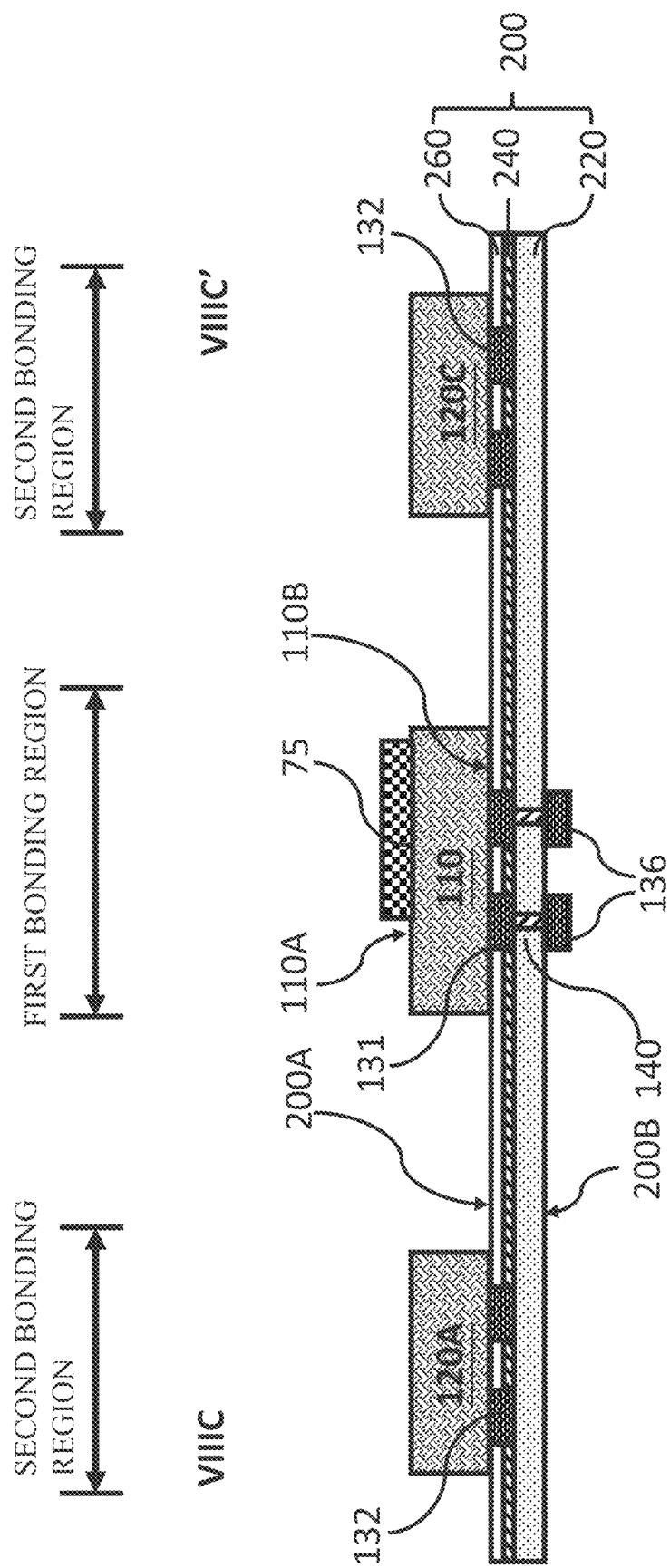
FIG. 12C is a cross-sectional view along with the cross-sectional line XIIC-XIIC' shown in FIG. 12A.
Figure 12D:
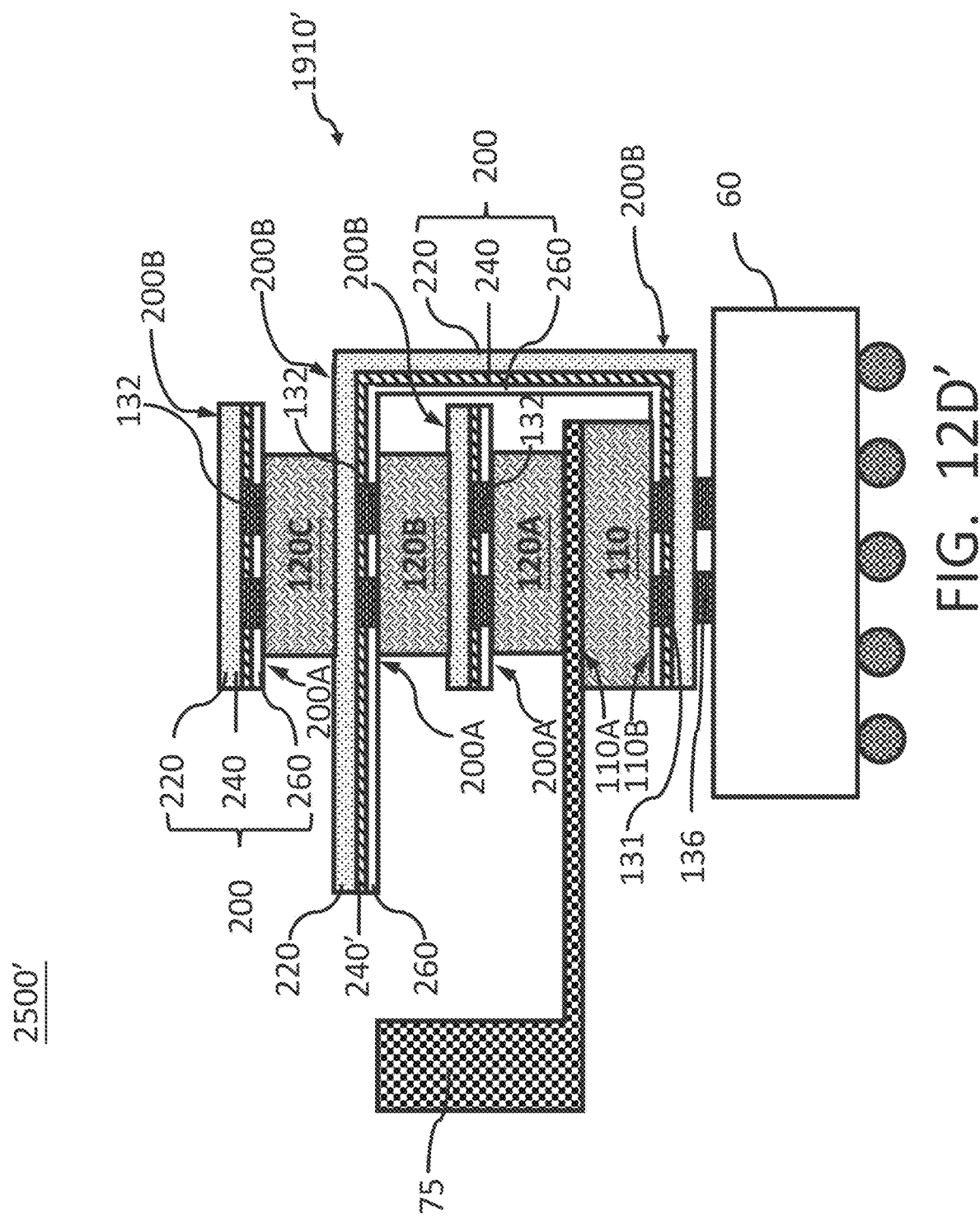
FIG. 12D is a cross-sectional view of a 3D package configuration 2500 according to Embodiment 12 of this present invention.

Please refer to FIGS. 12A~12C, and FIGS. 12D, 12D' and 12D". FIG. 12A is a top view of a flexible circuit board according to Embodiment 12 of this invention. FIG. 12B is a cross-sectional view along with the cross-sectional line XIIB-XIIB' shown in FIG. 12A. FIG. 12C is a cross-sectional view along with the cross-sectional line XIIC-XIIC' shown in FIG. 12A. FIG. 12D is a cross-sectional view of a 3D package configuration 2500 according to Embodiment 12 of this present invention. FIG. 12D' is a cross-sectional view of another 3D package configuration 2500' according to Embodiment 12 of this invention. FIG. 12D" is a cross-sectional view of another 3D package configuration 2500" according to Embodiment 12 of this invention.

The present Embodiment 12 discloses a 3D package configuration 2500 as shown in FIG. 12D, comprising a lead frame 60, a folded flexible circuit board structure 1910 vertically stacked on the lead frame 60 and electrically connected therewith, and a heat dissipating mechanism 75. The folded flexible circuit board structure 1910 comprises: a cross-shaped flexible circuit board 200 as shown in FIG. 12A comprising a flexible insulating substrate 220, a circuit 240 formed on a surface of the flexible insulating substrate 220 and an insulating layer 260 overlaying the circuit 240, wherein the flexible circuit board 200 has a first surface 200A and a second surface 200B opposite to each other, and the flexible circuit board 200 comprises a first die bonding zone and a plurality of second die bonding zone formed on the first surface 200A and an antenna region, wherein the first die bonding zone includes a plurality of first die bonding pads 131 electrically connected to the circuit 240, and each of the second die bonding zones includes a plurality of second die bonding pads 132 electrically connected to the circuit 240, and the second surface 200B under the first die bonding zone further comprises a plurality of lead frame bonding pads 136, wherein each of the lead frame bonding pads 136 corresponding to each of the first die bonding pads 131 and electrically to each other through a first conductive hole 140; a first semiconductor die 110 bonded to the first die bonding zone and electrically connected to the circuit 240 through the first die bonding pads 131; and a plurality of second semiconductor dies including 120A, 120B and 120C respectively bonded to each of the second die bonding zones and electrically connected to the circuit 240 through the second die bonding pads 132 therein. The heat dissipating mechanism 75 is bonded to the top surface 110A of the first semiconductor die 110.

Moreover, the second semiconductor die 120B bonded to one of the second chip bonding regions adjacent to a terminal of the flexible circuit board 200 was a tel-communication chip, and the antenna region as shown in FIGS. 12A and 12B was formed between the terminal of the flexible circuit board 200 and the second semiconductor die 120B, wherein the antenna region comprises an integrated antenna circuit 240' formed on the insulating substrate 220 of the flexible circuit board 200 and overlaid by the insulating layer 260 of the flexible circuit board 200, and the second semiconductor die 120B is electrically connected to the integrated antenna circuit 240' through the second chip bonding pads 132 to ensure that the second chip bonding pads 132 is electrically connected to the integrated antenna circuit 240' in the shortest pathway to reduce the noise.

As shown in FIGS. 12A~12C and 12D, the folded flexible circuit board structure 1910 as shown in FIG. 12D was obtained by folding the cross-shaped flexible circuit board 200 shown in FIGS. 12A~12C in sequence to make the cross-shaped flexible circuit board 200 with the second semiconductor die 120B be bonded thereon be folded above the heat dissipating mechanism 75 formed on the top surface 110A of the first semiconductor die 110, and then the cross-shaped flexible circuit board 200 with the second semiconductor die 120A be bonded thereon be folded above the second semiconductor die 120B, and the cross-shaped flexible circuit board 200 with the second semiconductor die 120C be bonded thereon be folded above the second semiconductor die 120A, wherein the second semiconductor dies 120B, 120A and 120C were vertically stacked above the first semiconductor die 110 in sequence, and the antenna region was outward extended from the folded flexible circuit board structure 1910. The folded flexible circuit board structure 1910 was vertically stacked on the lead frame 60 through the lead frame bonding pads 136 and electrically connected therewith, and then placed into a jig for subsequent package treatment to generate a 3D package configuration 2500 as shown in FIG. 12D.

Alternatively, as shown in FIGS. 12A~12C and 12D', the folded flexible circuit board structure 1910' as shown in FIG. 12D' was obtained by folding the cross-shaped flexible circuit board 200 shown in FIGS. 12A~12C in sequence to make the cross-shaped flexible circuit board 200 with the second semiconductor die 120A be bonded thereon be folded above the heat dissipating mechanism 75 formed on the top surface 110A of the first semiconductor die 110, and then the cross-shaped flexible circuit board 200 with the second semiconductor die 120B be bonded thereon be folded above the second semiconductor die 120A, and the cross-shaped flexible circuit board 200 with the second semiconductor die 120C be bonded thereon be folded above the second semiconductor die 120B, wherein the second semiconductor dies 120A, 120B and 120C were vertically stacked above the first semiconductor die 110 in sequence, and the antenna region was outward extended from the folded flexible circuit board structure 1910'. The folded flexible circuit board structure 1910' was vertically stacked on the lead frame 60 through the lead frame bonding pads 136 and electrically connected therewith, and then placed into a jig for subsequent package treatment to generate a 3D package configuration 2500' as shown in FIG. 12D'.

Alternatively, as shown in FIGS. 12A~12C and 12D", the folded flexible circuit board structure 1910" as shown in FIG. 12D" was obtained by folding the cross-shaped flexible circuit board 200 shown in FIGS. 12A~12C in sequence to make the cross-shaped flexible circuit board 200 with the second semiconductor die 120A be bonded thereon be folded above the heat dissipating mechanism 75 formed on the top surface 110A of the first semiconductor die 110, and then the cross-shaped flexible circuit board 200 with the second semiconductor die 120C be bonded thereon be folded above the second semiconductor die 120A, and the cross-shaped flexible circuit board 200 with the second semiconductor die 120B be bonded thereon be folded above the second semiconductor die 120C, wherein the second semiconductor dies 120A, 120C and 120B were vertically stacked above the first semiconductor die 110 in sequence, and the antenna region was outward extended from the folded flexible circuit board structure 1910". The folded flexible circuit board structure 1910" was vertically stacked on the lead frame 60 through the lead frame bonding pads 136 and electrically connected therewith, and then placed into a jig for subsequent package treatment to generate a 3D package configuration 2500" as shown in FIG. 12D".

The first semiconductor die 110 and the second semiconductor dies 120A, 120B, 120C and 120D of the 3D package configurations 2500, 2500' and 2500" can respectively be for example but not limited to a CPU die, a GPU die, a DSP die, a MPU die, a MCU die, a DRAM die, a SRAM die, a Standard Logic IC die, an ASIC die for a special application, a sensing die with a specific sensing function, or a driving IC die.

The first die bonding pads 131, the second die bonding pads 132 and the lead frame bonding pads 136 of the 3D package configurations 2500, 2500' and 2500" are respectively for example but not limited to solder balls or metallic bumps formed by a material selected from one of the group consisting of tin, tin alloys including tin/copper alloy, tin/ITO alloy, tin/silver alloy, tin/bismuth alloy and tin/lead alloy, and conductive polymers.

The material for the flexible insulating substrate 220 of the 3D package configurations 2500, 2500' and 2500" can be selected from for example but not limited to one of the group consisting of Polyester resin, Polyimide (PI), Modified Polyimide (MPI), Covalent Organic Framework (COF), Liquid Photo-Imageable (LPI), Liquid Crystal Polymer (LCP), Polytetrafluoroethylene (PTFE) and flexible epoxy bonded fiber-glass board, or combinations thereof.

The material for the circuit 240 and the antenna circuit 240' of the 3D package configurations 2500, 2500' and 2500" is selected from for example but not limited to one of the group consisting of copper, copper alloy, tinned copper, tin alloy, aluminum, aluminum alloys, gold and silver, or combinations thereof.

The above-mentioned 3D package configurations 2500, 2500' and 2500", wherein the circuit 240 and the antenna circuit 240' of the flexible circuit board 200 can be a single-layered circuit or a multiple-layered circuit, and the insulating layer 260 overlaying the circuit 240 and the antenna circuit 240' can also be a single-layered insulating layer or a multiple-layered insulating layer.

According to another embodiment of this invention, additional adhesive layers can be coated on the first surface 200A or the second surface 200B of the flexible circuit board 200 of the 3D package configurations 2500, 2500' and 2500" to fasten the folded flexible circuit board structures 1910, 1910' and 1910" vertically stacked on the lead frame 60.

Embodiment 13

Figures 1, 13A:
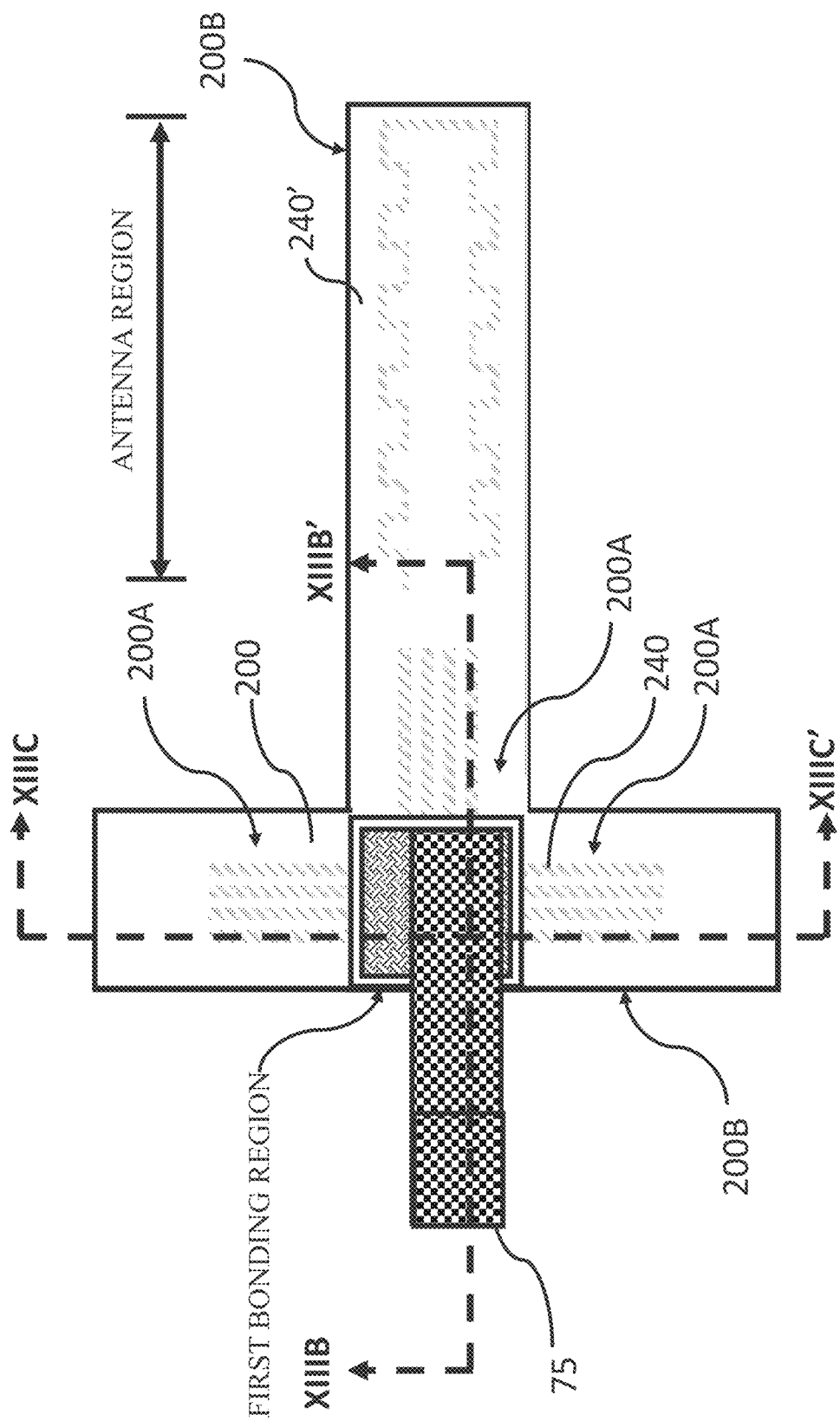
Figures 2, 13A:
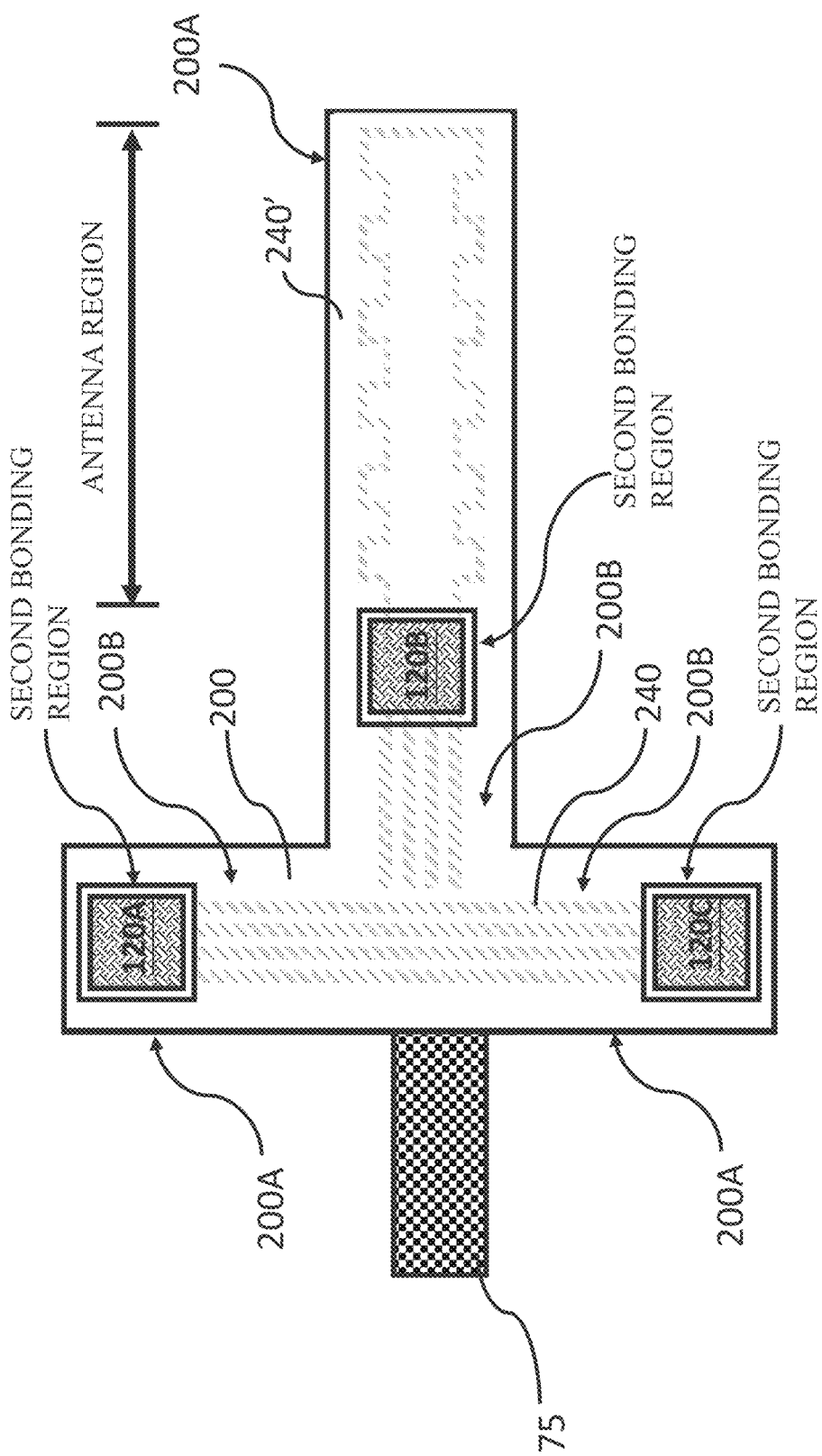
Figure 13B:
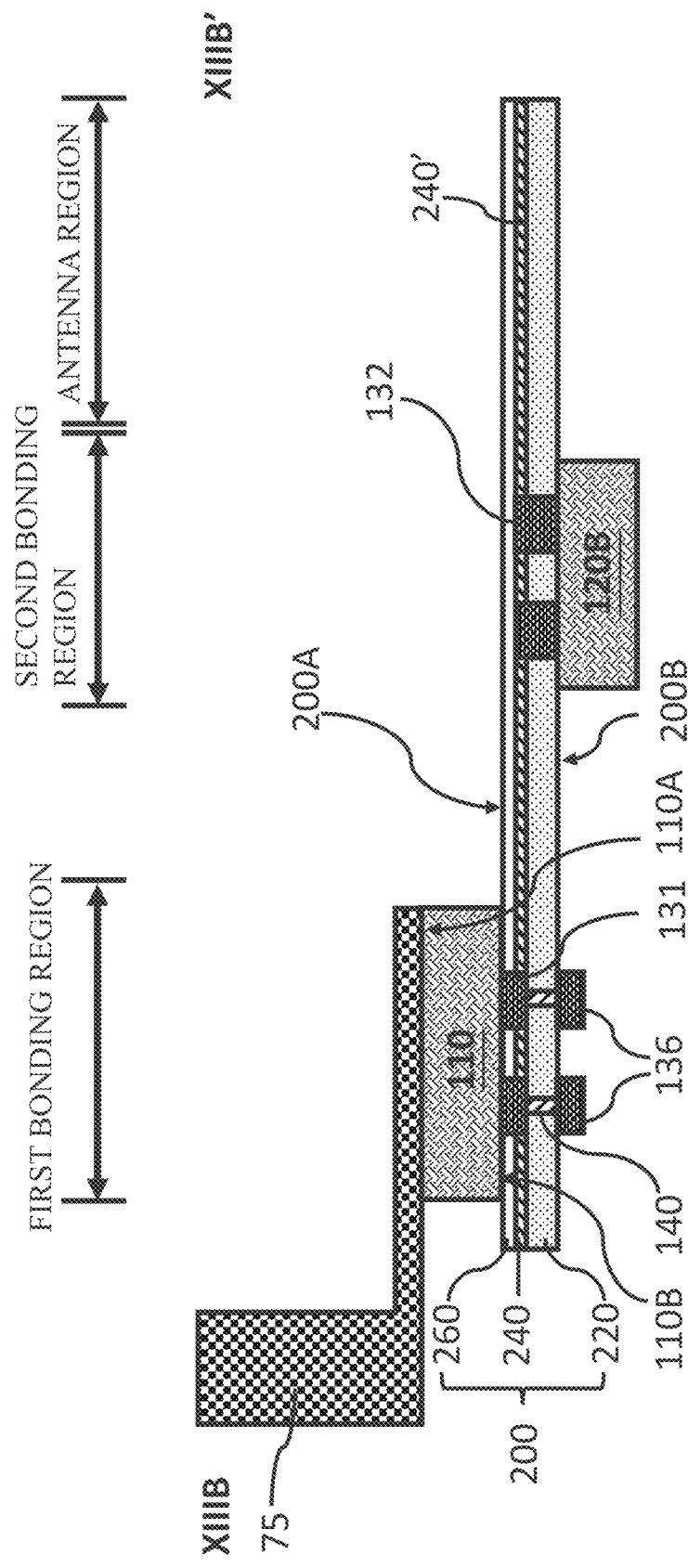
FIG. 13B is a cross-sectional view along with the cross-sectional line XIIIB-XIIIB' shown in FIG. 13A-1.
Figure 13C:
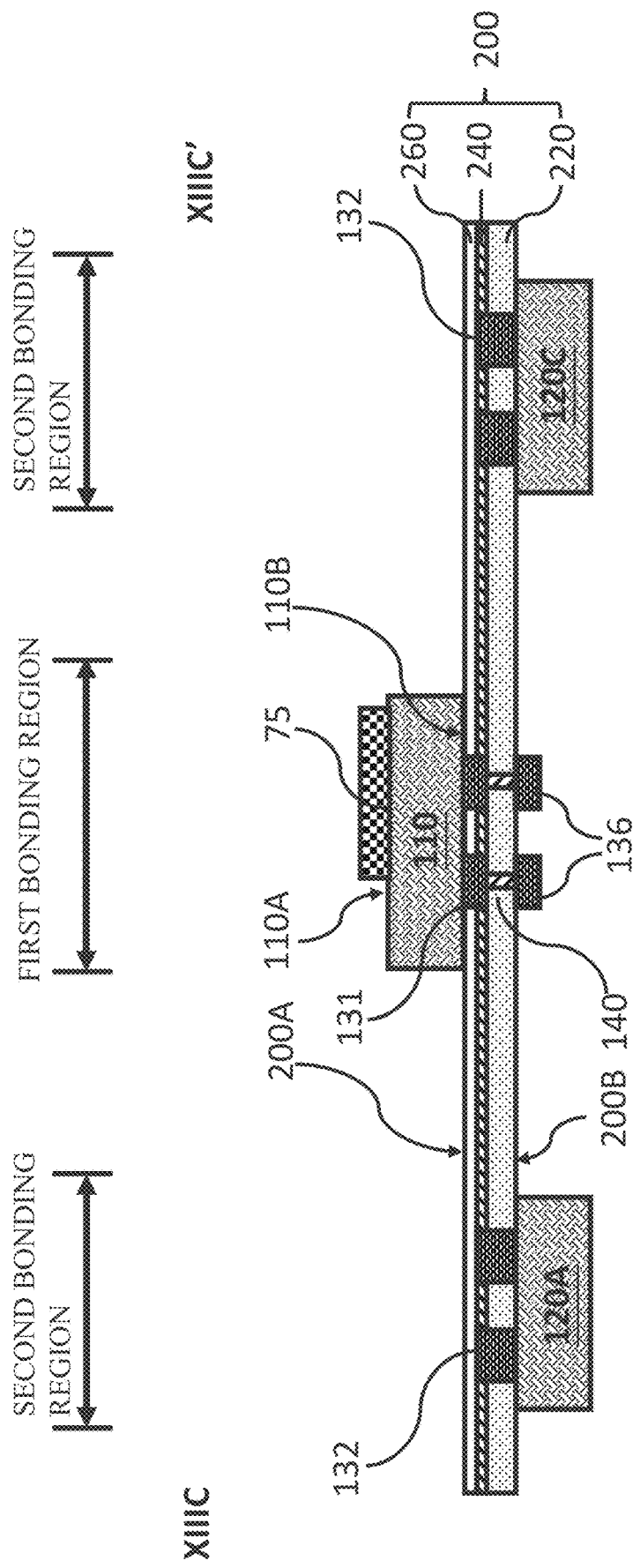
FIG. 13C is a cross-sectional view along with the cross-sectional line XIIIC-XIIIC' shown in FIG. 13A-1.
Figure 13D:
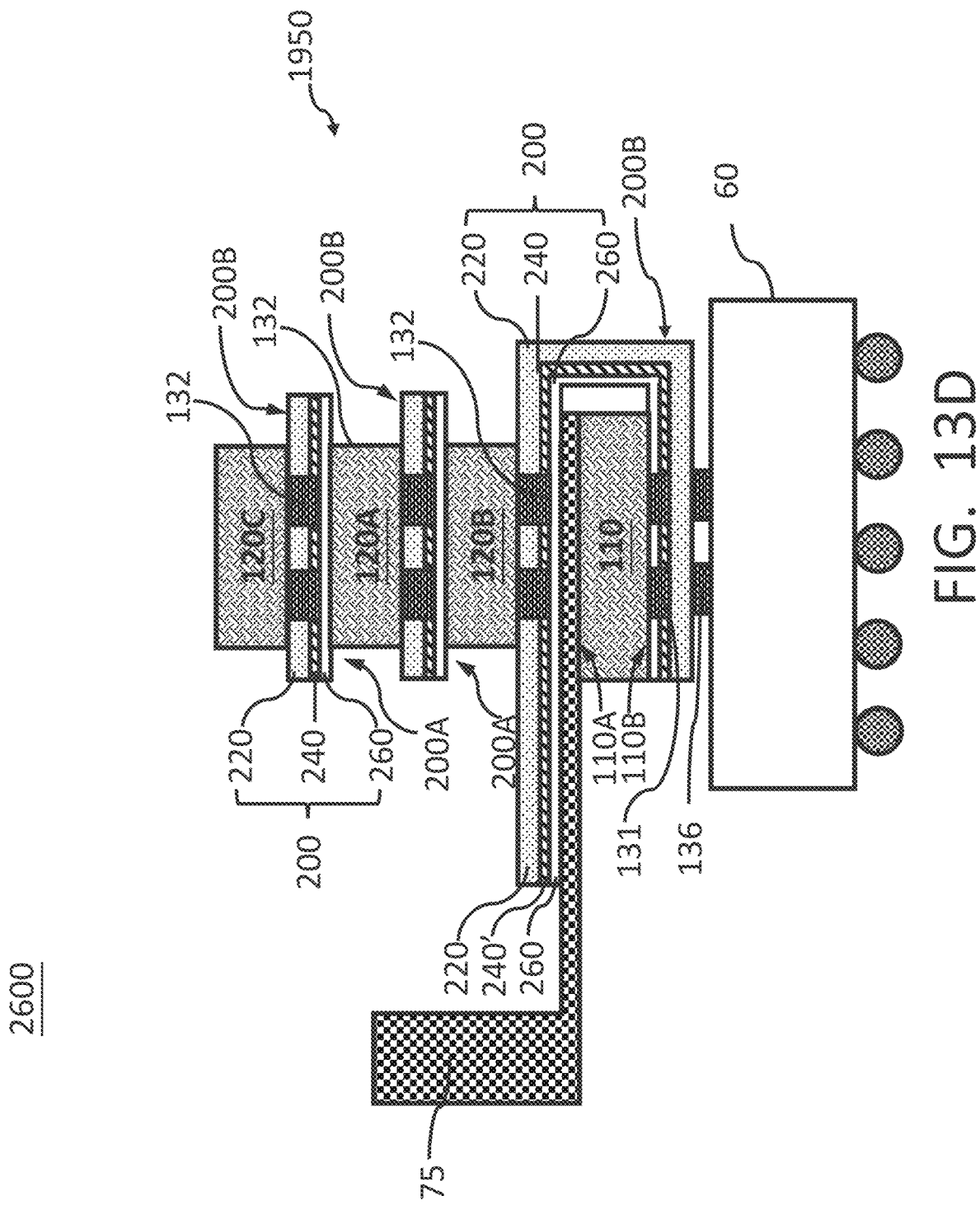
FIG. 13D is a cross-sectional view of a 3D package configuration 2600 according to Embodiment 13 of this present invention.
Figure 13D:
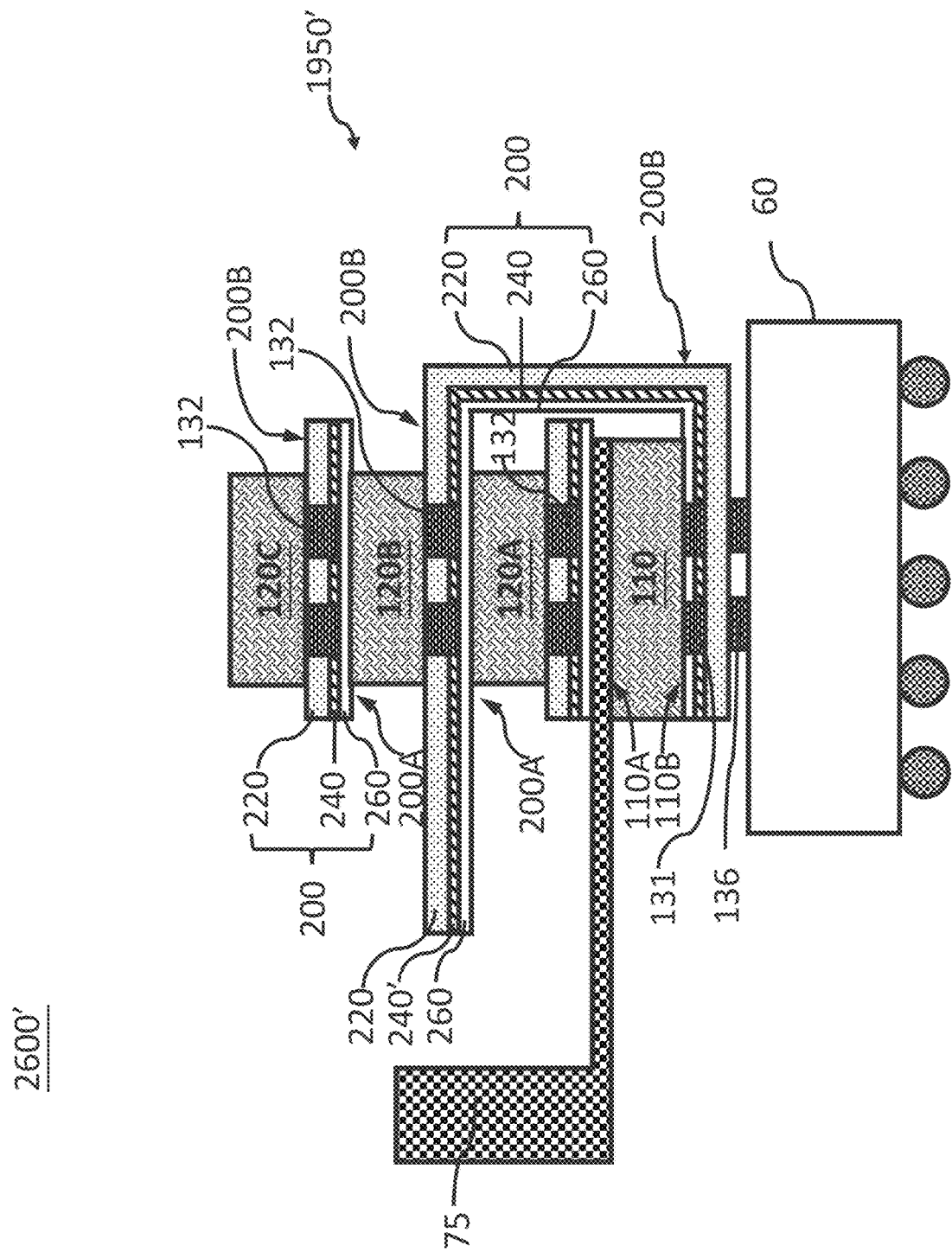

Please refer to FIGS. 13A-1, 13A-2, 13B~13C and FIGS. 13D, 13D' and 13D". FIG. 13A-1 is a top view of a flexible circuit board according to Embodiment 10 of this invention. FIG. 13A-2 is a bottom view of a flexible circuit board according to Embodiment 13 of this invention. FIG. 13B is a cross-sectional view along with the cross-sectional line XIIIB-XIIIB' shown in FIG. 13A-1. FIG. 13C is a cross-sectional view along with the cross-sectional line XIIIC-XIIIC' shown in FIG. 13A-1. FIG. 13D is a cross-sectional view of a 3D package configuration 2600 according to Embodiment 13 of this present invention. FIG. 13D' is a cross-sectional view of another 3D package configuration 2600' according to Embodiment 13 of this invention. FIG. 13D" is a cross-sectional view of another 3D package configuration 2600" according to Embodiment 13 of this invention.

This present Embodiment 13 discloses a 3D package configuration 2600 as shown in FIG. 13D, comprising a lead frame 60, a folded flexible circuit board structure 1950 vertically stacked on the lead frame 60 and electrically connected therewith, and a heat dissipating mechanism 75. The folded flexible circuit board structure 1950 comprises: a cross-shaped flexible circuit board 200 as shown in FIGS. 13A-1 and 13A-2 comprising a flexible insulating substrate 220, a circuit 240 formed on a surface of the flexible insulating substrate 220 and an insulating layer 260 overlaying the circuit 240, wherein the flexible circuit board 200 has a first surface 200A and a second surface 200B opposite to each other, and the flexible circuit board 200 comprises a first die bonding zone formed on the first surface 200A, a plurality of second die bonding zone formed on the second surface 200B and an antenna region, wherein the first die bonding zone includes a plurality of first die bonding pads 131 electrically connected to the circuit 240, and each of the second die bonding zones includes a plurality of second die bonding pads 132 electrically connected to the circuit 240, and the second surface 200B under the first die bonding zone further comprises a plurality of lead frame bonding pads 136, wherein each of the lead frame bonding pads 136 corresponding to each of the first die bonding pads 131 and electrically to each other through a first conductive hole 140; a first semiconductor die 110 bonded to the first die bonding zone and electrically connected to the circuit 240 through the first die bonding pads 131; and a plurality of second semiconductor dies including 120A, 120B and 120C respectively bonded to each of the second die bonding zones and electrically connected to the circuit 240 through the second die bonding pads 132 therein. The heat dissipating mechanism 75 is bonded to the top surface 110A of the first semiconductor die 110.

Moreover, the second semiconductor die 120B bonded to one of the second chip bonding regions adjacent to a terminal of the flexible circuit board 200 was a tel-communication chip, and the antenna region as shown in FIGS. 13A-1 and 13A-2 was formed between the terminal of the flexible circuit board 200 and the second semiconductor die 120B, wherein the antenna region comprises an integrated antenna circuit 240' formed on the insulating substrate 220 of the flexible circuit board 200 and overlaid by the insulating layer 260 of the flexible circuit board 200, and the second semiconductor die 120B is electrically connected to the integrated antenna circuit 240' through the second chip bonding pads 132 to ensure that the second chip bonding pads 132 is electrically connected to the integrated antenna circuit 240' in the shortest pathway to reduce the noise.

As shown in FIGS. 13A-1, 13A-2, 13B~13C and 13D, the folded flexible circuit board structure 1950 as shown in FIG. 13D was obtained by folding the cross-shaped flexible circuit board 200 shown in FIGS. 13A-1, 13A-2 and 13B~13C in sequence to make the cross-shaped flexible circuit board 200 with the second semiconductor die 120B be bonded thereon be folded above the heat dissipating mechanism 75 formed on the top surface 110A of the first semiconductor die 110, and then the cross-shaped flexible circuit board 200 with the second semiconductor die 120A be bonded thereon be folded above the second semiconductor die 120B, and the cross-shaped flexible circuit board 200 with the second semiconductor die 120C be bonded thereon be folded above the second semiconductor die 120A, wherein the second semiconductor dies 120B, 120A and 120C were vertically stacked above the first semiconductor die 110 in sequence, and the antenna region was outward extended from the folded flexible circuit board structure 1950. The folded flexible circuit board structure 1950 was vertically stacked on the lead frame 60 through the lead frame bonding pads 136 and electrically connected therewith, and then placed into a jig for subsequent package treatment to generate a 3D package configuration 2600 as shown in FIG. 13D.

Alternatively, As shown in FIGS. 13A-1, 13A-2, 13B~13C and 13D', the folded flexible circuit board structure 1950' as shown in FIG. 13D' was obtained by folding the cross-shaped flexible circuit board 200 shown in FIGS. 13A-1, 13A-2 and 13B~13C in sequence to make the cross-shaped flexible circuit board 200 with the second semiconductor die 120A be bonded thereon be folded above the heat dissipating mechanism 75 formed on the top surface 110A of the first semiconductor die 110, and then the cross-shaped flexible circuit board 200 with the second semiconductor die 120B be bonded thereon be folded above the second semiconductor die 120A, and the cross-shaped flexible circuit board 200 with the second semiconductor die 120C be bonded thereon be folded above the second semiconductor die 120B, wherein the second semiconductor dies 120A, 120B and 120C were vertically stacked above the first semiconductor die 110 in sequence, and the antenna region was outward extended from the folded flexible circuit board structure 1950'. The folded flexible circuit board structure 1950' was vertically stacked on the lead frame 60 through the lead frame bonding pads 136 and electrically connected therewith, and then placed into a jig for subsequent package treatment to generate a 3D package configuration 2600' as shown in FIG. 13D'.

Alternatively, As shown in FIGS. 13A-1, 13A-2, 13B~13C and 13D", the folded flexible circuit board structure 1950" as shown in FIG. 13D" was obtained by folding the cross-shaped flexible circuit board 200 shown in FIGS. 13A-1, 13A-2 and 13B~13C in sequence to make the cross-shaped flexible circuit board 200 with the second semiconductor die 120A be bonded thereon be folded above the heat dissipating mechanism 75 formed on the top surface 110A of the first semiconductor die 110, and then the cross-shaped flexible circuit board 200 with the second semiconductor die 120C be bonded thereon be folded above the second semiconductor die 120A, and the cross-shaped flexible circuit board 200 with the second semiconductor die 120B be bonded thereon be folded above the second semiconductor die 120C, wherein the second semiconductor dies 120A, 120C and 120B were vertically stacked above the first semiconductor die 110 in sequence, and the antenna region was outward extended from the folded flexible circuit board structure 1950". The folded flexible circuit board structure 1950" was vertically stacked on the lead frame 60 through the lead frame bonding pads 136 and electrically connected therewith, and then placed into a jig for subsequent package treatment to generate a 3D package configuration 2600" as shown in FIG. 13D".

The first semiconductor die 110 and the second semiconductor dies 120A, 120B, 120C and 120D of the 3D package configurations 2600, 2600' and 2600" can respectively be for example but not limited to a CPU die, a GPU die, a DSP die, a MPU die, a MCU die, a DRAM die, a SRAM die, a Standard Logic IC die, an ASIC die for a special application, a sensing die with a specific sensing function, or a driving IC die.

The first die bonding pads 131, the second die bonding pads 132 and the lead frame bonding pads 136 of the 3D package configurations 2600, 2600' and 2600" are respectively for example but not limited to solder balls or metallic bumps formed by a material selected from one of the group consisting of tin, tin alloys including tin/copper alloy, tin/ITO alloy, tin/silver alloy, tin/bismuth alloy and tin/lead alloy, and conductive polymers.

The material for the flexible insulating substrate 220 of the 3D package configurations 2600, 2600' and 2600" can be selected from for example but not limited to one of the group consisting of Polyester resin, Polyimide (PI), Modified Polyimide (MPI), Covalent Organic Framework (COF), Liquid Photo-Imageable (LPI), Liquid Crystal Polymer (LCP), Polytetrafluoroethylene (PTFE) and flexible epoxy bonded fiber-glass board, or combinations thereof.

The material for the circuit 240 and the antenna circuit 240' of the 3D package configurations 2600, 2600' and 2600" is selected from for example but not limited to one of the group consisting of copper, copper alloy, tinned copper, tin alloy, aluminum, aluminum alloys, gold and silver, or combinations thereof.

The above-mentioned 3D package configurations 2600, 2600' and 2600", wherein the circuit 240 and the antenna circuit 240' of the flexible circuit board 200 can be a single-layered circuit or a multiple-layered circuit, and the insulating layer 260 overlaying the circuit 240 can also be a single-layered insulating layer or a multiple-layered insulating layer.

According to another embodiment of this invention, additional adhesive layers can be coated on the first surface 200A or the second surface 200B of the flexible circuit board 200 of the 3D package configurations 2600, 2600' and 2600" to fasten the folded flexible circuit board structures 1950, 1950' and 1950" vertically stacked on the lead frame 60.

As described in the above Embodiments, a novel 3D package configuration can be obtained by stacking a plurality of semiconductor package units or a folded flexible circuit board structure on a lead frame and electrically connected therewith based on the foldable characteristics of the flexible circuit board, and the high temperature resistance of the flexible circuit board which is suitable for insulating layer process, metal layer process, photolithography process, etching and development process, to make conventional semiconductor dies such as CPU dies, GPU dies, DRAM dies, SRAM dies, tel-communication dies, standard logic IC dies, ASIC dies, various sensing IC dies, various driving IC and other semiconductor dies with various functions be bonded on one die and/or two side of a flexible circuit board and electrically connected therewith in advance.

Although particular embodiments have been shown and described, it should be understood that the above discussion is not intended to limit the present invention to these embodiments. Persons skilled in the art will understand that various changes and modifications may be made without departing from the scope of the present invention as literally and equivalently covered by the following claims.

What is claimed is:

1. A 3D package configuration, comprising:
a lead frame; and
a plurality of semiconductor package units vertically stacked on the lead frame in sequence, wherein the semiconductor package units are electrically connected to each other and electrically connected therewith, and each of the semiconductor package units comprises:
  a semiconductor die with a top surface and a bottom surface opposite to each other, and a plurality of side surfaces adjacent to the top surface and the bottom surface; and
  a folded flexible circuit board with a first surface and a second surface opposite to each other, wherein the bottom surface of the semiconductor die is bonded to the first surface and electrically connected to the folded flexible circuit board, and the first surface of the folded flexible circuit board is attached onto the top surface, the bottom surface and one of the side surfaces of the semiconductor die;
wherein the folded flexible circuit board comprises:
a flexible insulating substrate;
a circuit formed on a surface of the flexible insulating substrate; and
an insulating layer overlaying the circuit
wherein, the first surface of the folded flexible circuit board comprises a plurality of first bonding pads electrically connected to the circuit, and the bottom surface of the semiconductor die is bonded to the first surface and electrically connected to the folded flexible circuit board through the first bonding pads, and the second surface and the flexible insulating substrate of the folded flexible circuit board corresponding to the top surface of the semiconductor die respectively comprise a plurality of second bonding pads and a plurality of first conductive holes electrically connected to the circuit, and the second surface and the flexible insulating substrate of the folded flexible circuit board corresponding to the bottom surface of the semiconductor die respectively comprise a plurality of third bonding pads and a plurality of second conductive holes electrically connected to the circuit, and each of the third bonding pads is electrically connected to the circuit through one of the second conductive holes;
wherein, the semiconductor package units are vertically and sequentially stacked to interconnect with each other by bonding the third bonding pads of one of the semiconductor package unit to the second bonding pads of another adjacent one of the semiconductor package units, and the bottommost one of the semiconductor package units is directly bonded to the lead frame and electrically connected therewith through the third bonding pads.

2. The 3D package configuration as claimed in claim 1, wherein the material of the flexible insulating substrate is selected from one of the group consisting of Polyester resin, Polyimide (PI), Modified Polyimide (MPI), Covalent Organic Framework (COF), Liquid Photo-Imageable (LPI), Liquid Crystal Polymer (LCP), Polytetrafluoroethylene (PTFE) and flexible epoxy bonded fiber-glass board, or combinations thereof.

3. The 3D package configuration as claimed in claim 1, wherein the material of the circuit is selected from one of the group consisting of copper, copper alloy, tinned copper, tin alloy, aluminum, aluminum alloys, gold and silver, or combinations thereof.

4. The 3D package configuration as claimed in claim 1, wherein one of the semiconductor package units comprises a high power consuming semiconductor die.

5. The 3D package configuration as claimed in claim 4, further comprising a heat dissipating mechanism, wherein the heat dissipating mechanism is sandwiched between the top surface of the high power consuming semiconductor die and first surface of the folded flexible circuit board attached on the top surface of the high power consuming semiconductor die.

* * * * *